US010880962B2

(12) United States Patent
Petluri et al.

(10) Patent No.: US 10,880,962 B2
(45) Date of Patent: *Dec. 29, 2020

(54) LIGHTING SYSTEMS HAVING MULTIPLE LIGHT SOURCES

(71) Applicant: Ecosense Lighting inc., Los Angeles, CA (US)

(72) Inventors: Raghuram L. V. Petluri, Cerritos, CA (US); Paul Pickard, Acton, CA (US)

(73) Assignee: ECOSENSE LIGHTING INC., Los Angeles, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/589,730

(22) Filed: Oct. 1, 2019

(65) Prior Publication Data

US 2020/0146120 A1  May 7, 2020

Related U.S. Application Data

(63) Continuation of application No. 14/526,504, filed on Oct. 28, 2014, now Pat. No. 10,477,636.

(51) Int. Cl.
| H05B 45/10 | (2020.01) |
| H01L 33/50 | (2010.01) |
| H05B 45/00 | (2020.01) |
| H05B 45/44 | (2020.01) |

(52) U.S. Cl.
CPC ............ H05B 45/10 (2020.01); H01L 33/50 (2013.01); H05B 45/44 (2020.01); H05B 45/60 (2020.01)

(58) Field of Classification Search
CPC ........ H05B 45/10; H05B 45/60; H05B 45/44; H01L 33/50
See application file for complete search history.

(56) References Cited

U.S. PATENT DOCUMENTS

| 7,918,581 | B2 * | 4/2011 | Van De Ven | .......... H05B 45/20 362/231 |
| 8,123,376 | B2 * | 2/2012 | Van De Ven | ............. F21K 9/62 362/231 |
| 2008/0136313 | A1 * | 6/2008 | Van De Ven | ............. F21K 9/62 313/500 |

(Continued)

*Primary Examiner* — Raymond R Chai
(74) *Attorney, Agent, or Firm* — Jay M. Brown

(57) ABSTRACT

Lighting system including first-, second-, and third-light sources each having semiconductor light-emitting device. First source includes lumiphor; and is configured for emitting first light source emissions having first color point between isotherms of CCTs of about 4800K-2500K; and is located within about 0.006 delta(uv) away from Planckian—black-body locus of CIE 1931 XY chromaticity diagram. Second light source is configured for emitting second light source emissions having second color point between isotherms of CCTs of about 2900K-1700K. Third light source is configured for emitting third light source emissions having: third color point between line-of-purples and isotherm of CCT of about 1500K; and dominant- or peak-wavelength between about 590-700 nanometers. Lighting system is configured for forming combined light emissions and causing combined color points to remain below Planckian—black-body locus by about 0.001-0.009 delta(uv) throughout light brightening/dimming curve. Related processes.

55 Claims, 18 Drawing Sheets

(56) References Cited

U.S. PATENT DOCUMENTS

| | | | |
|---|---|---|---|
| 2011/0084614 A1* | 4/2011 | Eisele | H05B 47/11 |
| | | | 315/152 |
| 2011/0096560 A1* | 4/2011 | Ryu | C09K 11/7734 |
| | | | 362/510 |
| 2011/0109445 A1* | 5/2011 | Weaver | H05B 47/19 |
| | | | 340/286.01 |
| 2011/0291564 A1* | 12/2011 | Huang | F21V 23/0457 |
| | | | 315/77 |
| 2012/0038291 A1* | 2/2012 | Hasnain | H05B 45/20 |
| | | | 315/294 |
| 2013/0002157 A1* | 1/2013 | van de Ven | H05B 45/60 |
| | | | 315/192 |

* cited by examiner

LIGHTING SYSTEMS HAVING MULTIPLE LIGHT SOURCES

CROSS-REFERENCE TO RELATED APPLICATIONS

This application is a continuation of commonly-owned U.S. utility patent application Ser. No. 14/526,504 filed on Oct. 28, 2014, the entirety of which hereby is incorporated herein by reference.

BACKGROUND OF THE INVENTION

1. Field of the Invention

The present invention relates to the field of lighting systems having multiple light sources, and processes related to such lighting systems.

2. Background of the Invention

Numerous lighting systems that have multiple light sources been developed. As examples, such lighting systems that include various semiconductor light-emitting devices may be utilized for generating combined light emissions. Despite the existence of these lighting systems, further improvements are still needed in lighting systems having multiple light sources; and in processes related to such lighting systems.

SUMMARY

In an example of an implementation, a lighting system is provided that includes a first light source, a second light source, and a third light source. In this example of a lighting system, the first light source includes a first semiconductor light-emitting device and includes a first lumiphor configured for converting light emissions of the first semiconductor light-emitting device having a first spectral power distribution into first light source emissions having another spectral power distribution being different than the first spectral power distribution, wherein the first light source is configured for emitting the first light source emissions as having a first color point, wherein the first color point is located between an isotherm of a correlated color temperature of about 4800K and an isotherm of a correlated color temperature of about 2500K, and wherein the first color point is located within a distance of about equal to or less than 0.006 delta(uv) away from a Planckian—black-body locus of the International Commission on Illumination (CIE) 1931 XY chromaticity diagram. Also in this example of a lighting system, the second light source includes a second semiconductor light-emitting device, wherein the second light source is configured for emitting second light source emissions having a second color point, wherein the second color point is located between an isotherm of a correlated color temperature of about 2900K and an isotherm of a correlated color temperature of about 1700K. Additionally in this example of a lighting system, the third light source includes a third semiconductor light-emitting device, wherein the third light source is configured for emitting third light source emissions having a third color point, wherein the third color point is located between a line-of-purples of the CIE 1931 XY chromaticity diagram and an isotherm of a correlated color temperature of about 1500K, and wherein the third light source is configured for emitting the third light source emissions as having a dominant- or peak-wavelength being within a range of between about 590 nanometers and about 700 nanometers. Further, this example of a lighting system is configured for forming combined light emissions having combined color points, wherein the combined light emissions include the first light source emissions, and the second light source emissions, and the third light source emissions. Additionally, this example of a lighting system is configured for causing the combined color points of the combined light emissions to remain below the Planckian—black-body locus by a distance being within a range of between about 0.001 delta(uv) and about 0.009 delta(uv) throughout a light brightening/dimming curve of correlated color temperatures (CCTs).

In some examples of implementations, the lighting system may be configured for causing the combined color points of the combined light emissions to remain below the Planckian—black-body locus by the distance being within a range of between about 0.001 delta(uv) and about 0.009 delta(uv) throughout the light brightening/dimming curve as including a brightened terminus having a CCT being within a range of between about 3400K and about 2700K and as including a dimmed terminus having a CCT being within a range of between about 2200K and about 1700K.

In further examples of implementations, the lighting system may be configured for causing the combined color points of the combined light emissions to remain below the Planckian—black-body locus by the distance being within a range of between about 0.001 delta(uv) and about 0.009 delta(uv) throughout the light brightening/dimming curve as including a brightened terminus having a CCT of about 3200K and as including a dimmed terminus having a CCT of about 1800K.

In additional examples of implementations of the lighting system, the first lumiphor may be a remotely-located lumiphor.

In other examples of implementations of the lighting system, the first lumiphor may include: a phosphor; a quantum dot; a quantum wire; a quantum well; a photonic nanocrystal; a semiconducting nanoparticle; a scintillator; a lumiphoric ink; or a day glow tape.

In some examples of implementations of the lighting system, the first lumiphor may be configured for down-converting light emissions of the first semiconductor light-emitting device having wavelengths of the first spectral power distribution into first light source emissions having wavelengths of the another spectral power distribution being longer than wavelengths of the first spectral power distribution.

In further examples of implementations, the lighting system may have another light source that may include another semiconductor light-emitting device, and the another light source may be configured for emitting light having another color point.

In additional examples of implementations of the lighting system, each one of the light sources of the lighting system may have a color point being located between the line-of-purples and the isotherm of the correlated color temperature of about 4800K.

In other examples of implementations, the lighting system may be configured for causing the combined color points of the combined light emissions to emulate color points of an incandescent light emitter throughout the light brightening/dimming curve.

In some examples of implementations, the lighting system may be configured for causing the combined light emissions to have the combined color points as being substantially constant throughout the light brightening/dimming curve.

In further examples of implementations, the lighting system may be configured for causing the distance of the combined color points of the combined light emissions below the Planckian—black-body locus to have a maximum variance of about equal to or less than 0.002 delta(uv) throughout the light brightening/dimming curve.

In additional examples of implementations, the lighting system may be configured for traversing the light brightening/dimming curve within a time period being within a range of between about 5 seconds and about 12 hours.

In other examples of implementations, the lighting system may be configured for causing the combined color points of the combined light emissions to have a color rendition index (CRI-Ra including $R_{1-15}$) throughout the light brightening/dimming curve being about equal to or greater than 75.

In some examples of implementations, the lighting system may be configured for causing the combined color points of the combined light emissions to have a color rendition index (CRI-Ra including $R_{1-8}$) throughout the light brightening/dimming curve being about equal to or greater than 75.

In further examples of implementations, the lighting system may be configured for causing the combined color points of the combined light emissions to have a color rendition index (CRI-$R_9$) throughout the light brightening/dimming curve being about equal to or greater than 80.

In additional examples of implementations: the first light source, the second light source, and the third light source each may include a reflective element being configured for causing the forming of the combined light emissions.

In other examples of implementations: the first light source, the second light source, and the third light source each may include a lens element being configured for causing the forming of the combined light emissions.

In some examples of implementations, the lighting system may include, as being configured for causing the forming of the combined light emissions: a reflective element; or a lens element.

In further examples of implementations, the lighting system may be configured for causing the combined light emissions to perceptually form an unbroken line.

In additional examples of implementations, the lighting system may include a housing; and the first light source, the second light source, and the third light source may be located in the housing.

In other examples of implementations, the lighting system may be configured for causing the first light source emissions to exit from the housing at a distance of about equal to or less than 13 millimeters away from the first semiconductor light-emitting device.

In some examples of implementations of the lighting system, the first light source may be configured for emitting the first light source emissions as having a first luminous flux; and the second light source may be configured for emitting the second light source emissions as having a second luminous flux; and the third light source may be configured for emitting the third light source emissions as having a third luminous flux.

In further examples of implementations, the lighting system may be configured for controlling the first luminous flux, and the second luminous flux, and the third luminous flux.

In additional examples of implementations, the lighting system may be configured for controlling a combined luminous flux of the combined light emissions.

In other examples of implementations, the lighting system may be configured for causing the combined luminous flux to progressively increase along the light brightening/dimming curve from a brightened terminus having a CCT being within a range of between about 3400K and about 2700K to a dimmed terminus having a CCT being within a range of between about 2200K and about 1700K.

In some examples of implementations, the lighting system may include a control unit being configured for controlling: the first luminous flux; the second luminous flux; and the third luminous flux.

In further examples of implementations, the lighting system may include a drive unit configured for supplying electrical drive current to each of the semiconductor light-emitting devices.

In additional examples of implementations of the lighting system, the control unit may be configured for controlling a distribution of the electrical drive current supplied by the drive unit to the semiconductor light-emitting devices.

In other examples of implementations, the lighting system may include a sensor being configured for detecting the first luminous flux, the second luminous flux, and the third luminous flux.

In some examples of implementations of the lighting system, the control unit may be configured for utilizing the detected first luminous flux, the detected second luminous flux, and detected third luminous flux in controlling the distribution of the electrical drive current supplied by the drive unit to the semiconductor light-emitting devices.

In further examples of implementations, the lighting system may include a sensor being configured for detecting the combined luminous flux of the combined light emissions.

In additional examples of implementations of the lighting system, the control unit may be configured for utilizing the detected combined luminous flux in controlling the distribution of the electrical drive current supplied by the drive unit to the semiconductor light-emitting devices.

In other examples of implementations, the lighting system may have a database including look-up tables of luminous flux values for the first luminous flux, the second luminous flux, and the third luminous flux.

In some examples of implementations of the lighting system, the control unit may be configured for controlling the distribution of the electrical drive current supplied by the drive unit to the semiconductor light-emitting devices by comparing the detected first luminous flux, the detected second luminous flux, and the detected third luminous flux with the look-up tables of the luminous flux values.

In further examples of implementations of the lighting system, the control unit may be configured for controlling the distribution of the electrical drive current supplied by the drive unit to minimize any variances between the look-up tables of luminous flux values and the detected first luminous flux, the detected second luminous flux, and the detected third luminous flux.

In additional examples of implementations of the lighting system, the database may be configured as including empirically-detected luminous flux values for the first luminous flux, the second luminous flux, and the third luminous flux, each having a combined color point being within a selected chromaticity bin of the CIE 1931 XY chromaticity diagram.

In other examples of implementations, the lighting system may be configured for user-controlled selection of a combined color point along the light brightening/dimming curve.

In some examples of implementations, the lighting system may be configured for a user-controlled selection of a combined luminous flux of a combined color point along the light brightening/dimming curve.

In further examples of implementations of the lighting system, the first light source may be configured for emitting light having the first color point as being white.

In additional examples of implementations of the lighting system, the first color point may be located between an isotherm of a correlated color temperature of about 4200K and an isotherm of a correlated color temperature of about 2600K.

In other examples of implementations of the lighting system, the first color point may be located between an isotherm of a correlated color temperature of about 3600K and an isotherm of a correlated color temperature of about 3400K.

In some examples of implementations of the lighting system, the first color point may have a correlated color temperature being within a range of between about 4800K and about 2500K.

In further examples of implementations of the lighting system, the first color point may have a correlated color temperature being within a range of between about 4200K and about 2600K.

In additional examples of implementations of the lighting system, the first color point may have a correlated color temperature being within a range of between about 3600K and about 3400K.

In other examples of implementations of the lighting system, the first color point may be located within a distance of about equal to or less than 0.003 delta(uv) away from the Planckian—black-body locus.

In some examples of implementations of the lighting system, the first color point may have a correlated color temperature being within a range of between about 3615K and about 3315K; and the first color point may be located within a distance of about equal to or less than 0.003 delta(uv) away from the Planckian—black-body locus.

In further examples of implementations of the lighting system, the first color point may be located within a boundary defined by lines connecting together the following series of (x,y) coordinate pairs of color points of the CIE 1931 XY chromaticity diagram: (0.4813, 0.4319); (0.4562, 0.4260); (0.4299, 0.4165); (0.4006, 0.4044); (0.3736, 0.3874); (0.3548, 0.3736); (0.3512, 0.3465); (0.3670, 0.3578); (0.3889, 0.3690); (0.4147, 0.3814); (0.4373, 0.3893); (0.4593, 0.3944); and (0.4813, 0.4319).

In additional examples of implementations of the lighting system, the first color point may be located within a boundary defined by lines connecting together the following series of (x,y) coordinate pairs of color points of the CIE 1931 XY chromaticity diagram: (0.402091, 0.395912); (0.396327, 0.379416); (0.412729, 0.387371); (0.419887, 0.404681); and (0.402091, 0.395912).

In other examples of implementations of the lighting system, the second light source may be configured for emitting light having the second color point as being white.

In some examples of implementations of the lighting system, the second light source may be configured for emitting light having the second color point as being: yellow; amber; yellowish-orange; orange; reddish-orange; red; or deep red.

In further examples of implementations of the lighting system, the second color point may be located between an isotherm of a correlated color temperature of about 2800K and an isotherm of a correlated color temperature of about 2100K.

In additional examples of implementations of the lighting system, the second color point may be located between an isotherm of a correlated color temperature of about 2800K and an isotherm of a correlated color temperature of about 2600K.

In other examples of implementations of the lighting system, the second color point may have a correlated color temperature being within a range of between about 2900K and about 1700K.

In some examples of implementations of the lighting system, the second color point may have a correlated color temperature being within a range of between about 2800K and about 2100K.

In further examples of implementations of the lighting system, the second color point may have a correlated color temperature being within a range of between about 2800K and about 2600K.

In additional examples of implementations of the lighting system, the second color point may be located within a distance of about equal to or less than 0.006 delta(uv) away from the Planckian—black-body locus.

In other examples of implementations of the lighting system, the second color point may be located within a distance of about equal to or less than 0.003 delta(uv) away from the Planckian—black-body locus.

In some examples of implementations of the lighting system, the second color point may have a correlated color temperature being within a range of between about 2845K and about 2645K; and the second color point may be located within a distance of about equal to or less than 0.003 delta(uv) away from the Planckian—black-body locus.

In further examples of implementations of the lighting system, the second light source may be configured for emitting light having a dominant- or peak-wavelength being within a range of between about 590 nanometers and about 600 nanometers.

In additional examples of implementations of the lighting system, the second color point may be located within a distance of about equal to or less than 0.025 delta(uv) away from the Planckian—black-body locus.

In other examples of implementations of the lighting system, the second color point may be located within a boundary defined by lines connecting together the following series of (x,y) coordinate pairs of color points of the CIE 1931 XY chromaticity diagram: (0.5650, 0.4200); (0.5400, 0.4250); (0.5100, 0.4330); (0.4813, 0.4319); (0.4562, 0.4260); (0.4373, 0.3893); (0.4593, 0.3944); (0.4870, 0.4000); (0.5200, 0.3990); (0.5450, 0.3975); and (0.5650, 0.4200).

In some examples of implementations of the lighting system, the second color point may be located within a boundary defined by lines connecting together the following series of (x,y) coordinate pairs of color points of the CIE 1931 XY chromaticity diagram: (0.456982, 0.418022); (0.447155, 0.399579); (0.458901, 0.402322); (0.469539, 0.420978); and (0.456982, 0.418022).

In further examples of implementations of the lighting system, the third light source may be configured for emitting light having the third color point as being: yellow; amber; yellowish-orange; orange; reddish-orange; red; or deep red.

In additional examples of implementations of the lighting system, the third light source may be configured for emitting light having a dominant- or peak-wavelength being within a range of between about 610 nanometers and about 670 nanometers.

In other examples of implementations of the lighting system, the third color point may be reddish-orange; and the third light source may be configured for emitting light having a dominant- or peak-wavelength being within a range of between about 610 nanometers and about 620 nanometers.

In some examples of implementations of the lighting system, the third color point may be located within a distance of about equal to or less than 0.025 delta(uv) away from the Planckian—black-body locus.

In further examples of implementations of the lighting system, the third color point may be located within a boundary defined by lines connecting together the following series of (x,y) coordinate pairs of color points of the CIE 1931 XY chromaticity diagram: (0.562200, 0.437200); (0.734685, 0.265310); (0.550000, 0.179540); (0.550000, 0.300000); and (0.562200, 0.437200).

In additional examples of implementations of the lighting system, the third light source may be configured for emitting light having a dominant- or peak-wavelength being within a range of between about 610 nanometers and about 620 nanometers; and the third color point may be reddish-orange and may be in proximity to the following (x,y) coordinate pair of the CIE chromaticity diagram: (0.6822, 0.3171).

In other examples of implementations of the lighting system, the third light source may be configured for emitting light having a dominant- or peak-wavelength being within a range of between about 620 nanometers and about 630 nanometers; and the third color point may be red and may be in proximity to the following (x,y) coordinate pair of the CIE chromaticity diagram: (0.7000, 0.2992).

In some examples of implementations of the lighting system, the third light source may be configured for emitting light having a dominant- or peak-wavelength being within a range of between about 630 nanometers and about 640 nanometers; and the third color point may be red and may be in proximity to the following (x,y) coordinate pair of the CIE chromaticity diagram: (0.7125, 0.2864).

In further examples of implementations of the lighting system, the third light source may be configured for emitting light having a dominant- or peak-wavelength being within a range of between about 650 nanometers and about 660 nanometers; and the third color point may be deep red and may be in proximity to the following (x,y) coordinate pair of the CIE chromaticity diagram: (0.7186, 0.2804).

In additional examples of implementations of the lighting system, the third light source may be configured for emitting light having a dominant- or peak-wavelength being within a range of between about 660 nanometers and about 670 nanometers; and the third color point may be deep red and may be in proximity to the following (x,y) coordinate pair of the CIE chromaticity diagram: (0.7228, 0.2756).

In other examples of implementations of the lighting system, the first lumiphor may be in direct contact with the first semiconductor light-emitting device.

In some examples of implementations of the lighting system, the first light source may include a fourth semiconductor light-emitting device configured for emitting light having a fourth color point.

In further examples of implementations of the lighting system, the fourth color point may be greenish-blue, blue, or purplish-blue.

In additional examples of implementations of the lighting system, the fourth semiconductor light-emitting device may be configured for emitting light having a dominant- or peak-wavelength being within a range of between about 420 nanometers and about 510 nanometers.

In other examples of implementations of the lighting system, the fourth semiconductor light-emitting device may be configured for emitting light having a dominant- or peak-wavelength being within a range of between about 445 nanometers and about 490 nanometers.

In some examples of implementations of the lighting system, the first lumiphor may be configured for causing the first color point to have a correlated color temperature of about 3000K.

In further examples of implementations of the lighting system, the second light source may include a second lumiphor configured for converting light emissions from the second semiconductor light-emitting device having a second spectral power distribution into the second light source emissions having a further spectral power distribution being different than the second spectral power distribution.

In additional examples of implementations of the lighting system, the second lumiphor may be configured for down-converting light emissions of the second semiconductor light-emitting device having wavelengths of the second spectral power distribution into second light source emissions having wavelengths of the further spectral power distribution being longer than wavelengths of the second spectral power distribution.

In other examples of implementations of the lighting system, the second lumiphor may be a remotely-located lumiphor.

In some examples of implementations of the lighting system, the second lumiphor may be in direct contact with the second semiconductor light-emitting device.

In further examples of implementations of the lighting system, the second lumiphor may include: a phosphor; a quantum dot; a quantum wire; a quantum well; a photonic nanocrystal; a semiconducting nanoparticle; a scintillator; a lumiphoric ink; or a day glow tape.

In additional examples of implementations of the lighting system, the second semiconductor light-emitting device may be configured for emitting light having a color point being greenish-blue, blue, or purplish-blue.

In other examples of implementations of the lighting system, the second semiconductor light-emitting device may be configured for emitting light having a dominant- or peak-wavelength being within a range of between about 420 nanometers and about 510 nanometers.

In some examples of implementations of the lighting system, the second semiconductor light-emitting device may be configured for emitting light having a dominant- or peak-wavelength being within a range of between about 445 nanometers and about 490 nanometers.

In further examples of implementations of the lighting system, the second lumiphor may be configured for causing the second color point to have a correlated color temperature of about 2700K.

In additional examples of implementations of the lighting system, the third light source may include a third lumiphor configured for converting light emissions from the third semiconductor light-emitting device having a third spectral power distribution into third light source emissions having an additional spectral power distribution being different than the third spectral power distribution.

In other examples of implementations of the lighting system, the third lumiphor may be configured for down-converting light emissions of the third semiconductor light-emitting device having wavelengths of the third spectral power distribution into third light source emissions having wavelengths of the additional spectral power distribution being longer than wavelengths of the third spectral power distribution.

In some examples of implementations of the lighting system, the third lumiphor may be a remotely-located lumiphor.

In further examples of implementations of the lighting system, the third lumiphor may be in direct contact with the third semiconductor light-emitting device.

In additional examples of implementations of the lighting system, the third lumiphor may include: a phosphor; a quantum dot; a quantum wire; a quantum well; a photonic nanocrystal; a semiconducting nanoparticle; a scintillator; a lumiphoric ink; or a day glow tape.

In other examples of implementations of the lighting system, the third semiconductor light-emitting device may be configured for emitting light having a color point being greenish-blue, blue, or purplish-blue.

In some examples of implementations of the lighting system, the third semiconductor light-emitting device may be configured for emitting light having a dominant- or peak-wavelength being within a range of between about 420 nanometers and about 510 nanometers.

In further examples of implementations of the lighting system, the third semiconductor light-emitting device may be configured for emitting light having a dominant- or peak-wavelength being within a range of between about 445 nanometers and about 490 nanometers.

In another example of an implementation, a lighting process is provided that includes providing a lighting system including a first light source, a second light source, and a third light source. In this example of a lighting process, providing the first light source includes providing a first semiconductor light-emitting device and a first lumiphor configured for converting light emissions of the first semiconductor light-emitting device having a first spectral power distribution into first light source emissions having another spectral power distribution being different than the first spectral power distribution, wherein the first light source is configured for emitting the first light source emissions as having a first color point, wherein the first color point is located between an isotherm of a correlated color temperature of about 4800K and an isotherm of a correlated color temperature of about 2500K, and wherein the first color point is located within a distance of about equal to or less than 0.006 delta(uv) away from a Planckian—black-body locus of the International Commission on Illumination (CIE) 1931 XY chromaticity diagram. Also in this example of a lighting process, providing the second light source includes providing a second semiconductor light-emitting device, wherein the second light source is configured for emitting second light source emissions having a second color point, wherein the second color point is located between an isotherm of a correlated color temperature of about 2900K and an isotherm of a correlated color temperature of about 1700K. Additionally in this example of a lighting process, providing the third light source includes providing a third semiconductor light-emitting device, wherein the third light source is configured for emitting third light source emissions having a third color point, wherein the third color point is located between a line-of-purples of the CIE 1931 XY chromaticity diagram and an isotherm of a correlated color temperature of about 1500K, and wherein the third light source is configured for emitting the third light source emissions as having a dominant- or peak-wavelength being within a range of between about 590 nanometers and about 700 nanometers. Further, this example of a lighting process includes causing the lighting system to form combined light emissions having combined color points, wherein the combined light emissions include the first light source emissions, and the second light source emissions, and the third light source emissions. Additionally, this example of a lighting process includes causing the combined color points of the combined light emissions to remain below the Planckian—black-body locus by a distance being within a range of between about 0.001 delta(uv) and about 0.009 delta(uv) throughout a light brightening/dimming curve of correlated color temperatures (CCTs).

In some examples of implementations of the lighting process, causing the combined color points to remain below the Planckian—black-body locus may include causing the combined color points to remain below the Planckian—black-body locus with the light brightening/dimming curve as including a brightened terminus having a CCT being within a range of between about 3400K and about 2700K and including a dimmed terminus having a CCT being within a range of between about 2200K and about 1700K.

In further examples of implementations of the lighting process, causing the combined color points to remain below the Planckian—black-body locus may include causing the combined color points to remain below the Planckian—black-body locus with the light brightening/dimming curve as including a brightened terminus having a CCT of about 3200K and including a dimmed terminus having a CCT of about 1800K.

In additional examples of implementations of the lighting process, causing the combined color points to remain below the Planckian—black-body locus may include causing the distance of the combined color points below the Planckian—black-body locus to have a maximum variance of about equal to or less than 0.002 delta(uv) throughout the light brightening/dimming curve.

In other examples of implementations of the lighting process, causing the lighting system to form combined light emissions may include causing the combined color points to emulate color points of an incandescent light emitter throughout the light brightening/dimming curve.

In some examples of implementations of the lighting process, causing the lighting system to form combined light emissions may include causing the combined light emissions to have the combined color points as being substantially constant throughout the light brightening/dimming curve.

In further examples of implementations of the lighting process, causing the lighting system to form combined light emissions may include causing the combined color points to have a color rendition index (CRI-Ra including $R_{1-15}$) throughout the light brightening/dimming curve being about equal to or greater than 75.

In additional examples of implementations of the lighting process, causing the lighting system to form combined light emissions may include causing the combined color points to have a color rendition index (CRI-Ra including $R_{1-8}$) throughout the light brightening/dimming curve being about equal to or greater than 75.

In other examples of implementations of the lighting process, causing the lighting system to form combined light emissions may include causing the combined color points to have a color rendition index (CRI-$R_9$) throughout the light brightening/dimming curve being about equal to or greater than 80.

In some examples of implementations of the lighting process, causing the lighting system to form combined light emissions may include causing the combined light emissions to perceptually form an unbroken line.

In further examples of implementations of the lighting process, causing the lighting system to form combined light emissions may include: causing the first light source to emit the first light source emissions as having a first luminous flux; and causing the second light source to emit the second light source emissions as having a second luminous flux; and causing the third light source to emit the third light source emissions as having a third luminous flux.

In additional examples of implementations of the lighting process, causing the lighting system to form combined light emissions may include detecting the first luminous flux, the second luminous flux, and the third luminous flux.

In other examples of implementations of the lighting process, causing the lighting system to form combined light emissions may include controlling the first luminous flux, and the second luminous flux, and the third luminous flux.

In some examples of implementations of the lighting process, causing the lighting system to form combined light emissions may include controlling a combined luminous flux of the combined light emissions.

In further examples of implementations of the lighting process, causing the lighting system to form combined light emissions may include causing the combined luminous flux to progressively increase along the light brightening/dimming curve from a brightened terminus having a CCT being within a range of between about 3400K and about 2700K to a dimmed terminus having a CCT being within a range of between about 2200K and about 1700K.

In additional examples of implementations of the lighting process, causing the lighting system to form combined light emissions may include utilizing the detected first luminous flux, the detected second luminous flux, and the detected third luminous flux in controlling a distribution of electrical drive current to the semiconductor light-emitting devices.

In other examples of implementations of the lighting process, causing the lighting system to form combined light emissions may include controlling the distribution of the electrical drive current to the semiconductor light-emitting devices by comparing the detected first luminous flux, the detected second luminous flux, and the detected third luminous flux with a look-up table of luminous flux values.

In some examples of implementations of the lighting process, causing the lighting system to form combined light emissions may include detecting the combined luminous flux of the combined light emissions.

In further examples of implementations of the lighting process, causing the lighting system to form combined light emissions may include utilizing the detected combined luminous flux in controlling the distribution of the electrical drive current to the semiconductor light-emitting devices.

In additional examples of implementations of the lighting process, causing the lighting system to form combined light emissions may include controlling the distribution of the electrical drive current to minimize any variances between the look-up tables of luminous flux values and the detected first luminous flux, the detected second luminous flux, and the detected third luminous flux.

Other systems, processes, features and advantages of the invention will be or will become apparent to one with skill in the art upon examination of the following figures and detailed description. It is intended that all such additional systems, processes, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

DETAILED DESCRIPTION

Figure 1:
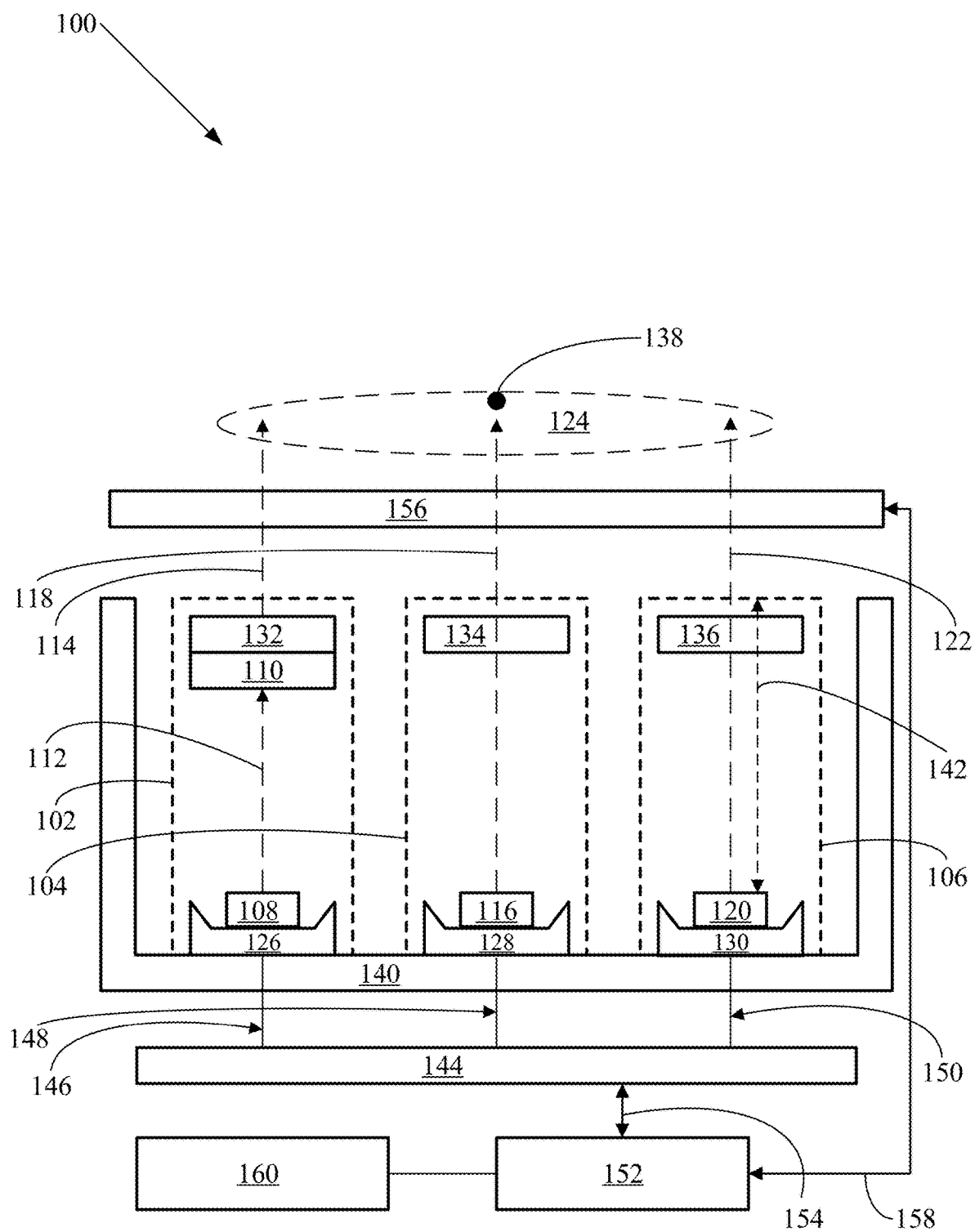
FIG. 1 is a schematic cross-sectional view showing an example of an implementation of a lighting system.

Various lighting systems and processes that utilize multiple light sources have been designed. Many such lighting systems and processes exist that are capable of forming combined light emissions. However, existing lighting systems and processes that include and utilize multiple light sources often have demonstrably failed to provide aesthetically-pleasing "white" light to emulate the incandescent illumination of a black-body radiator. For example, much of the innovation efforts in such illumination have focused on emulating the light emissions of a black-body radiator along the Planckian—black-body locus. However, research has found that most light sources having color points being on or along the Planckian—black-body locus are not perceived as "white." Furthermore, research has suggested that light emissions having color points being below and away from the Planckian—black-body locus rather than being on or along the Planckian—black-body locus accordingly are more aesthetically pleasing to human eyesight. General background information on systems and processes for generating light perceived as being "white" is provided in "Class A Color Designation for Light Sources Used in General Illumination", Freyssinier and Rea, *J. Light & Vis.*

*Env.*, Vol. 37, No. 2 & 3 (Nov. 7, 2013, Illuminating Engineering Institute of Japan), pp. 10-14; the entirety of which hereby is incorporated herein by reference.

Lighting systems accordingly are provided herein, including a first light source, a second light source, and a third light source. The first-, second-, and third-light sources respectively include first-, second-, and third-semiconductor light-emitting devices. The first light source further includes a first lumiphor configured for converting light emissions of the first semiconductor light-emitting device having a first spectral power distribution into first light source emissions having another spectral power distribution being different than the first spectral power distribution. The first light source is configured for emitting the first light source emissions as having a first color point being located between an isotherm of a correlated color temperature of about 4800K and an isotherm of a correlated color temperature of about 2500K. The first color point is also located within a distance of about equal to or less than 0.006 delta(uv) away from a Planckian—black-body locus of the International Commission on Illumination (CIE) 1931 XY chromaticity diagram. The second light source is configured for emitting second light source emissions having a second color point being located between an isotherm of a correlated color temperature of about 2900K and an isotherm of a correlated color temperature of about 1700K. The third light source is configured for emitting third light source emissions having a third color point being located between a line-of-purples of the CIE 1931 XY chromaticity diagram and an isotherm of a correlated color temperature of about 1500K. The third light source is also configured for emitting the third light source emissions as having a dominant- or peak-wavelength being within a range of between about 590 nanometers and about 700 nanometers. The lighting system is configured for forming combined light emissions, having combined color points, that include the first-, second-, and third-light source emissions. The lighting system is further configured for causing the combined color points of the combined light emissions to remain below the Planckian—black-body locus by a distance being within a range of between about 0.001 delta(uv) and about 0.009 delta(uv) throughout a light brightening/dimming curve of correlated color temperatures (CCTs).

Lighting processes also accordingly are provided herein, which include providing a lighting system that includes a first light source, a second light source, and a third light source. The lighting processes also include causing the lighting system to form combined light emissions having combined color points, wherein the combined light emissions include first light source emissions, and second light source emissions, and third light source emissions. The lighting processes further include causing the combined color points of the combined light emissions to remain below the Planckian—black-body locus by a distance being within a range of between about 0.001 delta(uv) and about 0.009 delta(uv) throughout a light brightening/dimming curve of correlated color temperatures (CCTs).

The following definitions of terms, being stated as applying "throughout this specification", are hereby deemed to be incorporated throughout this specification, including but not limited to the Summary, Brief Description of the Figures, Detailed Description, and Claims.

Throughout this specification, the term "semiconductor" means: a substance, for as examples a solid chemical element or compound, that can conduct electricity under some conditions but not others, making it a good medium for the control of electrical current.

Throughout this specification, the term "semiconductor light-emitting device" means: a light-emitting diode; an organic light-emitting diode; a laser diode; or any other light-emitting device having one or more layers containing inorganic and/or organic semiconductor(s). Throughout this specification, the term "light-emitting diode" (herein also referred to as an "LED") means: a two-lead semiconductor light source having an active pn-junction. As examples, an LED may include a series of semiconductor layers that may be epitaxially grown on a substrate such as, for example, a sapphire, silicon, silicon carbide, gallium nitride or gallium arsenide substrate. Further, for example, one or more semiconductor p-n junctions may be formed in these epitaxial layers. When a sufficient voltage is applied across the p-n junction, for example, electrons in the n-type semiconductor layers and holes in the p-type semiconductor layers flow toward the p-n junction. As the electrons and holes flow toward each other, some of the electrons will recombine with corresponding holes, and emit photons. The energy release is called electroluminescence, and the color of the light, which corresponds to the energy of the photons, is determined by the energy band gap of the semiconductor. As examples, the spectral power distribution of the light generated by an LED may generally depend on the particular semiconductor materials used and the structure of the thin epitaxial layers that make up the "active region" of the device, being the area where the light is generated. As examples, an LED may have a light-emissive electroluminescent layer including an inorganic semiconductor, such as: a Group III-V semiconductor such as gallium nitride; silicon; silicon carbide; or zinc oxide.

Throughout this specification, the term "organic light-emitting diode" (herein also referred to as an "OLED") means: an LED have a light-emissive electroluminescent layer including an organic semiconductor, such as small organic molecules or an organic polymer. It is understood throughout this specification that a semiconductor light-emitting device may include: a non-semiconductor- or semiconductor-substrate; and may include one or more electrically-conductive contact layers. Further, it is understood throughout this specification that an LED may include a substrate formed of materials such as, for example: silicon carbide; sapphire; gallium nitride; or silicon. It is additionally understood throughout this specification that a semiconductor light-emitting device may have a cathode contact on one side and an anode contact on an opposite side, or may alternatively have both contacts on the same side of the device.

Further background information regarding semiconductor light-emitting devices is provided in the following documents, the entireties of all of which hereby are incorporated by reference herein: U.S. Pat. Nos. 7,564,180; 7,456,499; 7,213,940; 7,095,056; 6,958,497; 6,853,010; 6,791,119; 6,600,175; 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862; and 4,918,497; and U.S. Patent Application Publication Nos. 2014/0225511; 2014/0078715; 2013/0241392; 2009/0184616; 2009/0080185; 2009/0050908; 2009/0050907; 2008/0308825; 2008/0198112; 2008/0179611; 2008/0173884; 2008/0121921; 2008/0012036; 2007/0253209; 2007/0223219; 2007/0170447; 2007/0158668; 2007/0139923; and 2006/0221272.

Throughout this specification, the term "spectral power distribution" means: the emission spectrum of the one or more wavelengths of light emitted by a semiconductor light-emitting device. Throughout this specification, the term "peak wavelength" means: the wavelength where the spectral power distribution of a semiconductor light-emitting device reaches its maximum value as detected by a photo-detector. As an example, an LED may be a nearly monochromatic light source that appears to emit light having a single color. Thus, the spectral power distribution of the light emitted by such an LED may be centered about its peak wavelength. As examples, the "width" of the spectral power distribution of an LED may be within a range of between about 10 nanometers and about 30 nanometers, where the width is measured at half the maximum illumination on each side of the emission spectrum. Throughout this specification, the term "full-width-half-maximum" ("FWHM") means: the width of the spectral power distribution of a semiconductor light-emitting device measured at half the maximum illumination on each side of its emission spectrum. Throughout this specification, the term "dominant wavelength" means: the wavelength of monochromatic light that has the same apparent color as the light emitted by a semiconductor light-emitting device as perceived by the human eye. As an example, since the human eye perceives yellow and green light better than red and blue light, and because the light emitted by a semiconductor light-emitting device may extend across a range of wavelengths, the color perceived (i.e., the dominant wavelength) may differ from the peak wavelength.

Throughout this specification, the term "color bin" means: the designated empirical spectral power distribution and related characteristics of a particular semiconductor light-emitting device. For example, individual light-emitting diodes (LEDs) are typically tested and assigned to a designated color bin (i.e., "binned") based on a variety of characteristics derived from their spectral power distribution. As an example, a particular LED may be binned based on the value of its peak wavelength, being a common metric to characterize the color aspect of the spectral power distribution of LEDs. Examples of other metrics that may be utilized to bin LEDs include: dominant wavelength; and color point.

Throughout this specification, the term "luminescent" means: characterized by absorption of electromagnetic radiation (e.g., visible light, UV light or infrared light) causing the emission of light by, as examples: fluorescence; and phosphorescence.

Throughout this specification, the term "lumiphor" means: a medium that includes one or more luminescent materials being positioned to absorb light that is emitted at a first spectral power distribution by a semiconductor light-emitting device, and to re-emit light at a second spectral power distribution in the visible or ultra violet spectrum being different than the first spectral power distribution, regardless of the delay between absorption and re-emission. Lumiphors may be categorized as being down-converting, i.e., a material that converts photons to a lower energy level (longer wavelength); or up-converting, i.e., a material that converts photons to a higher energy level (shorter wavelength). As examples, a luminescent material may include: a phosphor; a quantum dot; a photonic nanocrystal; a semiconducting nanoparticle; a scintillator; a lumiphoric ink; a day glow tape; a phosphorescent material; or a fluorescent material. As examples, a lumiphor may include one or more layers or bodies that may contain one or more luminescent materials that each may be (1) coated or sprayed directly onto the semiconductor light-emitting device, (2) coated or sprayed onto surfaces of a lens or other elements of packaging for the semiconductor light-emitting device, and/or (3) included within a clear encapsulant (e.g., an epoxy-based or silicone-based curable resin or glass or ceramic) that may be positioned on or over the semiconductor light-emitting device. A lumiphor may include one or multiple types of luminescent materials. Other materials may also be included with a lumiphor such as, for example, fillers, diffusants, colorants, or other materials that may as examples improve the performance or overall cost of the lumiphor. In examples where multiple types of luminescent materials may be included in a lumiphor, such materials may, as examples, be mixed together in a single layer or deposited sequentially in successive layers Throughout this specification, the term "remotely-located lumiphor" means a lumiphor being spaced apart at a distance from and positioned to receive light that is emitted by a semiconductor light-emitting device. As an example of a remotely-located lumiphor: one or more semiconductor light-emitting devices and one or more lumiphors may be mutually spaced apart and included together in a package including electrical contacts for energizing the devices. In another example of a remotely-located lumiphor: a semiconductor light-emitting device may be included in a package; and a lumiphor may be positioned outside of the package.

Throughout this specification, the term "phosphor" means: a material that exhibits luminescence when struck by photons. Examples of phosphors that may utilized include: $CaAlSiN_3$:Eu, $SrAlSiN_3$:Eu, $CaAlSiN_3$:Eu, $Ba_3Si_6O_{12}N_2$:Eu, $Ba_2SiO_4$:Eu, $Sr_2SiO_4$:Eu, $Ca_2SiO_4$:Eu, $Ca_3Sc_2Si_3O_{12}$:Ce, $Ca_3Mg_2Si_3O_{12}$:Ce, $CaSc_2O_4$:Ce, $CaSi_2O_2N_2$:Eu, $SrSi_2O_2N_2$:Eu, $BaSi_2O_2N_2$:Eu, $Ca_5(PO_4)_3Cl$:Eu, $Ba_5(PO_4)_3Cl$:Eu, $Cs_2CaP_2O_7$, $Cs_2SrP_2O_7$, $SrGa_2S_4$:Eu, $Lu_3Al_5O_{12}$:Ce, $Ca_8Mg(SiO_4)_4Cl_2$:Eu, $Sr_8Mg(SiO_4)_4Cl_2$:Eu, $La_3Si_6N_{11}$:Ce, $Y_3Al_5O_{12}$:Ce, $Y_3Ga_5O_{12}$:Ce, $Gd_3Al_5O_{12}$:Ce, $Gd_3Ga_5O_{12}$:Ce, $Tb_3Al_5O_{12}$:Ce, $Tb_3Ga_5O_{12}$:Ce, $Lu_3Ga_5O_{12}$:Ce, $(SrCa)AlSiN_3$:Eu, LuAG:Ce, $(Y,Gd)_2Al_5)_{12}$:Ce, CaS:Eu, SrS:Eu, $SrGa_2S_4$:$E_4$, $Ca_2(Sc,Mg)_2SiO_{12}$:Ce, $Ca_2Sc_2Si_2)_{12}$:C2, $Ca_2Sc_2O_4$:Ce, $Ba_2Si_6O_{12}N_2$:Eu, $(SrCa)AlSiN_2$:Eu, and $CaAlSiN_2$:Eu.

Throughout this specification, the term "quantum dot" means: a nanocrystal made of semiconductor materials that are small enough to exhibit quantum mechanical properties, such that its excitons are confined in all three spatial dimensions.

Throughout this specification, the term "quantum wire" means: an electrically conducting wire in which quantum effects influence the transport properties.

Throughout this specification, the term "quantum well" means: a thin layer that can confine (quasi-)particles (typically electrons or holes) in the dimension perpendicular to the layer surface, whereas the movement in the other dimensions is not restricted.

Throughout this specification, the term "photonic nanocrystal" means: a periodic optical nanostructure that affects the motion of photons, for one, two, or three dimensions, in much the same way that ionic lattices affect electrons in solids.

Throughout this specification, the term "semiconducting nanoparticle" means: a particle having a dimension within a range of between about 1 nanometer and about 100 nanometers, being formed of a semiconductor.

Throughout this specification, the term "scintillator" means: a material that fluoresces when struck by photons.

Throughout this specification, the term "lumiphoric ink" means: a liquid composition containing a luminescent material. For example, a lumiphoric ink composition may contain semiconductor nanoparticles. Examples of lumiphoric ink compositions that may be utilized are disclosed in Cao et al., U.S. Patent Application Publication No. 20130221489 published on Aug. 29, 2013, the entirety of which hereby is incorporated herein by reference.

Throughout this specification, the term "day glow tape" means: a tape material containing a luminescent material.

Throughout this specification, the term "CIE 1931 XY chromaticity diagram" means: the 1931 International Commission on Illumination two-dimensional chromaticity diagram as shown, for example, in FIG. 2 discussed in further detail below, which defines the spectrum of perceived color points of visible light by (x, y) pairs of chromaticity coordinates that fall within a generally U-shaped area that includes all of the hues perceived by the human eye. Each of the x and y axes of the CIE 1931 XY chromaticity diagram has a scale of between 0.0 and 0.8. The spectral colors are distributed around the perimeter boundary of the chromaticity diagram, the boundary encompassing all of the hues perceived by the human eye. The perimeter boundary itself represents maximum saturation for the spectral colors. The CIE 1931 XY chromaticity diagram is based on the three dimensional CIE 1931 XYZ color space. The CIE 1931 XYZ color space utilizes three color matching functions to determine three corresponding tristimulus values which together express a given color point within the CIE 1931 XYZ three dimensional color space. The CIE 1931 XY chromaticity diagram is a projection of the three dimensional CIE 1931 XYZ color space onto a two dimensional (x, y) space such that brightness is ignored. A technical description of the CIE 1931 XY chromaticity diagram is provided in, for example, the "Encyclopedia of Physical Science and Technology", vol. 7, pp. 230-231 (Robert A Meyers ed., 1987); the entirety of which hereby is incorporated herein by reference. Further background information regarding the CIE 1931 XY chromaticity diagram is provided in Harbers et al., U.S. Patent Application Publication No. 2012/0224177A1 published on Sep. 6, 2012, the entirety of which hereby is incorporated herein by reference.

Throughout this specification, the term "color point" means: an (x, y) pair of chromaticity coordinates falling within the CIE 1931 XY chromaticity diagram. Color points located at or near the perimeter boundary of the CIE 1931 XY chromaticity diagram are saturated colors composed of light having a single wavelength, or having a very small spectral power distribution. Color points away from the perimeter boundary within the interior of the CIE 1931 XY chromaticity diagram are unsaturated colors that are composed of a mixture of different wavelengths.

Throughout this specification, the term "combined light emissions" means: light emitted by a plurality of light sources and being mixed together. Throughout this specification, the term "combined color point" means: the color point, as perceived by human eyesight, of combined light emissions. Throughout this specification, a "substantially constant" combined color points are: color points of combined light emissions that are perceived by human eyesight as being uniform, i.e., as being of the same color.

Throughout this specification, the term "line-of-purples" means: the locus on the edge of the CIE 1931 chromaticity diagram between extreme spectral fully saturated red and extreme spectral fully saturated violet, being the "bottom" portion of the perimeter boundary. Except for the endpoints, every color on the line-of-purples is produced by mixing together a unique ratio of fully saturated red and fully saturated violet. Line-of-purples colors are considered fully saturated in the sense that for any given point on the line-of-purples there exists no color involving a mixture of red and violet that is more saturated than that given point.

Throughout this specification, the term "Planckian—black-body locus" means the curve within the CIE 1931 XY chromaticity diagram that plots the chromaticity coordinates (i.e., color points) that obey Planck's equation: $E(\lambda)=A\lambda-5/(e^{B/T}-1)$, where E is the emission intensity, X is the emission wavelength, T is the color temperature in degrees Kelvin of a black-body radiator, and A and B are constants. The Planckian—black-body locus corresponds to the locations of color points of light emitted by a black-body radiator that is heated to various temperatures. As a black-body radiator is gradually heated, it becomes an incandescent light emitter (being referred to throughout this specification as an "incandescent light emitter") and first emits reddish light, then yellowish light, and finally bluish light with increasing temperatures. This incandescent glowing occurs because the wavelength associated with the peak radiation of the black-body radiator becomes progressively shorter with gradually increasing temperatures, consistent with the Wien Displacement Law. The CIE 1931 XY chromaticity diagram further includes a series of lines each having a designated corresponding temperature listing in units of degrees Kelvin spaced apart along the Planckian—black-body locus and corresponding to the color points of the incandescent light emitted by a black-body radiator having the designated temperatures. Throughout this specification, such a temperature listing is referred to as a "correlated color temperature" (herein also referred to as the "CCT") of the corresponding color point. Correlated color temperatures are expressed herein in units of degrees Kelvin (K). Throughout this specification, each of the lines having a designated temperature listing is referred to as an "isotherm" of the corresponding correlated color temperature.

Throughout this specification, the term "chromaticity bin" means: a bounded region within the CIE 1931 XY chromaticity diagram. As an example, a chromaticity bin may be defined by a series of chromaticity (x,y) coordinates, being connected in series by lines that together form the bounded region. As another example, a chromaticity bin may be defined by several lines or other boundaries that together form the bounded region, such as: one or more isotherms of CCT's; and one or more portions of the perimeter boundary of the CIE 1931 chromaticity diagram.

Throughout this specification, the term "delta(uv)" means: the shortest distance of a given color point away from (i.e., above or below) the Planckian—black-body locus. In general, color points located at a delta(uv) of about equal to or less than 0.015 may be assigned a correlated color temperature (CCT).

Throughout this specification, the term "greenish-blue light" means: light having a perceived color point being within a range of between about 487 nanometers and about 482 nanometers (herein referred to as a "greenish-blue color point.").

Throughout this specification, the term "blue light" means: light having a perceived color point being within a range of between about 482 nanometers and about 470 nanometers (herein referred to as a "blue color point.").

Throughout this specification, the term "purplish-blue light" means: light having a perceived color point being within a range of between about 470 nanometers and about 380 nanometers (herein referred to as a "purplish-blue color point.").

Throughout this specification, the term "yellow light" means: light having a perceived color point being within a range of between about 575 nanometers and about 579 nanometers (herein referred to as a "yellow color point.").

Throughout this specification, the term "amber light" means: light having a perceived color point being within a range of between about 579 nanometers and about 581 nanometers (herein referred to as an "amber color point.").

Throughout this specification, the term "yellowish-orange light" means: light having a perceived color point being within a range of between about 581 nanometers and about 586 nanometers (herein referred to as a "yellowish-orange color point.").

Throughout this specification, the term "orange light" means: light having a perceived color point being within a range of between about 586 nanometers and about 599 nanometers (herein referred to as an "orange color point.").

Throughout this specification, the term "reddish-orange light" means: light having a perceived color point being within a range of between about 610 nanometers and about 620 nanometers (herein referred to as a "reddish-orange color point.").

Throughout this specification, the term "red light" means: light having a perceived color point being within a range of between about 620 nanometers and about 640 nanometers (herein referred to as a "red color point.").

Throughout this specification, the term "deep red light" means: light having a perceived color point being within a range of between about 640 nanometers and about 670 nanometers (herein referred to as a "deep red color point.").

Throughout this specification, the term "white light" means: light having a color point located at a delta(uv) of about equal to or less than 0.006 and having a CCT being within a range of between about 10000K and about 1800K (herein referred to as a "white color point."). Many different hues of light may be perceived as being "white." For example, some "white" light, such as light generated by a tungsten filament incandescent lighting device, may appear yellowish in color, while other "white" light, such as light generated by some fluorescent lighting devices, may appear more bluish in color. As examples, white light having a CCT of about 3000K may appear yellowish in color, while white light having a CCT of about equal to or greater than 8000K may appear more bluish in color and may be referred to as "cool" white light. Further, white light having a CCT of between about 2500K and about 4500K may appear reddish or yellowish in color and may be referred to as "warm" white light. "White light" includes light having a spectral power distribution of wavelengths including red, green and blue color points. For example, light emissions from a semiconductor light-emitting device that includes three separate emitters respectively having red, green and blue color points with an appropriate spectral power distribution may have a white color point. As another example, light emissions from a semiconductor light-emitting device having a blue, greenish-blue or purplish-blue color point may be mixed together with light emissions having a yellow color point being produced by passing some of the light emissions having the blue, greenish-blue or purplish-blue color point through a lumiphor to down-convert them into light emissions having the yellow color point.

Throughout this specification, the term "light brightening/dimming curve" means: a progression of combined color points of combined light emissions between a brightened correlated color temperature (CCT) and a dimmed correlated color temperature. As an example, a light brightening/dimming curve may have a brightened terminus having a correlated color temperature (CCT) being within a range of between about 3400K and about 2700K; and a dimmed terminus having a correlated color temperature (CCT) being within a range of between about 2200K and about 1700K.

As another example, a light brightening/dimming curve may have a brightened terminus with a CCT of about 3200K and a dimmed terminus with a CCT of about 1800K.

Throughout this specification, the term "color rendition index" (herein also referred to as "CRT-Ra") means: the quantitative measure on a scale of 1-100 of the capability of a given light source to accurately reveal the colors of one or more objects having designated reference colors, in comparison with the capability of a black-body radiator to accurately reveal such colors. The CRI-Ra of a given light source is a modified average of the relative measurements of color renditions by that light source, as compared with color renditions by a reference black-body radiator, when illuminating objects having the designated reference color(s). The CRT is a relative measure of the shift in perceived surface color of an object when illuminated by a particular light source versus a reference black-body radiator. The CRI-Ra will equal 100 if the color coordinates of a set of test colors being illuminated by the given light source are the same as the color coordinates of the same set of test colors being irradiated by the black-body radiator. The CRT system is administered by the International Commission on Illumination (CIE). The CIE selected fifteen test color samples (respectively designated as $R_{1-15}$) to grade the color properties of a white light source. The first eight test color samples (respectively designated as $R_{1-8}$) are relatively low saturated colors and are evenly distributed over the complete range of hues. These eight samples are employed to calculate the general color rendering index Ra. The general color rendering index Ra is simply calculated as the average of the first eight color rendering index values, $R_{1-8}$. An additional seven samples (respectively designated as $R_{9-15}$) provide supplementary information about the color rendering properties of a light source; the first four of them focus on high saturation, and the last three of them are representative of well-known objects. A set of color rendering index values, $R_{1-15}$, can be calculated for a particular correlated color temperature (CCT) by comparing the spectral response of a light source against that of each test color sample, respectively. As another example, the CRI-Ra may consist of one test color, such as the designated red color of $R_9$.

As examples, sunlight generally has a CRI-Ra of about 100; incandescent light bulbs generally have a CRI-Ra of about 95; fluorescent lights generally have a CRI-Ra of about 70 to 85; and monochromatic light sources generally have a CRI-Ra of about zero. As an example, a light source for general illumination applications where accurate rendition of object colors may not be considered important may generally need to have a CRI-Ra value being within a range of between about 70 and about 80. Further, for example, a light source for general interior illumination applications may generally need to have a CRI-Ra value being at least about 80. As an additional example, a light source for general illumination applications where objects illuminated by the lighting device may be considered to need to appear to have natural coloring to the human eye may generally need to have a CRI-Ra value being at least about 85. Further, for example, a light source for general illumination applications where good rendition of perceived object colors may be considered important may generally need to have a CRI-Ra value being at least about 90.

Throughout this specification, the term "luminous flux", also referred to as "luminous power", means: the measure of the perceived power of light, being adjusted to reflect the varying sensitivity of the human eye to different wavelengths of light. Throughout this specification, the term "radiant flux" means: the measure of the total power of electromagnetic radiation without being so adjusted.

Throughout this specification, the term "in contact with" means: that a first structure, being "in contact with" a second structure, is in either direct or indirect contact with the second structure. Throughout this specification, the term "in indirect contact with" means: that the first structure is not in direct contact with the second structure, but instead that there are a plurality of structures (including the first and second structures), and each of the plurality of structures is in direct contact with at least one other of the plurality of structures (e.g., the first and second structures are in a stack and are separated by one or more intervening layers). Throughout this specification, the term "in direct contact with" means: that the first structure, which is "in direct contact" with a second structure, is touching the second structure and there are no intervening structures between at least portions of both the first and second structures.

Throughout this specification, the term "control unit" means: a device being suitable for controlling a spectral power distribution of electrical drive current supplied to one or more semiconductor light-emitting devices. As an example, a control unit may include a microprocessor. Throughout this specification, it is understood that the term "microprocessor" means a multipurpose, programmable device that accepts digital data as input, and processes the digital data according to instructions stored in the programmable device's memory, and provides results as output. Throughout this specification, the term "drive unit" means: a device being suitable for supplying electrical drive current to one or more semiconductor light-emitting devices. As examples, a drive unit may have conductors for supplying the electrical drive current, being independently electrically connected with the semiconductor light-emitting devices. As further examples, a drive unit may include: (1) one or more electrical components employed in converting electrical power (e.g., from AC to DC and/or from one voltage to another voltage); (2) one or more electronic components employed in driving one or more semiconductor light-emitting devices, e.g., running one or more semiconductor light-emitting devices intermittently and/or adjusting the electrical drive current supplied to one or more of the semiconductor light-emitting devices in response to a user command or a command received from a control unit; (3) one or more circuit boards (e.g., a metal core circuit board) for supporting and/or providing electrical current to semiconductor light-emitting devices or any other electrical components, and/or (4) one or more wires connecting any electrical components (e.g., connecting an Edison socket to a circuit board), etc., e.g. electronic components such as linear current regulated supplies, pulse width modulated current and/or voltage regulated supplies, bridge rectifiers, transformers, or power factor controllers.

Throughout this specification, the term "signal communication" means communication of an electronic control signal or an electromagnetic radiation control signal.

Throughout this specification, the term "spectrophotometer" means: an apparatus that can measure a light beam's intensity as a function of its wavelength and calculate its total luminous flux.

Throughout this specification, the term "integrating sphere—spectrophotometer" means: a spectrophotometer operationally connected with an integrating sphere. An integrating sphere (also known as an Ulbricht sphere) is an optical component having a hollow spherical cavity with its interior covered with a diffuse white reflective coating, with small holes for entrance and exit ports. Its relevant property is a uniform scattering or diffusing effect. Light rays incident on any point on the inner surface are, by multiple scattering reflections, distributed equally to all other points. The effects of the original direction of light are minimized. An integrating sphere may be thought of as a diffuser which preserves power but destroys spatial information. Another type of integrating sphere that can be utilized is referred to as a focusing or Coblentz sphere. A Coblentz sphere has a mirror-like (specular) inner surface rather than a diffuse inner surface. Light scattered by the interior of an integrating sphere is evenly distributed over all angles. The total power (radiant flux) of a light source can then be measured without inaccuracy caused by the directional characteristics of the source. Background information on integrating sphere—spectrophotometer apparatus is provided in Liu et al., U.S. Pat. No. 7,532,324 issued on May 12, 2009, the entirety of which hereby is incorporated herein by reference. It is understood throughout this specification that color points may be measured, for example, by utilizing a spectrophotometer, such as an integrating sphere—spectrophotometer.

FIG. 1 is a schematic cross-sectional view showing an example [100] of an implementation of a lighting system. As shown in FIG. 1, the example [100] of the implementation of the lighting system includes: a first light source [102] represented by a dashed box; a second light source [104] represented by another dashed box; and a third light source [106] represented by a further dashed box. Another example [1600] of an implementation of a lighting system will subsequently be discussed in connection with FIG. 16; and an example [1700] of an implementation of a lighting process will be subsequently discussed in connection with FIG. 17. It is understood throughout this specification that the example [100] of an implementation of the lighting system may be modified as including any of the features or combinations of features that are disclosed in connection with: the another example [1600] of an implementation of a lighting system; or the example [1700] of an implementation of a lighting process. Accordingly, FIGS. 16-17 and the entireties of the subsequent discussions of the another example [1600] of an implementation of a lighting system and of the example [1700] of an implementation of a lighting process are hereby incorporated into the following discussion of the example [100] of an implementation of the lighting system. Referring to FIG. 1, the first light source [102] of the example [100] of an implementation of the lighting system includes: a first semiconductor light-emitting device [108]; and a first lumiphor [110]. The first lumiphor [110] is configured for converting initial light emissions represented by an arrow [112] of the first semiconductor light-emitting device [108] having a first spectral power distribution into first light source emissions represented by an arrow [114] having another spectral power distribution being different than the first spectral power distribution.

In examples, the first lumiphor [110] may include a medium that includes one or more luminescent materials being positioned: to absorb initial light emissions represented by the arrow [112] emitted at wavelengths of the first spectral power distribution by the first semiconductor light-emitting device [108]; and to emit first light source emissions represented by the arrow [114] having wavelengths of the another spectral power distribution being different than the wavelengths of the first spectral power distribution. As examples, the first light source emissions represented by the arrow [114] may include light emissions having some or all of the wavelengths included in the first spectral power distribution of the light emissions [112]. As an example, the lumiphor [110] may be categorized as being down-converting, i.e., the first lumiphor [110] may be configured for down-converting light emissions represented by the arrow [112] from the first semiconductor light-emitting device [108] having initial wavelengths of the first spectral power distribution into first light source emissions represented by the arrow [114] having converted wavelengths included in the another spectral power distribution being longer than the initial wavelengths of the first spectral power distribution. As another example, the lumiphor [110] may be categorized as being up-converting, i.e., the first lumiphor [110] may be configured for up-converting initial light emissions represented by the arrow [112] of the first semiconductor light-emitting device [108] having wavelengths of the first spectral power distribution into first light source emissions represented by the arrow [114] having converted wavelengths of the another spectral power distribution being shorter than the initial wavelengths of the first spectral power distribution. Further, for example, the lumiphor [110] may be remotely-located as shown in FIG. 1, being spaced apart at a distance represented by the arrow [112] away from the first semiconductor light-emitting device [108]. In additional examples, the medium that is included in the first lumiphor [110] may have the luminescent material as including: a phosphor; a quantum dot; a photonic nanocrystal; a semiconducting nanoparticle; a scintillator; a lumiphoric ink; a day glow tape; a phosphorescent material; or a fluorescent material.

Figure 2:
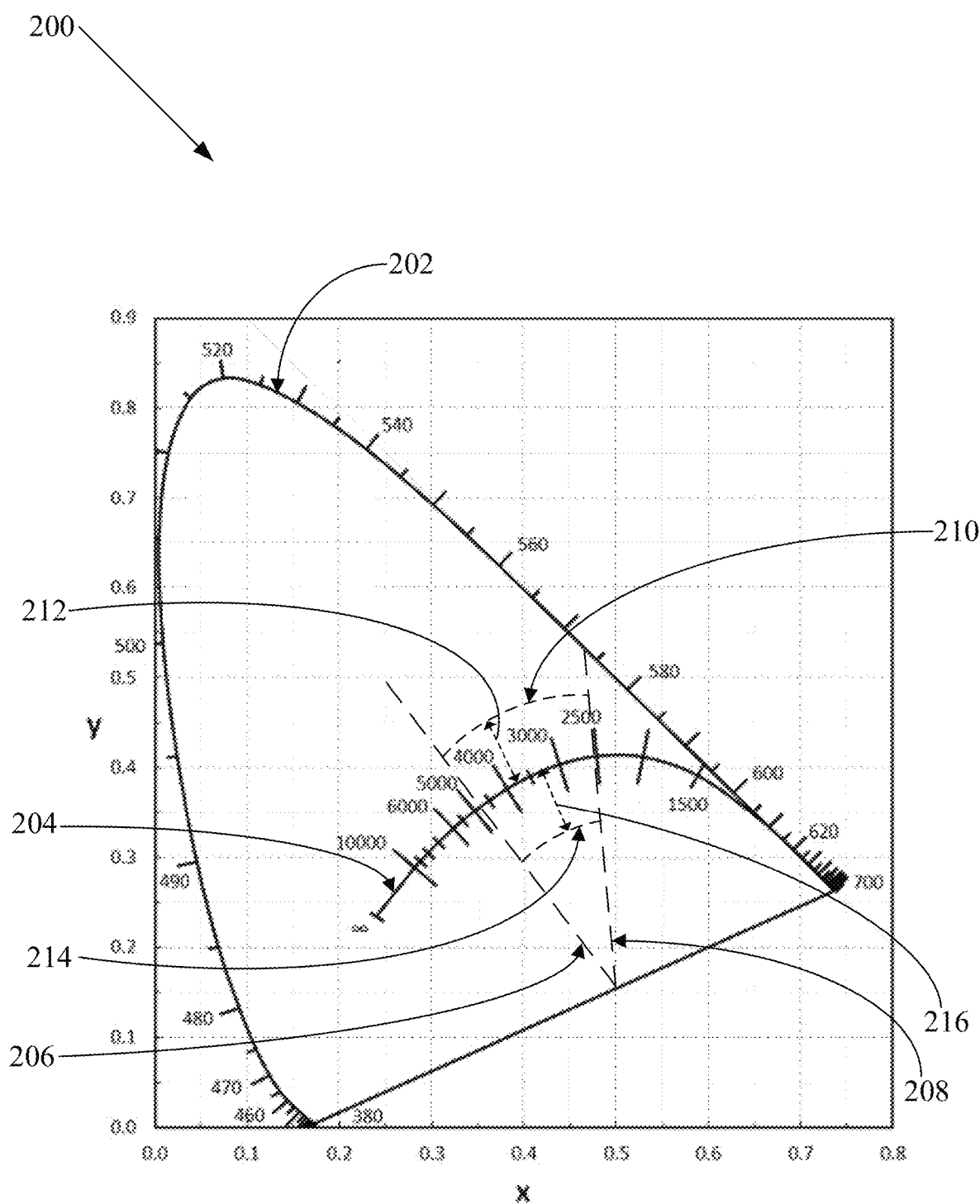
FIG. 2 is a graph of the International Commission on Illumination (CIE) 1931 XY chromaticity diagram.
Figure 3:
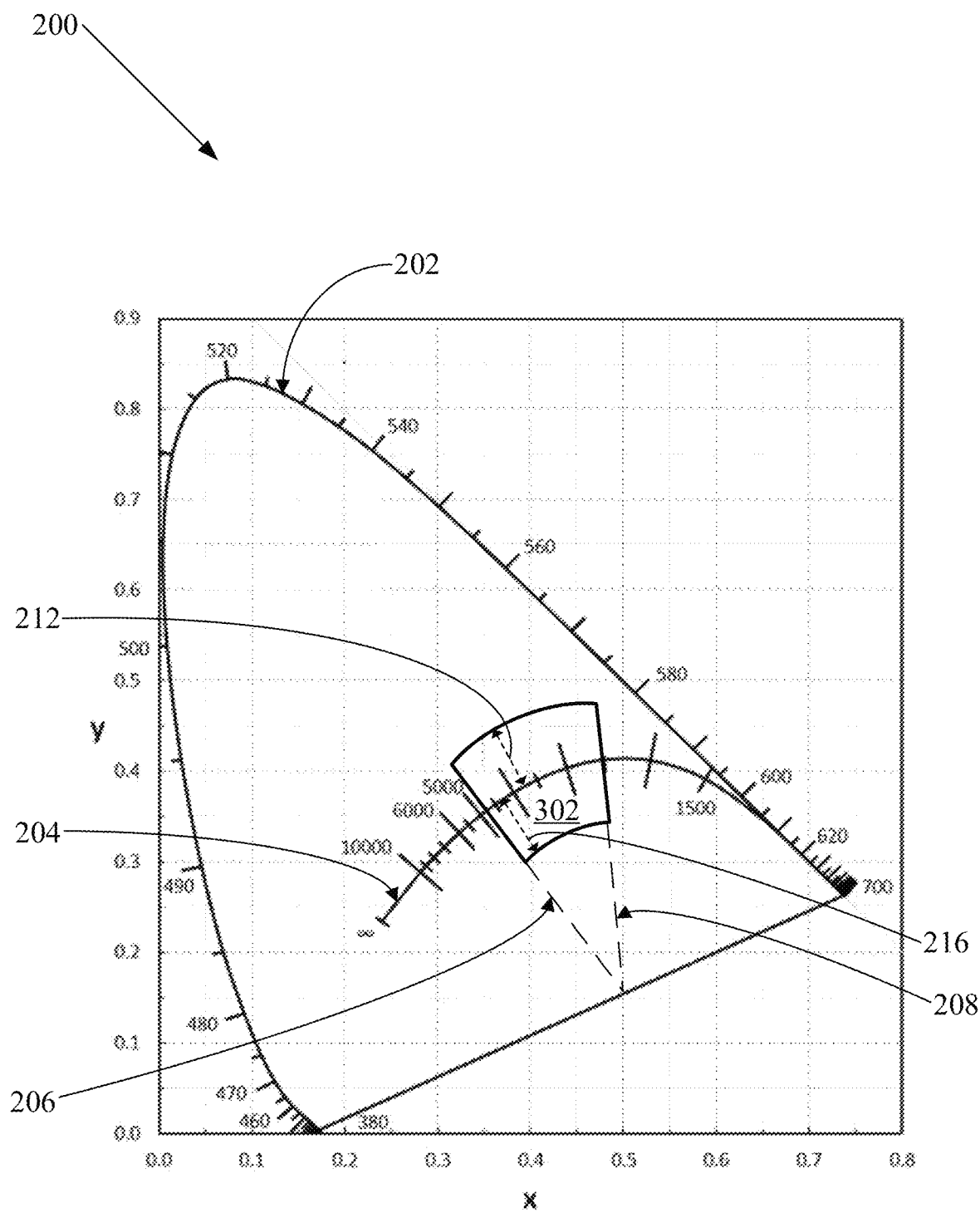
FIG. 3 is another graph of the CIE 1931 XY chromaticity diagram.

FIG. 2 is a graph of the International Commission on Illumination (CIE) 1931 XY chromaticity diagram [200]. As shown in FIG. 2, the CIE 1931 XY chromaticity diagram [200] has: a perimeter boundary [202]; and a Planckian—black-body locus [204]. Referring to FIGS. 1 and 2, the first light source [102] of the example [100] of the implementation of the lighting system is configured for emitting the first light source emissions represented by the arrow [114] as having a first color point, wherein the first color point is located between: an isotherm [206] of a correlated color temperature of about 4800K; and an isotherm [208] of a correlated color temperature of about 2500K. The first light source [102] of the example [100] of the implementation of the lighting system is further configured for emitting the first light source emissions represented by the arrow [114] as having the first color point being located within a distance of about equal to or less than 0.006 delta(uv) away from (i.e., above, or below, or on) the Planckian—black-body locus [204] of the CIE 1931 XY chromaticity diagram [200]. For example, FIG. 2 shows a curved line [210] being located at a distance represented by an arrow [212] of about 0.006 delta(uv) above the Planckian—black-body locus [204]. Further, for example, FIG. 2 shows a curved line [214] being located at a distance represented by an arrow [216] of about 0.006 delta(uv) below the Planckian—black-body locus [204]. FIG. 3 is another graph of the CIE 1931 XY chromaticity diagram [200]. As shown in FIG. 3, the first color point of the first light source [102] of the example [100] of the implementation of the lighting system may be located within a chromaticity bin [302] including a region of color points extending to a distance of about 0.006 delta(uv) away from (i.e., above, or below, or on) the Planckian—black-body locus [204] of the CIE 1931 XY chromaticity diagram [200]. As an example, the first light source [102] may be configured for emitting light having the first color point as being white.

Figure 4:
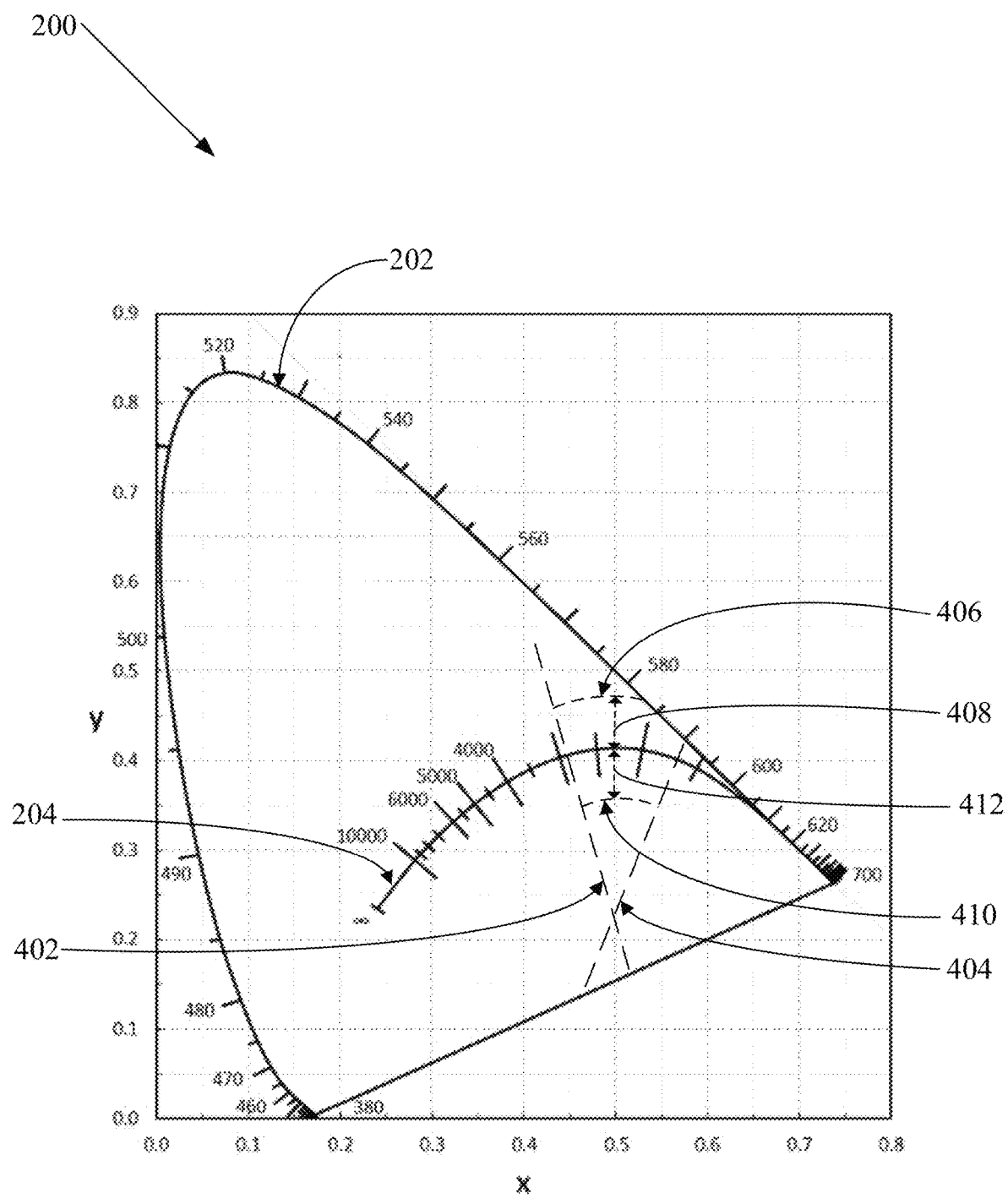
FIG. 4 is a further graph of the CIE 1931 XY chromaticity diagram.
Figure 5:
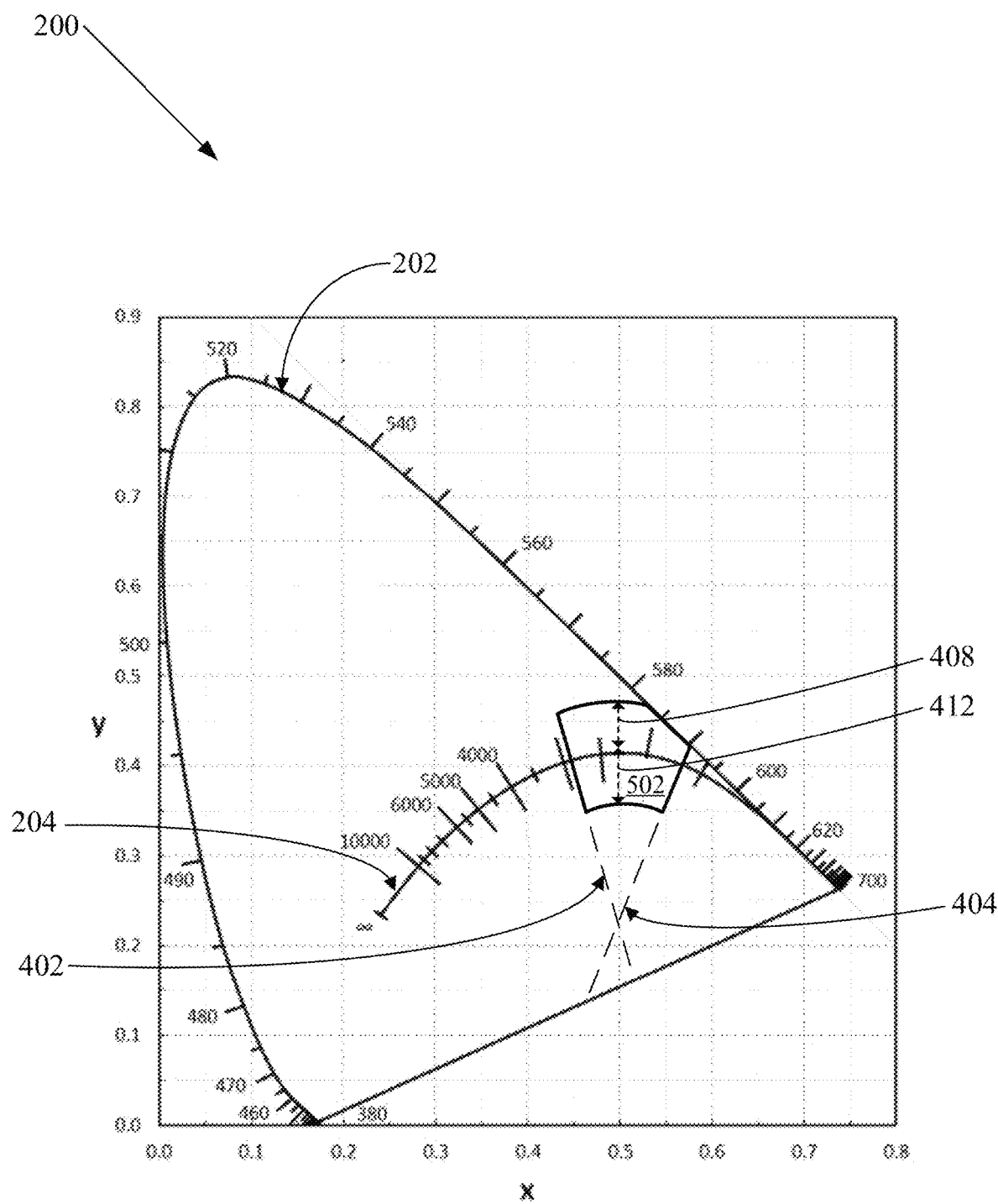
FIG. 5 is an additional graph of the CIE 1931 XY chromaticity diagram.

As shown in FIG. 1, the second light source [104] of the example [100] of the implementation of the lighting system includes a second semiconductor light-emitting device [116]. FIG. 4 is a further graph of the CIE 1931 XY chromaticity diagram [200]. Referring to FIGS. 1 and 4, the second light source [104] of the example [100] of the implementation of the lighting system is configured for emitting second light source emissions represented by an arrow [118] having a second color point, wherein the second color point is located between: an isotherm [402] of a correlated color temperature of about 2900K; and an isotherm [404] of a correlated color temperature of about 1700K. In examples, the second light source [104] of the example [100] of the implementation of the lighting system may be further configured for emitting the second light source emissions represented by the arrow [118] as having the second color point being located within a distance of about equal to or less than 0.006 delta(uv) away from (i.e., above, or below, or on) the Planckian—black-body locus [204] of the CIE 1931 XY chromaticity diagram [200]. For example, FIG. 4 shows a curved line [406] being located at a distance represented by an arrow [408] of about 0.006 delta(uv) above the Planckian—black-body locus [204]. Further, for example, FIG. 4 shows a curved line [410] being located at a distance represented by an arrow [412] of about 0.006 delta(uv) below the Planckian—black-body locus [204]. FIG. 5 is an additional graph of the CIE 1931 XY chromaticity diagram [200]. As shown in FIG. 5, the second color point of the second light source [104] of the example [100] of the implementation of the lighting system may be, for example, located within a chromaticity bin [502] including a region of color points extending to a distance of about 0.006 delta(uv) away from (i.e., above, or below, or on) the Planckian—black-body locus [204] of the CIE 1931 XY chromaticity diagram [200]. As an example, the second light source [104] may be configured for emitting light having the second color point as being white. In further examples, the second light source [104] may be configured for emitting light having second color point as being: yellow; amber; yellowish-orange; orange; reddish-orange; red; or deep red.

Figure 6:
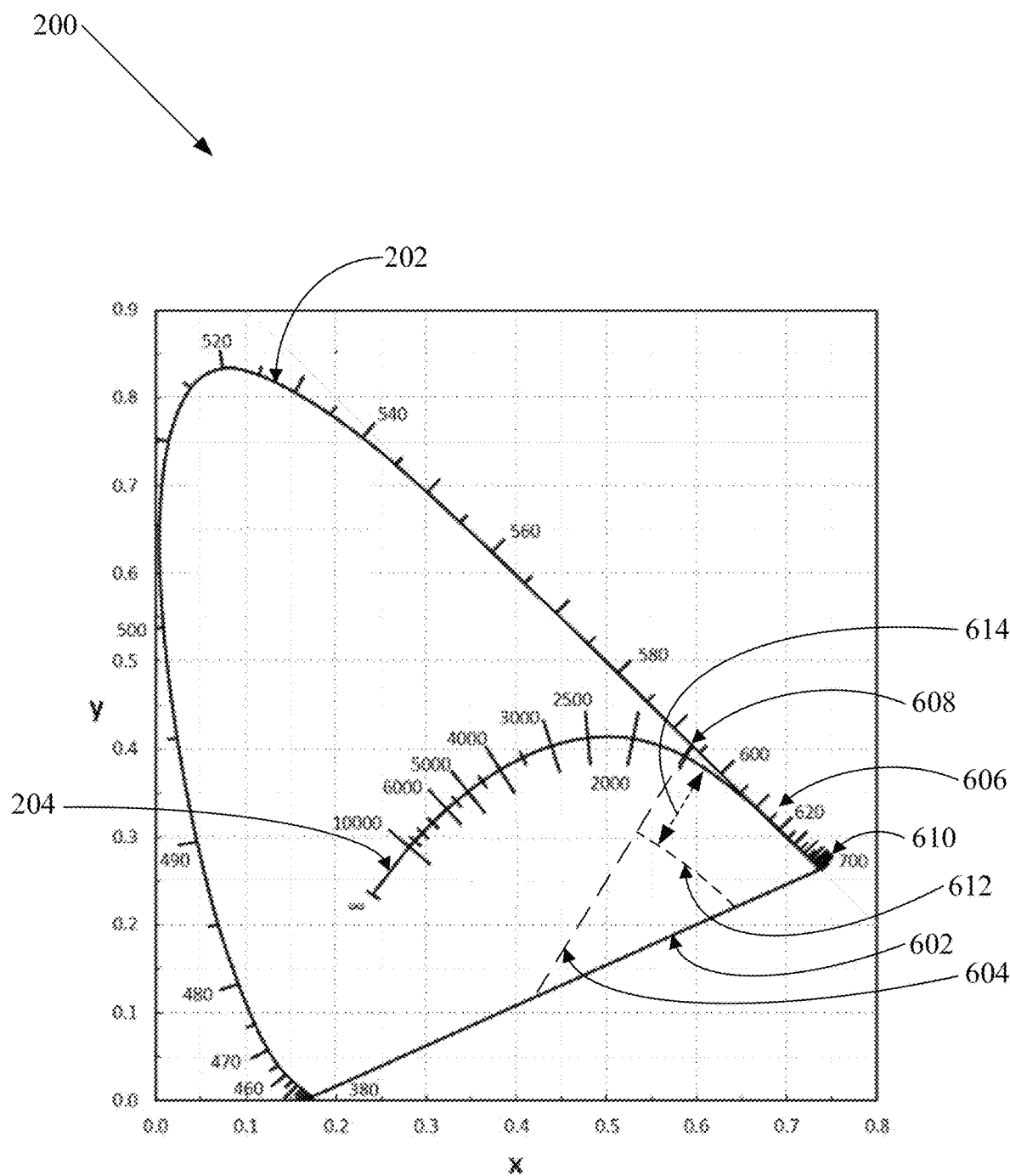
FIG. 6 is another graph of the CIE 1931 XY chromaticity diagram.
Figure 7:
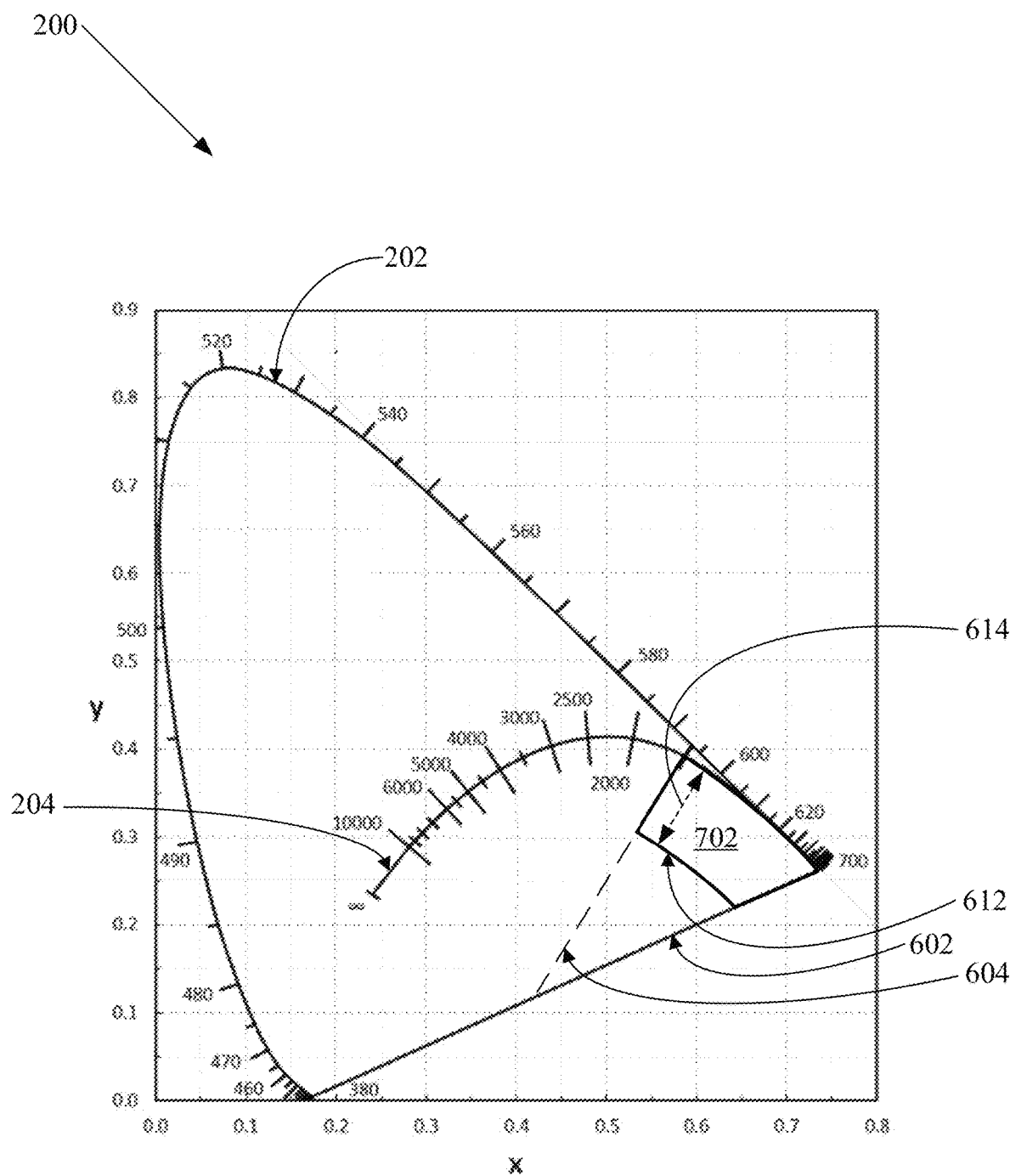
FIG. 7 is a further graph of the CIE 1931 XY chromaticity diagram.

As also shown in FIG. 1, the third light source [106] of the example [100] of the implementation of the lighting system includes a third semiconductor light-emitting device [120]. FIG. 6 is another graph of the CIE 1931 XY chromaticity diagram [200]. Referring to FIGS. 1 and 6, the third light source [106] of the example [100] of the implementation of the lighting system is configured for emitting third light source emissions represented by an arrow [122] having a third color point, wherein the third color point is located between: a line-of-purples [602] of the CIE 1931 XY chromaticity diagram [200]; and an isotherm [604] of a correlated color temperature of about 1500K. The third light source [106] of the example [100] of the implementation of the lighting system is further configured for emitting the third light source emissions represented by the arrow [122] as having a dominant- or peak-wavelength being within a range of between about 590 nanometers and about 700 nanometers. For example, FIG. 6 shows a portion [606] of the perimeter boundary [202] of the CIE 1931 XY chromaticity diagram [200] that extends across a range of wavelengths between a point being marked by an arrow [608] at a wavelength of about 590 nanometers and another point being marked by an arrow [610] at a wavelength of about 700 nanometers. Further, for example, FIG. 6 shows a curved line [612] being below and spaced apart from the Planckian—black-body locus [204] of the CIE 1931 XY chromaticity diagram [200] by a distance represented by an arrow [614], with the curved line [612] intersecting both the line-of-purples [602] and the isotherm [604] of the correlated color temperature of about 1500K. In an example, any color point being located between the line-of-purples [602] and the isotherm [604], and being no farther away from the perimeter boundary [202] than the distance [614] below the Planckian—black-body locus [204], will have a dominant- or peak-wavelength being within the range of wavelengths of between about 590 nanometers and about 700 nanometers. In another example, the distance represented by the arrow [614] may be about 0.025 delta(uv). FIG. 7 is a further graph of the CIE 1931 XY chromaticity diagram [200]. As shown in FIG. 7, the third color point of the third light source [106] of the example [100] of the implementation of the lighting system may be located within a chromaticity bin [702] including a region of color points being located between the line-of-purples [602] and the isotherm [604] and further bounded by the curved line [612] and the Planckian—black-body locus [204]. In further examples, the third light source [106] may be configured for emitting light having the third color point as being: yellow; amber; yellowish-orange; orange; reddish-orange; red; or deep red. In other examples, the example [100] of the implementation of the lighting system may include another light source (not shown) or a plurality of additional light sources (not shown), each of which may include another semiconductor light-emitting device. In additional examples of the example [100] of the implementation of the lighting system and referring to FIGS. 2 and 6, each one of the light sources of the lighting system may have a color point being located between the line-of-purples [602] and the isotherm [206] of a correlated color temperature of about 4800K.

As further shown in FIG. 1, the example [100] of the implementation of the lighting system is also configured for forming combined light emissions represented by a dashed ellipse [124] having combined color points, wherein the combined light emissions represented by the dashed ellipse [124] include the first light source emissions represented by the arrow [114] from the first light source [102], and the second light source emissions represented by the arrow [118] from the second light source [104], and the third light source emissions represented by the arrow [122] from the third light source [106].

Figure 8:
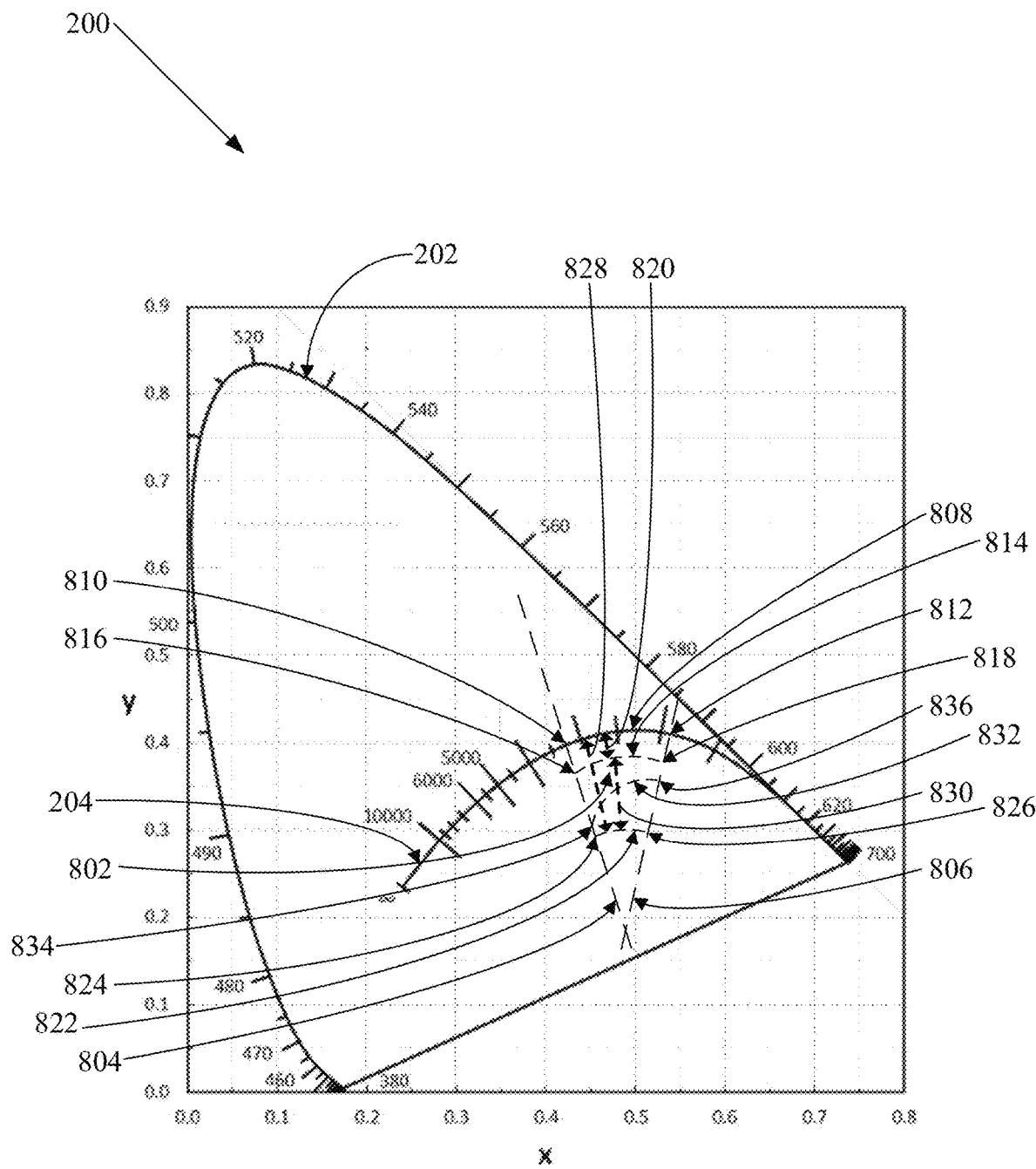
FIG. 8 is an additional graph of the CIE 1931 XY chromaticity diagram.

FIG. 8 is an additional graph of the CIE 1931 XY chromaticity diagram [200]. FIG. 8 illustrates a chromaticity bin [802] of combined color points of the combined light emissions represented by the dashed ellipse [124]. The chromaticity bin [802] including a region of color points extending between: an isotherm [804] of a correlated color temperature of about 3200K; and an isotherm [806] of a correlated color temperature of about 1800K. FIG. 8 further shows a curved line [808] extending along a portion of the Planckian—black-body locus [204], having an endpoint [810] intersecting with the isotherm [804] and having another endpoint [812] intersecting with the isotherm [806]. The curved line [808] represents a light brightening/dimming curve of correlated color temperatures between about 3200K and about 1800K. The endpoint [810] represents an example of a brightened terminus of the light brightening/dimming curve [808]; and the endpoint [812] represents an example of a dimmed terminus of the light brightening/dimming curve [808].

FIG. 8 also shows a curved line [814] having an endpoint [816] intersecting with the isotherm [804] and having another endpoint [818] intersecting with the isotherm [806], the curved line [814] also being below and parallel to the curved line [808] and spaced apart from the Planckian—black-body locus [204] by a distance of about 0.001 delta (uv) as represented by an arrow [820]. The curved line [814] represents another light brightening/dimming curve of correlated color temperatures between about 3200K and about 1800K. The endpoint [816] represents an example of a brightened terminus of the light brightening/dimming curve [814]; and the endpoint [818] represents an example of a dimmed terminus of the light brightening/dimming curve [814]. FIG. 8 further shows a curved line [822] having an endpoint [824] intersecting with the isotherm [804] and having another endpoint [826] intersecting with the isotherm [806], and being below and parallel to the curved line [808] and spaced apart from the Planckian—black-body locus [204] by a distance of about 0.009 delta(uv) as represented by an arrow [828]. The curved line [822] represents a further light brightening/dimming curve of correlated color temperatures between about 3200K and about 1800K. The endpoint [824] represents an example of a brightened terminus of the light brightening/dimming curve [822]; and the endpoint [826] represents an example of a dimmed terminus of the light brightening/dimming curve [822].

In an example as shown in FIG. 8, the combined color points of the combined light emissions represented by the dashed ellipse [124] may be located within the chromaticity bin [802] including a region of color points that: extends between the endpoints [816], [824] each intersecting with the isotherm [804], and the endpoints [818], [826] each intersecting with the isotherm [806]; and that is located below the portion [808] of the Planckian—black-body locus [204] by a distance represented by an arrow [830] being within a range of between about 0.001 delta(uv) and about 0.009 delta(uv). The example [100] of the implementation of the lighting system is configured for causing the combined color points of the combined light emissions represented by the dashed ellipse [124] to remain below the Planckian—black-body locus [204] by a distance [830] being within a range of between about 0.001 delta(uv) and about 0.009 delta(uv) throughout the light brightening/dimming curves [814], [822] having a brightened terminus with a CCT of about 3200K and a dimmed terminus with a CCT of about 1800K.

In further examples, a different light brightening/dimming curve of correlated color temperatures may be selected that includes a brightened terminus having a CCT other than about 3200K and that includes a dimmed terminus having a CCT other than about 1800K. As examples (not shown), the brightening/dimming curve of correlated color temperatures of between about 3200K and about 1800K may be replaced by a brightening/dimming curve: including a brightened terminus having a CCT being within a range of between about 3400K and about 2700K; and including a dimmed terminus having a CCT being within a range of between about 2200K and about 1700K. For example, the example [100] of the implementation of the lighting system may be configured for causing the combined color points of the combined light emissions represented by the dashed ellipse [124] to emulate color points of an incandescent light emitter throughout the light brightening/dimming curve [814], [822]. Further, for example, the example [100] of the implementation of the lighting system may be configured for causing the combined light emissions represented by the dashed ellipse [124] to have a substantially constant combined color point throughout the light brightening/dimming curve [814], [822].

In another example, this example [100] of the implementation of the lighting system may be configured for causing the distance [830] of the combined color points of the combined light emissions represented by the dashed ellipse [124] below the Planckian—black-body locus [204] to have a maximum variance of about equal to or less than 0.002 delta(uv) throughout the light brightening/dimming curve [814], [822]. This example [100] of a lighting system may further be configured for traversing the light brightening/dimming curve [814], [822] of CCTs of, for example, between about 3200K and about 1800K, within a selected time period, as examples, being: within a range of between about 5 seconds and about 12 hours; or within a range of between about 5 seconds and about 1 minute; or within a range of between about 5 seconds and about 1 hour. In addition, this example [100] of the implementation of the lighting system may be configured for causing the combined color points of the combined light emissions represented by the dashed ellipse [124] to have a color rendition index (CRI-Ra including $R_1$ through $R_{15}$; or CRI-Ra including $R_1$ through $R_8$) throughout the light brightening/dimming curve [814], [822] being about equal to or greater than: 75; or 80; or 90. Further, this example [100] of the implementation of the lighting system may be configured for causing the combined color points of the combined light emissions represented by the dashed ellipse [124] to have a color rendition index (CRI-$R_9$) throughout the light brightening/dimming curve [814], [822] being about equal to or greater than 80.

As additionally shown in FIG. 1, the first light source [102], the second light source [104], and the third light source [106] of the example [100] of the implementation of the lighting system may, for example, respectively include a reflective element [126], a reflective element [128], and a reflective element [130]. As further shown in FIG. 1, the first light source [102], the second light source [104], and the third light source [106] of the example [100] of the implementation of the lighting system may, for example, respectively include a lens element [132], a lens element [134], and a lens element [136]. For example, the reflective elements [126], [128], and [130] and/or the lens elements [132], [134], and [136], may respectively be configured for causing the forming of the combined light emissions represented by the dashed ellipse [124] as including the first light source emissions represented by the arrow [114] from the first light source [102], and the second light source emissions represented by the arrow [118] from the second light source [104], and the third light source emissions represented by the arrow [122] from the third light source [106]. As further examples, the reflective elements [126], [128], and [130] and/or the lens elements [132], [134], and [136] may respectively be so shaped, or may be so relatively positioned, for so causing the forming of the combined light emissions represented by the dashed ellipse [124]. As examples, the reflective elements [126], [128], and [130] and/or the lens elements [132], [134], and [136] may respectively be shaped or positioned for causing the first light source emissions represented by the arrow [114] and the second light source emissions represented by the arrow [118] and the third light source emissions represented by the arrow [122] to intersect at a focal point [138]. As another example, the reflective elements [126], [128], and [130] may be replaced by a unitary reflective element (not shown) for the first light source [102], and the second light source [104], and the third light source [106]. As an additional example, the lens elements [132], [134], and [136] may be replaced by a unitary lens element (not shown) for the first light source [102], and the second light source [104], and the third light source [106]. In a further example, the example [100] of the implementation of the lighting system may be configured for causing the combined light emissions represented by the dashed ellipse [124] to perceptually form an unbroken line. Additional background information regarding reflective elements and lens elements configured for forming combined light emissions that include the light emissions from multiple semiconductor light-emitting devices is provided in the following references, the entireties of which hereby are incorporated herein by reference: U.S. Pat. Nos. 8,840,278; 8,777,455; 8,757,840; 8,684,569; 8,684,556; 8,573,816; 8,556,469; and 8,529,102.

As further shown in FIG. 1, the first light source [102], the second light source [104], and the third light source [106] of the example [100] of the implementation of the lighting system may, for example, be located in a housing [140]. As an example, the first semiconductor light-emitting device [108], and the second semiconductor light-emitting device [116], and the third semiconductor light-emitting device [120] may each be located inside the housing [140] by a distance represented by an arrow [142]. In that example, the example [100] of the implementation of the lighting system may be configured for causing the first light source emissions represented by the arrow [114] and the second light source emissions represented by the arrow [118] and the third light source emissions represented by the arrow [122] to exit from the housing [140] at the distance represented by the arrow [142] away from the semiconductor light-emitting devices [108], [116], [120]. As examples, the distance represented by the arrow [142] may be about equal to or less than: 13 millimeters; or 15 millimeters; or 20 millimeters.

In additional examples as shown in FIG. 1, the example [100] of the implementation of the lighting system may include a drive unit [144] configured for supplying electrical drive current to each of the semiconductor light-emitting devices [108], [116], [120]. For example, the drive unit [144] may have conductors [146], [148], [150] for supplying the electrical drive current, respectively being independently electrically connected with the semiconductor light-emitting devices [108], [116], [120].

As further examples of the example [100] of the implementation of the lighting system: the first light source [102] may be configured for emitting the first light source emissions represented by the arrow [114] as having a first luminous flux; and the second light source [104] may be configured for emitting the second light source emissions represented by the arrow [118] as having a second luminous flux; and the third light source [106] may be configured for emitting the third light source emissions represented by the arrow [122] as having a third luminous flux. In additional examples as shown in FIG. 1, the example [100] of the implementation of the lighting system may include a control unit [152] being configured for controlling: the first luminous flux of the first light source emissions represented by the arrow [114]; and the second luminous flux of the second light source emissions represented by the arrow [118]; and the third luminous flux of the third light source emissions represented by the arrow [122]. As an example, the control unit [152] may include a microprocessor. For example, the control unit [152] may be in signal communication with the drive unit [144] as indicated by an arrow [154]. Further, for example, the control unit [152] may be configured for controlling the first luminous flux, the second luminous flux, and the third luminous flux by controlling a power distribution of the electrical drive current supplied by the drive unit [144] respectively to the semiconductor light-emitting devices [108], [116], [120].

In further examples of the example [100] of the implementation of the lighting system, the control unit [152] may be configured for controlling a combined luminous flux of the combined light emissions, where the combined luminous flux includes: the first luminous flux; the second luminous flux; and the third luminous flux. For example, the control unit [152] may be configured for controlling the combined luminous flux by controlling the power distribution of the electrical drive current supplied by the drive unit [144] respectively to the semiconductor light-emitting devices [108], [116], [120]. As examples, the controlling of the first luminous flux, the second luminous flux, and the third luminous flux by the control unit [152] may cause the combined color points of the combined light emissions represented by the dashed ellipse [124] to remain below the Planckian—black-body locus [204] by the distance [830] being within a range of between about 0.001 delta(uv) and about 0.009 delta(uv) throughout a light brightening/dimming curve such as the light brightening/dimming curves [814], [822], or another selected light brightening/dimming curve. As a further example, the example [100] of a lighting system may be configured for causing the combined color points of the combined light emissions represented by the dashed ellipse [124] to have a progressively increased combined luminous flux along the light brightening/dimming curve [814], [822] from a correlated color temperature of, for example, about 3200K to a correlated color temperature of, for example, about 1800K. As another example, the control unit [152] may be configured for controlling the power distribution of the electrical drive current supplied by the drive unit [144] respectively to the semiconductor light-emitting devices [108], [116], [120] by utilizing duty cycle modulation, such as electrical pulse width modulation or electrical current modulation. Further, for example, the example [100] of the implementation of the lighting system may include a user-interface (not shown) being configured for operating the control unit [152].

As further shown in FIG. 1, the example [100] of the implementation of the lighting system may, for example, include a sensor [156] being configured for detecting: the first luminous flux of the first light source emissions represented by the arrow [114]; and the second luminous flux of the second light source emissions represented by the arrow [118]; and the third luminous flux of the third light source emissions represented by the arrow [122]. As another example, the example [100] of the implementation of the lighting system may include the control unit [152] as: being in signal communication with the sensor [156] as represented by an arrow [158]; and being configured for utilizing the detected first luminous flux, second luminous flux, and third luminous flux in controlling the power distribution of the electrical drive current supplied by the drive unit [144] respectively to the semiconductor light-emitting devices [108], [116], [120]. Further, for example, the sensor [156] may be configured for detecting the combined luminous flux of the combined light emissions represented by the dashed ellipse [124]. As another example, the example [100] of the implementation of the lighting system may include the control unit [152] as: being in signal communication with the sensor [156] as represented by the arrow [158]; and being configured for utilizing the detected combined luminous flux in controlling the power distribution of the electrical drive current supplied by the drive unit [144] respectively to the semiconductor light-emitting devices [108], [116], [120].

As additionally shown in FIG. 1, the example [100] of the implementation of the lighting system may, for example, include a database [160] including look-up tables of sets of respective luminous flux values for the first luminous flux, the second luminous flux, and the third luminous flux, for controlling the first light source [102], the second light source [104] and the third light source [106] along a light brightening/dimming curve. In further examples of the example [100] of the implementation of the lighting system, the control unit [152] may be configured for controlling the power distribution of the electrical drive current supplied by the drive unit [144] respectively to the semiconductor light-emitting devices [108], [116], [120] by comparing the first luminous flux, the second luminous flux, and the third luminous flux as detected by the sensor [156] with the database [160] of look-up tables of sets of luminous flux values respectively for the first luminous flux, the second luminous flux, and the third luminous flux. For example, the control unit [152] may be configured for controlling the power distribution of the electrical drive current supplied by the drive unit [144] respectively to the semiconductor light-emitting devices [108], [116], [120] to minimize any variances between the first luminous flux, second luminous flux, and third luminous flux as detected by the sensor [156] as compared with the database [160] of look-up tables of respective luminous flux values for the first luminous flux, the second luminous flux, and the third luminous flux. In a further example [100] of the implementation of the lighting system and referring to FIGS. 1, 3, 5, 7 and 8, the database [160] may have: a set of empirically-detected luminous flux values for the first luminous flux causing the first light source [102] to generate light emissions have corresponding color points within the chromaticity bin [302]; and another set of empirically-detected luminous flux values for the second luminous flux causing the second light source [104] to generate light emissions having corresponding color points within the chromaticity bin [502]; and an additional set of empirically-detected luminous flux values for the third luminous flux causing the third light source [106] to generate light emissions having corresponding color points within the chromaticity bin [702]. In that further example, the three sets of look-up tables of empirically-detected luminous flux values for the first-, second-, and third-luminous flux may then collectively control the semiconductor light-emitting devices [108], [116], [120] to form combined light emissions having combined color points being within the chromaticity bin [802], and extending along, e.g. periodically along, a curve [814], [822] extending between and reaching the isotherms [804] and [806]. Further, for example, this example [100] of the implementation of the lighting system may be configured for user-controlled selections along the light brightening/dimming curve of: combined color points; or combined luminous fluxes of combined color points.

In an example of operation and referring to FIGS. 1 and 8, a user may cause the example [100] of the implementation of the lighting system to form combined light emissions represented by the dashed ellipse [124] having combined color points, wherein the combined light emissions include the first light source emissions represented by the arrow [114] from the first light source [102], and the second light source emissions represented by the arrow [118] from the second light source [104], and the third light source emissions represented by the arrow [122] from the third light source [106]. In this example of operation, the example [100] of the implementation of the lighting system may be effective for causing the combined color points of the combined light emissions represented by the dashed ellipse [124] to remain below the Planckian—black-body locus [204] by the distance [830] being within a range of between about 0.001 delta(uv) and about 0.009 delta(uv) throughout a light brightening/dimming curve [814], [822] of correlated color temperatures, for example, between about 3200K and about 1800K. As examples, each of the respective endpoints [816], [824] may represent an example of a brightened terminus of a light brightening/dimming curve; and each of the endpoints [818], [826] may represent an example of a dimmed terminus of a light brightening/dimming curve. Accordingly, the user may cause the example [100] of the implementation of the lighting system to form combined light emissions represented by the dashed ellipse [124] having a series of combined color points beginning at a brightened terminus endpoint [816], [824] and ending at a dimmed terminus endpoint [818], [826]. The user may also cause the example [100] of the implementation of the lighting system to form combined light emissions represented by the dashed ellipse [124] having a series of combined color points beginning at a dimmed terminus endpoint [818], [826] and ending at a brightened terminus endpoint [816], [824]. As an additional example, FIG. 8 further shows a curved line [832] located within the chromaticity bin [802], having an endpoint [834] intersecting with the isotherm [804] and having another endpoint [836] intersecting with the isotherm [806]. The curved line [832], which is not parallel to the curved line [808] being a portion of the Planckian—black-body locus [204], represents an additional light brightening/dimming curve of correlated color temperatures between about 3200K and about 1800K. The endpoint [834] represents an example of a brightened terminus of the light brightening/dimming curve [832]; and the endpoint [836] represents an example of a dimmed terminus of the light brightening/dimming curve [832].

Figure 9:
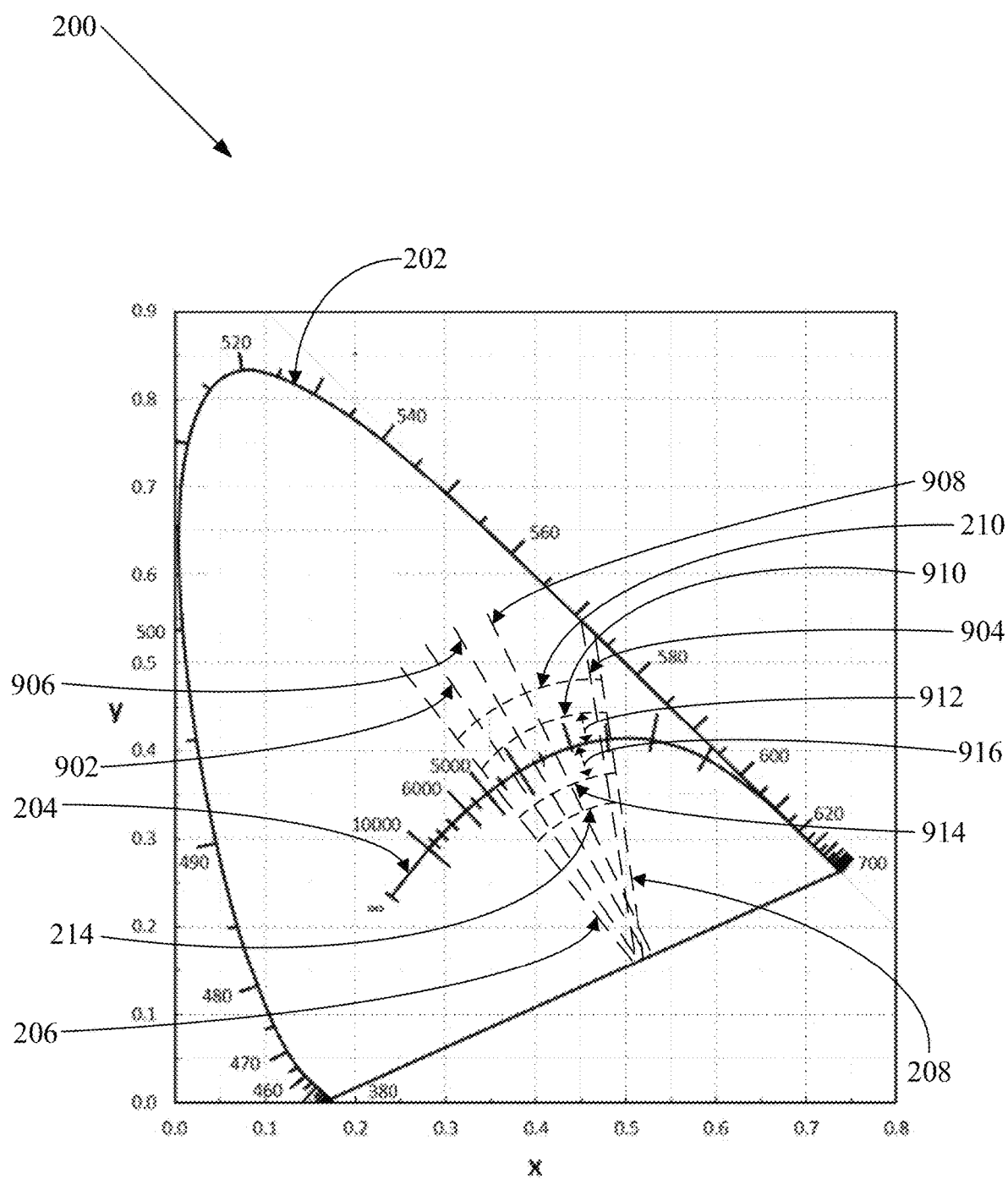
FIG. 9 is another graph of the CIE 1931 XY chromaticity diagram.

FIG. 9 is another graph of the CIE 1931 XY chromaticity diagram. Referring to FIGS. 1 and 9, the first light source [102] of the example [100] of the implementation of the lighting system may be configured, as another example, for emitting the first light source emissions represented by the arrow [114] as having the first color point being located between: an isotherm [902] of a correlated color temperature of about 4200K; and an isotherm [904] of a correlated color temperature of about 2600K. Further, for example, the first light source [102] of the example [100] of the implementation of the lighting system may be configured for emitting the first light source emissions represented by the arrow [114] as having the first color point being located between: an isotherm [906] of a correlated color temperature of about 3600K; and an isotherm [908] of a correlated color temperature of about 3400K. As earlier discussed with reference to FIG. 3, the first color point of the first light source [102] of the example [100] of the implementation of the lighting system may be located within a chromaticity bin [302] including a region of color points extending to a distance of about 0.006 delta(uv) away from (i.e., above, or below, or on) the Planckian—black-body locus [204] of the CIE 1931 XY chromaticity diagram [200]. Referring to FIG. 9, the first color point accordingly may, as examples, have a correlated color temperature being: within a range of between about 4800K and about 2500K; or being within a range of between about 4200K and about 2600K; or being within a range of between about 3600K and about 3400K. FIG. 9 additionally shows a curved line [910] being located at a distance represented by an arrow [912] of about 0.003 delta(uv) above the Planckian—black-body locus [204]; and a curved line [914] being located at a distance represented by an arrow [916] of about 0.003 delta(uv) below the Planckian—black-body locus [204]. Accordingly, for example, the first light source [102] of the example [100] of the implementation of the lighting system may be configured for emitting the first light source emissions represented by the arrow [114] as having the first color point being located within a distance, as represented by the curved lines [910], [914], of about equal to or less than 0.003 delta(uv) away from (i.e., above, or below, or on) the Planckian—black-body locus [204] of the CIE 1931 XY chromaticity diagram [200]. As an additional example referring generally to FIG. 9, the first color point: may have a correlated color temperature being within a range of between about 3615K and about 3315K; and may be located within a distance of about equal to or less than 0.003 delta(uv) away from the Planckian—black-body locus [204].

Figure 10:
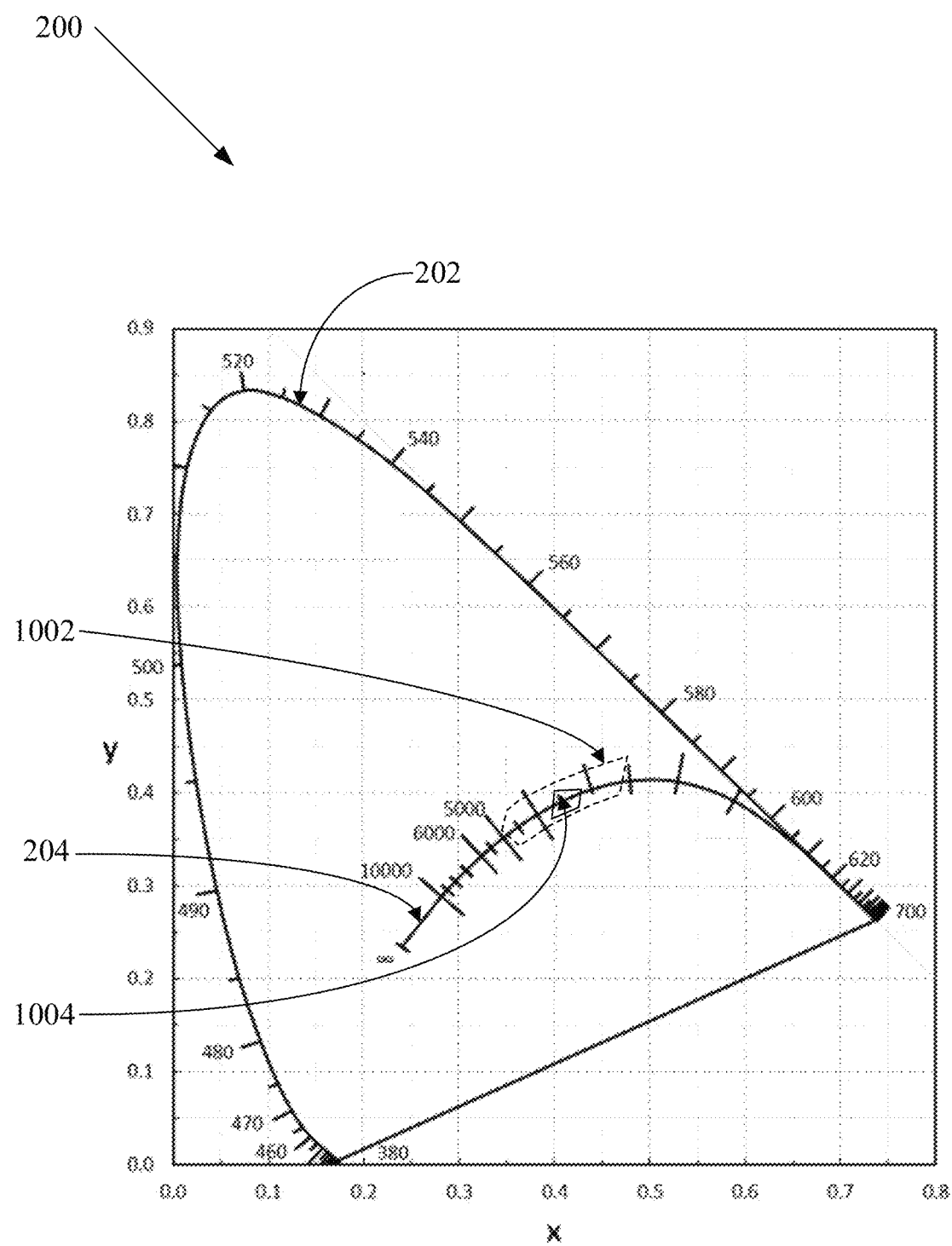
FIG. 10 is a further graph of the CIE 1931 XY chromaticity diagram.

FIG. 10 is a further graph of the CIE 1931 XY chromaticity diagram. Referring to FIGS. 1 and 10, the first light source [102] of the example [100] of the implementation of the lighting system may be configured, as another example, for emitting the first light source emissions represented by the arrow [114] as having the first color point being located within a boundary [1002] defined by lines connecting together the following series of (x,y) coordinate pairs of color points of the CIE 1931 XY chromaticity diagram: (0.4813, 0.4319); (0.4562, 0.4260); (0.4299, 0.4165); (0.4006, 0.4044); (0.3736, 0.3874); (0.3548, 0.3736); (0.3512, 0.3465); (0.3670, 0.3578); (0.3889, 0.3690); (0.4147, 0.3814); (0.4373, 0.3893); (0.4593, 0.3944); and (0.4813, 0.4319). As a further example, the first light source [102] of the example [100] of the implementation of the lighting system may be configured for emitting the first light source emissions represented by the arrow [114] as having the first color point being located within a boundary [1004] defined by lines connecting together the following series of (x,y) coordinate pairs of color points of the CIE 1931 XY chromaticity diagram: (0.402091, 0.395912); (0.396327, 0.379416); (0.412729, 0.387371); (0.419887, 0.404681); and (0.402091, 0.395912).

Figure 11:
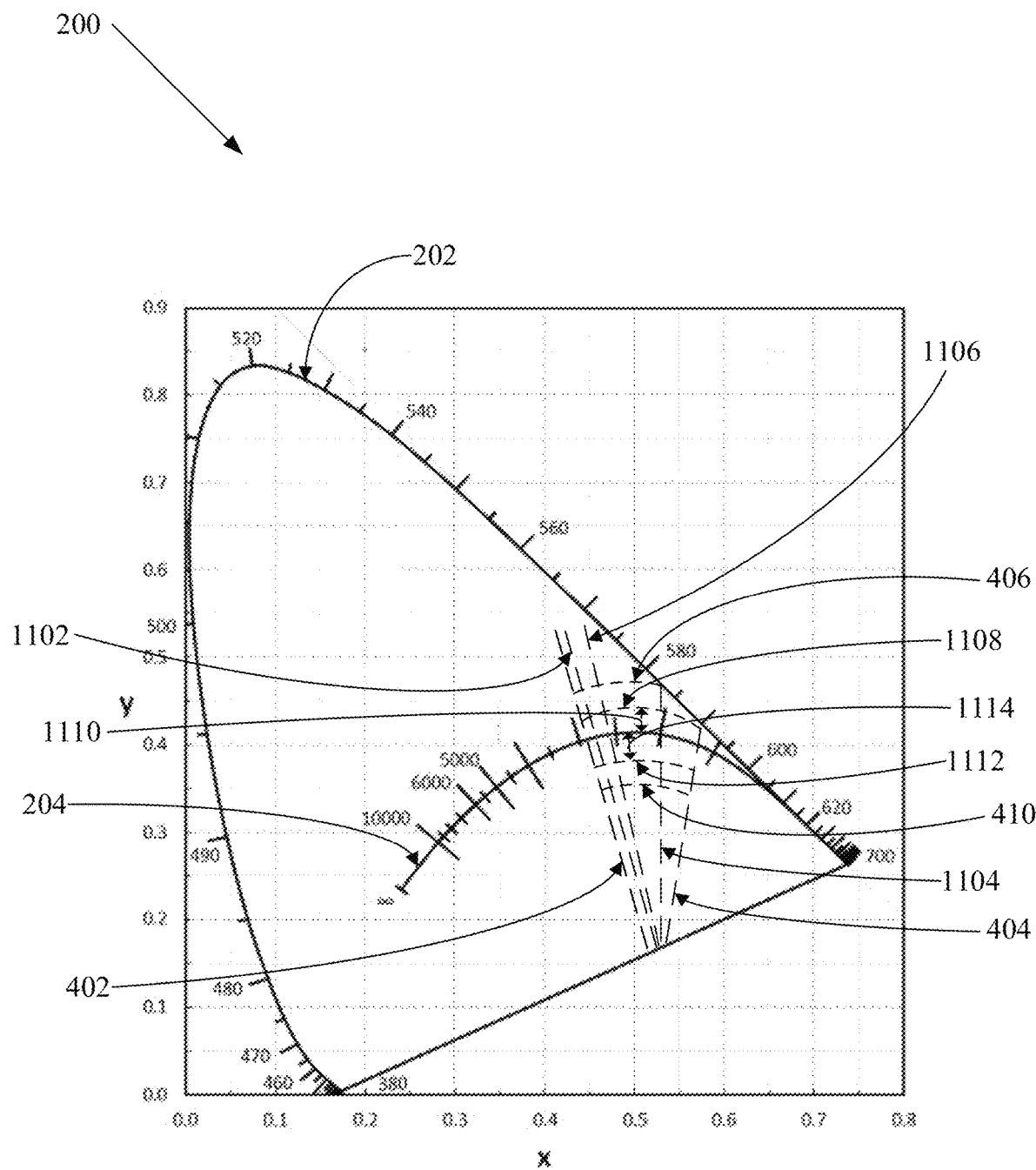
FIG. 11 is an additional graph of the CIE 1931 XY chromaticity diagram.

FIG. 11 is an additional graph of the CIE 1931 XY chromaticity diagram. Referring to FIGS. 1 and 11, the second light source [104] of the example [100] of the implementation of the lighting system may be configured, as another example, for emitting the second light source emissions represented by the arrow [118] as having the second color point being located between: an isotherm [1102] of a correlated color temperature of about 2800K; and an isotherm [1104] of a correlated color temperature of about 2100K. Further, for example, the second light source [104] of the example [100] of the implementation of the lighting system may be configured for emitting the second light source emissions represented by the arrow [118] as having the second color point being located between: the isotherm [1102] of a correlated color temperature of about 2800K; and an isotherm [1106] of a correlated color temperature of about 2600K. As earlier discussed with reference to FIG. 5, the second color point of the second light source [104] of the example [100] of the implementation of the lighting system may, for example, be located within a chromaticity bin [502] including a region of color points extending to a distance of about 0.006 delta(uv) away from (i.e., above, or below, or on) the Planckian—black-body locus [204] of the CIE 1931 XY chromaticity diagram [200]. Referring to FIG. 11, the second color point accordingly may, as examples, have a correlated color temperature being: within a range of between about 2900K and about 1700K; or being within a range of between about 2800K and about 2100K; or being within a range of between about 2800K and about 2600K. FIG. 11 additionally shows a curved line [1108] being located at a distance represented by an arrow [1110] of about 0.003 delta(uv) above the Planckian—black-body locus [204]; and a curved line [1112] being located at a distance represented by an arrow [1114] of about 0.003 delta(uv) below the Planckian—black-body locus [204]. Accordingly, for example, the second light source [104] of the example

[100] of the implementation of the lighting system may be configured for emitting the second light source emissions represented by the arrow [118] as having the second color point being located within a distance, as represented by the curved lines [1108], [1112], of about equal to or less than 0.003 delta(uv) away from (i.e., above, or below, or on) the Planckian—black-body locus [204] of the CIE 1931 XY chromaticity diagram [200]. As an additional example referring generally to FIG. 11, the second color point: may have a correlated color temperature being within a range of between about 2845K and about 2645K; and may be located within a distance of about equal to or less than 0.003 delta(uv) away from the Planckian—black-body locus [204].

Figure 12:
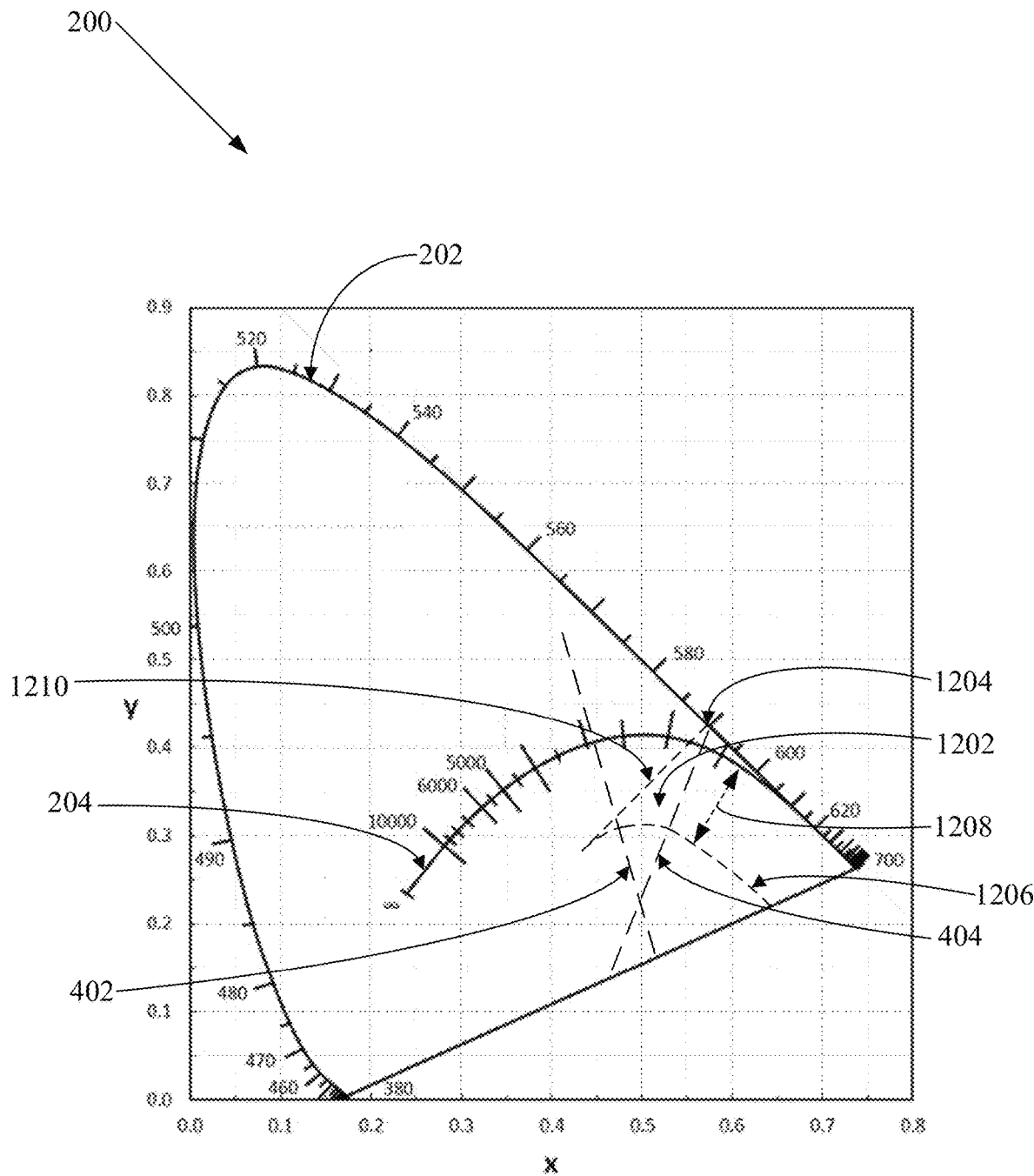
FIG. 12 is another graph of the CIE 1931 XY chromaticity diagram.

FIG. 12 is a further graph of the CIE 1931 XY chromaticity diagram [200]. Referring to FIGS. 1 and 12, the second light source [104] of the example [100] of the implementation of the lighting system may be configured, as another example, for emitting the second light source emissions represented by an arrow [118] as having the second color point being located between the isotherm [402] of a correlated color temperature of about 2900K and the isotherm [404] of a correlated color temperature of about 1700K; and as having a dominant- or peak-wavelength being: within a range of wavelengths of between about 590 nanometers and about 600 nanometers; or within a range of wavelengths of between about 590 nanometers and about 597 nanometers. For example, FIG. 12 shows a region [1202] of the CIE 1931 XY chromaticity diagram [200] that is spaced apart below a point being marked by an arrow [1204] along the perimeter boundary [202] at a wavelength of about 590 nanometers. The region [1202], for example, may be bound on one side by the Planckian—black-body locus [204]. Further, for example, the region [1202] may be bound: on another side by the isotherm [402] of a correlated color temperature of about 2900K; and on an additional side by the isotherm [404] of a correlated color temperature of about 1700K. Further, for example, the region [1202] may be bound on another side by a curved line [1206] being below and spaced apart from the Planckian—black-body locus [204] by a distance represented by an arrow [1208]. Also, for example, the region [1202] may be bound by a line [1210] extending away from the point [1204] and representing a color point wavelength of about 590 nanometers. In an example, any color point being located within the region [1202] may have a dominant- or peak-wavelength being: within a range of wavelengths of between about 590 nanometers and about 600 nanometers; or within a range of wavelengths of between about 590 nanometers and about 597 nanometers. In another example, the distance represented by the arrow [1208] may be about 0.025 delta(uv).

Figure 13:
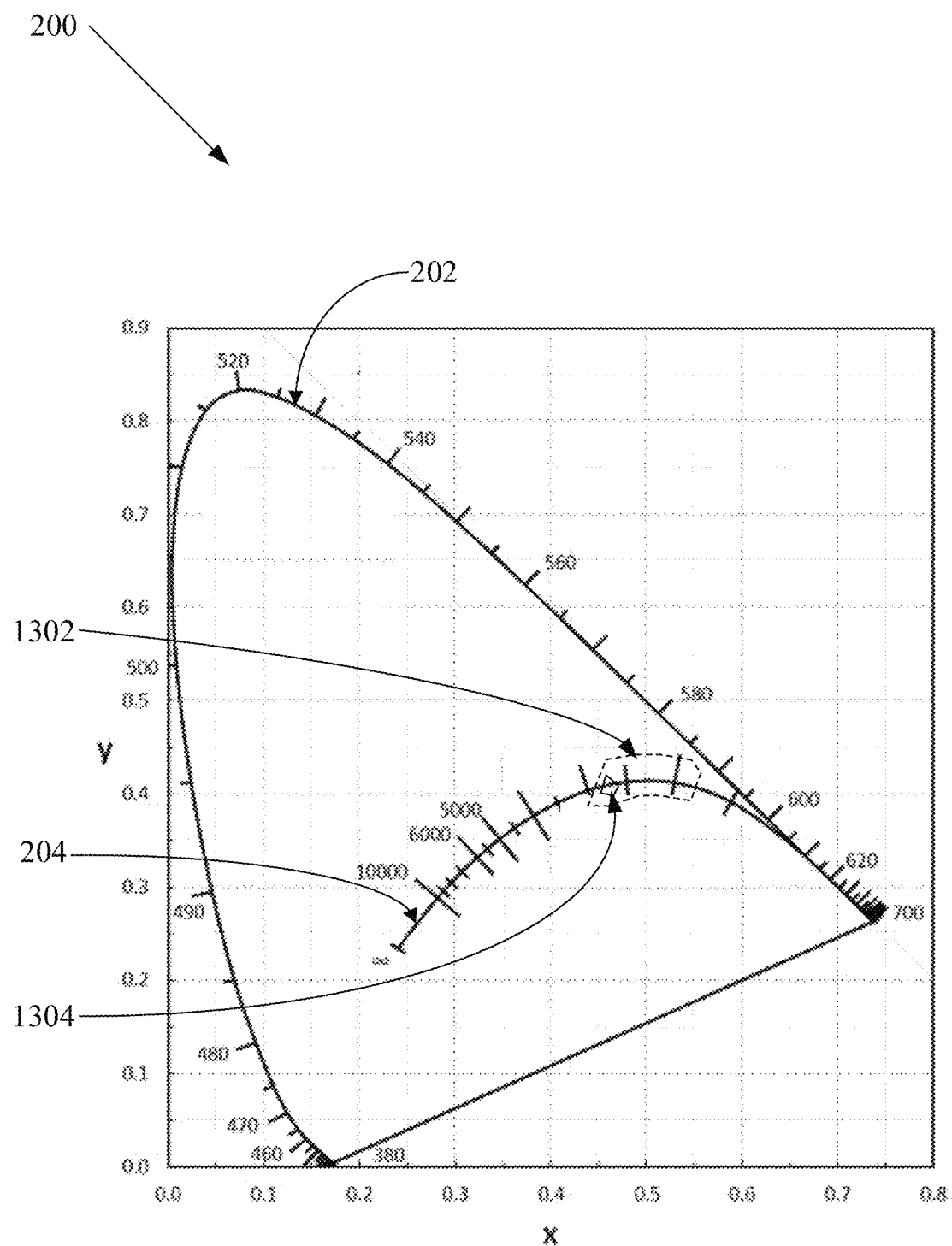
FIG. 13 is a further graph of the CIE 1931 XY chromaticity diagram.

FIG. 13 is a further graph of the CIE 1931 XY chromaticity diagram. Referring to FIGS. 1 and 13, the second light source [104] of the example [100] of the implementation of the lighting system may be configured, as another example, for emitting the second light source emissions represented by the arrow [118] as having the second color point being located within a boundary [1302] defined by lines connecting together the following series of (x,y) coordinate pairs of color points of the CIE 1931 XY chromaticity diagram: (0.5650, 0.4200); (0.5400, 0.4250); (0.5100, 0.4330); (0.4813, 0.4319); (0.4562, 0.4260); (0.4373, 0.3893); (0.4593, 0.3944); (0.4870, 0.4000); (0.5200, 0.3990); (0.5450, 0.3975); and (0.5650, 0.4200). As a further example, the second light source [104] of the example [100] of the implementation of the lighting system may be configured for emitting the second light source emissions represented by the arrow [118] as having the second color point being located within a boundary [1304] defined by lines connecting together the following series of (x,y) chromaticity pairs of color points of the CIE 1931 XY chromaticity diagram: (0.456982, 0.418022); (0.447155, 0.399579); (0.458901, 0.402322); (0.469539, 0.420978); and (0.456982, 0.418022).

Figure 14:
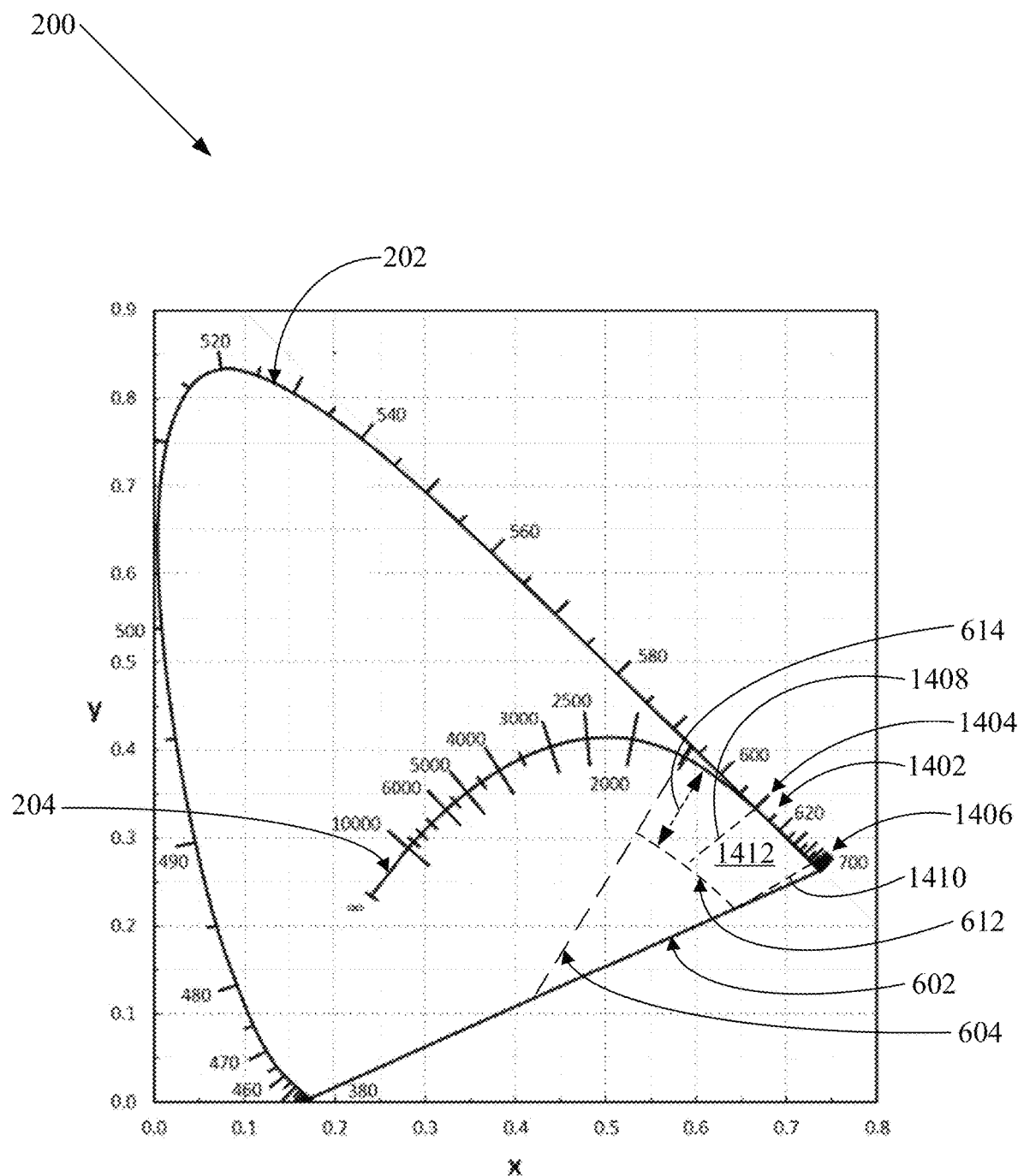
FIG. 14 is an additional graph of the CIE 1931 XY chromaticity diagram.

FIG. 14 is an additional graph of the CIE 1931 XY chromaticity diagram [200]. Referring to FIGS. 1 and 14, the third light source [106] of the example [100] of the implementation of the lighting system may be configured, as another example, for emitting the third light source emissions represented by an arrow [122] as having the third color point being located between the line-of-purples [602] and the isotherm [604] of a correlated color temperature of about 1500K; and as having the dominant- or peak-wavelength being within a range of between about 610 nanometers and about 670 nanometers. For example, FIG. 14 shows a portion [1402] of the perimeter boundary [202] of the CIE 1931 XY chromaticity diagram [200] that extends across a range of wavelengths between a point being marked by an arrow [1404] at a wavelength of about 610 nanometers and another point being marked by an arrow [1406] at a wavelength of about 670 nanometers. Further, for example, FIG. 14 shows the curved line [612] being below and spaced apart from the Planckian—black-body locus [204] by the distance represented by the arrow [614], with the line [612] intersecting both the line-of-purples [602] and the isotherm [604] of the correlated color temperature of about 1500K. Additionally, for example, FIG. 14 shows a line [1408] extending directly away from the arrow [1404] at about 610 nanometers, and intersecting with the curved line [612]. Further, for example, FIG. 14 shows a line [1410] extending directly away from the arrow [1406] at about 670 nanometers, and intersecting with the curved line [612]. In an example, any color point being within a region [1412] located between the lines [1408] and [1410], and being no farther away from the perimeter boundary [202] than the distance [614] below the Planckian—black-body locus [204], will have a dominant- or peak-wavelength being within the range of wavelengths of between about 610 nanometers and about 670 nanometers. As another example, the third light source [106] of the example [100] of the implementation of the lighting system may be configured for emitting the third light source emissions represented by an arrow [122] as having the third color point being reddish-orange, wherein the third light source is configured for emitting light having a dominant- or peak-wavelength being within a range of between about 610 nanometers and about 620 nanometers. In another example, the distance represented by the arrow [614] may be about 0.025 delta(uv).

Figure 15:
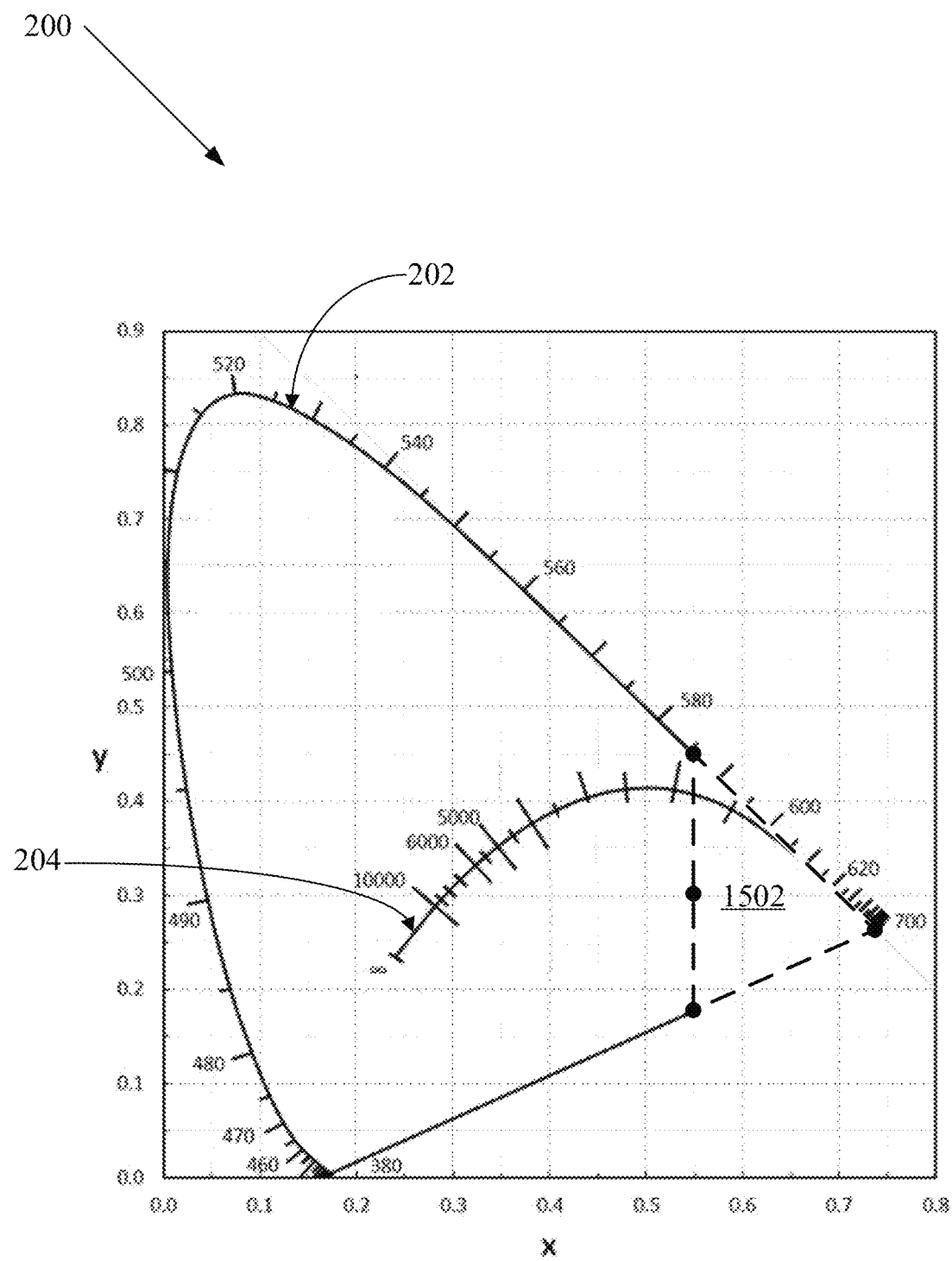
FIG. 15 is another graph of the CIE 1931 XY chromaticity diagram.

FIG. 15 is another graph of the CIE 1931 XY chromaticity diagram. Referring to FIGS. 1 and 15, the third light source [106] of the example [100] of the implementation of the lighting system may be configured, as another example, for emitting the third light source emissions represented by the arrow [122] as having the third color point being located within a boundary [1502] defined by dashed lines connecting together the following series of (x,y) coordinate pairs of color points of the CIE 1931 XY chromaticity diagram being marked as black dots in FIG. 15: (0.562200, 0.437200); (0.734685, 0.265310); (0.550000, 0.179540); (0.550000, 0.300000); and (0.562200, 0.437200). As a further example, the third light source [106] of the example [100] of the implementation of the lighting system may be configured for emitting the third light source emissions represented by the arrow [122] as: having a dominant- or peak-wavelength being within a range of between about 610 nanometers and about 620 nanometers; wherein the third color point is reddish-orange and is in proximity to the following (x,y) coordinate pair of the CIE chromaticity diagram: (0.6822, 0.3171). As another example, the third light source [106] of the example [100] of the implementation of the lighting system may be configured for emitting the third light source emissions represented by the arrow [122] as: having a dominant- or peak-wavelength being within a range of between about 620 nanometers and about 630 nanometers; wherein the third color point is red and is in proximity to the following (x,y) coordinate pair of the CIE chromaticity diagram: (0.7000, 0.2992). As an additional example, the third light source [106] of the example [100] of the implementation of the lighting system may be configured for emitting the third light source emissions represented by the arrow [122] as: having a dominant- or peak-wavelength being within a range of between about 630 nanometers and about 640 nanometers; wherein the third color point is reddish-orange and is in proximity to the following (x,y) coordinate pair of the CIE chromaticity diagram: (0.7125, 0.2864). As a further example, the third light source [106] of the example [100] of the implementation of the lighting system may be configured for emitting the third light source emissions represented by the arrow [122] as: having a dominant- or peak-wavelength being within a range of between about 650 nanometers and about 660 nanometers; wherein the third color point is deep red and is in proximity to the following (x,y) coordinate pair of the CIE chromaticity diagram: (0.7186, 0.2804). As another example, the third light source [106] of the example [100] of the implementation of the lighting system may be configured for emitting the third light source emissions represented by the arrow [122] as: having a dominant- or peak-wavelength being within a range of between about 660 nanometers and about 670 nanometers; wherein the third color point is reddish-orange and is in proximity to the following (x,y) coordinate pair of the CIE chromaticity diagram: (0.7228, 0.2756).

Figure 16:
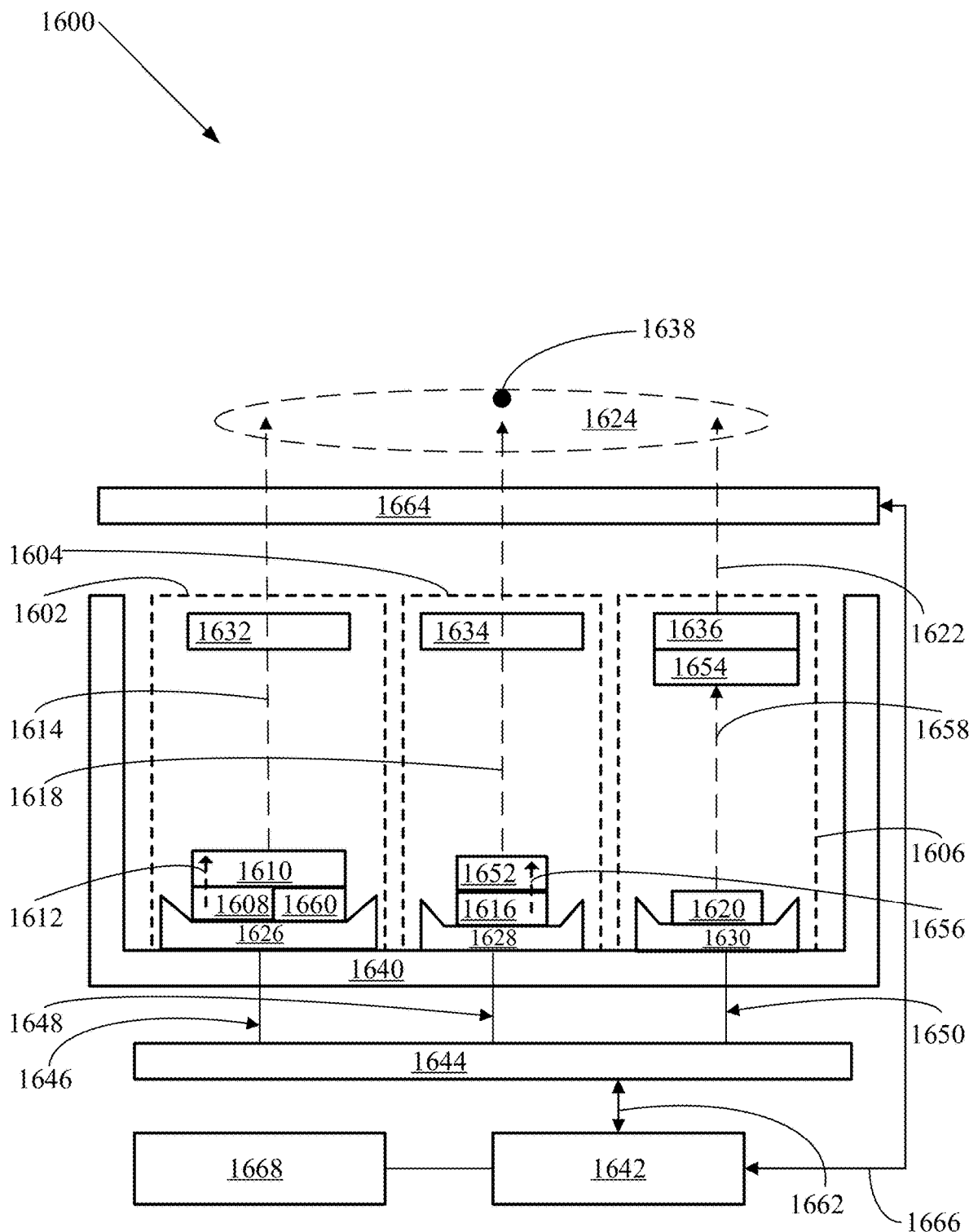
FIG. 16 is a schematic cross-sectional view showing another example of an implementation of a lighting system.

FIG. 16 is a schematic cross-sectional view showing another example [1600] of an implementation of a lighting system. As shown in FIG. 16, the example [1600] of the lighting system includes: a first light source [1602] represented by a dashed box; a second light source [1604] represented by another dashed box; and a third light source [1606] represented by a further dashed box. Another example [100] of an implementation of a lighting system was discussed above in connection with FIGS. 1-15; and examples [1700] of an implementation of a lighting process will be subsequently discussed in connection with FIG. 17. It is understood throughout this specification that the examples [1600] of implementations of the lighting system may be modified as including any of the features or combinations of features that are disclosed in connection with the examples [100] of implementations of the lighting system or any of the features or combinations of features that are disclosed in connection with the examples [1700] of implementations of the lighting process. Accordingly, FIGS. 1-15 and 17, and the entireties of the discussions herein of the examples [100] of lighting systems and of the examples [1700] of the lighting process, are hereby incorporated into the following discussion of the examples [1600] of the lighting system.

The first light source [1602] includes a first semiconductor light-emitting device [1608] and a first lumiphor [1610]. The second light source [1604] includes a second semiconductor light-emitting device [1616] and a second lumiphor [1652]. The third light source [1606] includes a third semiconductor light-emitting device [1620] and a third lumiphor [1654]. The first lumiphor [1610] is configured for converting light emissions represented by an arrow [1612] of the first semiconductor light-emitting device [1608] having a first spectral power distribution into first light source emissions represented by an arrow [1614] having another spectral power distribution being different than the first spectral power distribution. The second lumiphor [1652] is configured for converting light emissions represented by an arrow [1656] from the second semiconductor light-emitting device [1616] having a second spectral power distribution into second light source emissions represented by an arrow [1618] having a further spectral power distribution being different than the second spectral power distribution. The third lumiphor [1654] is configured for converting light emissions represented by an arrow [1658] from the third semiconductor light-emitting device [1620] having a third spectral power distribution into third light source emissions represented by an arrow [1622] having an additional spectral power distribution being different than the third spectral power distribution. The example [1600] of the lighting system is also configured for forming combined light emissions represented by a dashed ellipse [1624] having combined color points, wherein the combined light emissions represented by the dashed ellipse [1624] include the first light source emissions represented by the arrow [1614] from the first light source [1602], and the second light source emissions represented by the arrow [1618] from the second light source [1604], and the third light source emissions represented by the arrow [1622] from the third light source [1606]. In an example as shown in FIG. 16, the first lumiphor [1610] may be in direct contact with the first semiconductor light-emitting device [1608]; and the second lumiphor [1652] may be in direct contact with the second semiconductor light-emitting device [1616]. Further, for example, the third lumiphor [1654] may be remotely-located as shown in FIG. 16, being spaced apart at a distance represented by the arrow [1658] away from the third semiconductor light-emitting device [1620]. As further examples, any of the lumiphors [1610], [1652], [1654] may each independently be in direct contact with or remotely-located away from the respective semiconductor light-emitting devices [1608], [1616], [1620].

In further examples, the first lumiphor [1610] may be configured for down-converting light emissions from the first semiconductor light-emitting device [1608] having the first spectral power distribution into the first light source emissions [1614] having the another spectral power distribution as being longer than the first spectral power distribution. Referring to FIG. 16, in additional examples the first light source [1602] may include a fourth semiconductor light-emitting device [1660] configured for emitting light having a fourth color point. In an additional example, the fourth semiconductor light-emitting device [1660] may be configured for emitting light having a color point being greenish-blue, blue, or purplish-blue. Further in the additional example, the fourth semiconductor light-emitting device [1660] may be configured for emitting light having a dominant- or peak-wavelength being: within a range of between about 420 nanometers and about 510 nanometers; or within a range of between about 445 nanometers and about 490 nanometers. Also in the additional example, the first lumiphor [1610] may be configured for causing the first color point to have a correlated color temperature of about 3000K; or as having another correlated color temperature being within a range of between about 4800K and about 2500K.

In additional examples, the second lumiphor [1652] may be configured for down-converting light emissions from the second semiconductor light-emitting device [1616] having the second spectral power distribution into the second light source emissions [1618] having the further spectral power distribution as being longer than the second spectral power distribution. As another example, the second semiconductor light-emitting device [1616] may be configured for emitting light having a color point being greenish-blue, blue, or purplish-blue. In the another example, the second semiconductor light-emitting device [1616] may be further configured for emitting light having a dominant- or peak-wavelength being: within a range of between about 420 nanometers and about 510 nanometers; or within a range of between about 445 nanometers and about 490 nanometers. In the another example, the second lumiphor may be additionally configured for causing the second color point to have a correlated color temperature of about 2700K; or as having another correlated color temperature being within a range of between about 2900K and about 1700K.

In further examples, the third lumiphor [1654] may be configured for down-converting light emissions from the third semiconductor light-emitting device [1620] having the third spectral power distribution into the third light source emissions [1622] having the additional spectral power distribution as being longer than the third spectral power distribution. As an additional example, the third semiconductor light-emitting device [1620] may be configured for emitting light having a color point being greenish-blue, blue, or purplish-blue. In the additional example, the third semiconductor light-emitting device [1620] may be further configured for emitting light having a dominant- or peak-wavelength being: within a range of between about 420 nanometers and about 510 nanometers; or within a range of between about 445 nanometers and about 490 nanometers.

As additionally shown in FIG. 16, the first light source [1602], the second light source [1604], and the third light source [1606] of the example [1600] of the implementation of the lighting system may, for example, respectively include a reflective element [1626], a reflective element [1628], and a reflective element [1630]. As further shown in FIG. 16, the first light source [1602], the second light source [1604], and the third light source [1606] of the example [1600] of the implementation of the lighting system may, for example, respectively include a lens element [1632], a lens element [1634], and a lens element [1636]. As further examples, the reflective elements [1626], [1628], and [1630] and/or the lens elements [1632], [1634], and [1636] may respectively be shaped or relatively positioned for: causing the forming of the combined light emissions represented by the dashed ellipse [1624]; and may be so shaped or relatively positioned for causing the first light source emissions represented by the arrow [1614] and the second light source emissions represented by the arrow [1618] and the third light source emissions represented by the arrow [1622] to intersect at a focal point [1638]. As further shown in FIG. 16, the first light source [1602], the second light source [1604], and the third light source [1606] of the example [1600] of the implementation of the lighting system may, for example, be located in a housing [1640]. In additional examples as shown in FIG. 16, the example [1600] of the implementation of the lighting system may include a drive unit [1644] configured for supplying electrical drive current to each of the semiconductor light-emitting devices [1608], [1616], [1620]. For example, the drive unit [1644] may have conductors [1646], [1648], [1650] for supplying the electrical drive current, respectively being independently electrically connected with the semiconductor light-emitting devices [1608], [1616], [1620]. In another example, the example [1600] of the implementation of the lighting system may have a control unit [1642], which may be in signal communication with the drive unit [1644] as indicated by an arrow [1662]. As an example, the control unit [1642] may include a microprocessor. As further shown in FIG. 16, the example [1600] of the implementation of the lighting system may, for example, include a sensor [1664] being configured for detecting: a first luminous flux of the first light source emissions represented by the arrow [1614]; and a second luminous flux of the second light source emissions represented by the arrow [1618]; and a third luminous flux of the third light source emissions represented by the arrow [1622]; and may be configured for detecting a combined luminous flux of the combined light emissions represented by the dashed ellipse [1624]. As another example, the example [1600] of the implementation of the lighting system may include the control unit [1642] as being in signal communication with the sensor [1664] as represented by an arrow [1666]. As additionally shown in FIG. 16, the example [1600] of the implementation of the lighting system may, for example, include a database [1668] including look-up tables of sets of respective luminous flux values for the first-, second-, and third luminous flux, which may be configured for controlling the first light source [1602], the second light source [1604] and the third light source [1606] along a light brightening/dimming curve.

The examples [100], [1600] of lighting systems may generally be utilized in end-use applications where lighting is needed as progressing through a light brightening/dimming curve of correlated color temperatures (CCTs). The examples [100], [1600] of lighting systems may, for example, facilitate causing the combined color points of combined light emissions of multiple light sources to remain below the Planckian—black-body locus by a distance being within a range of between about 0.001 delta(uv) and about 0.009 delta(uv) throughout a light brightening/dimming curve.

Figure 17:
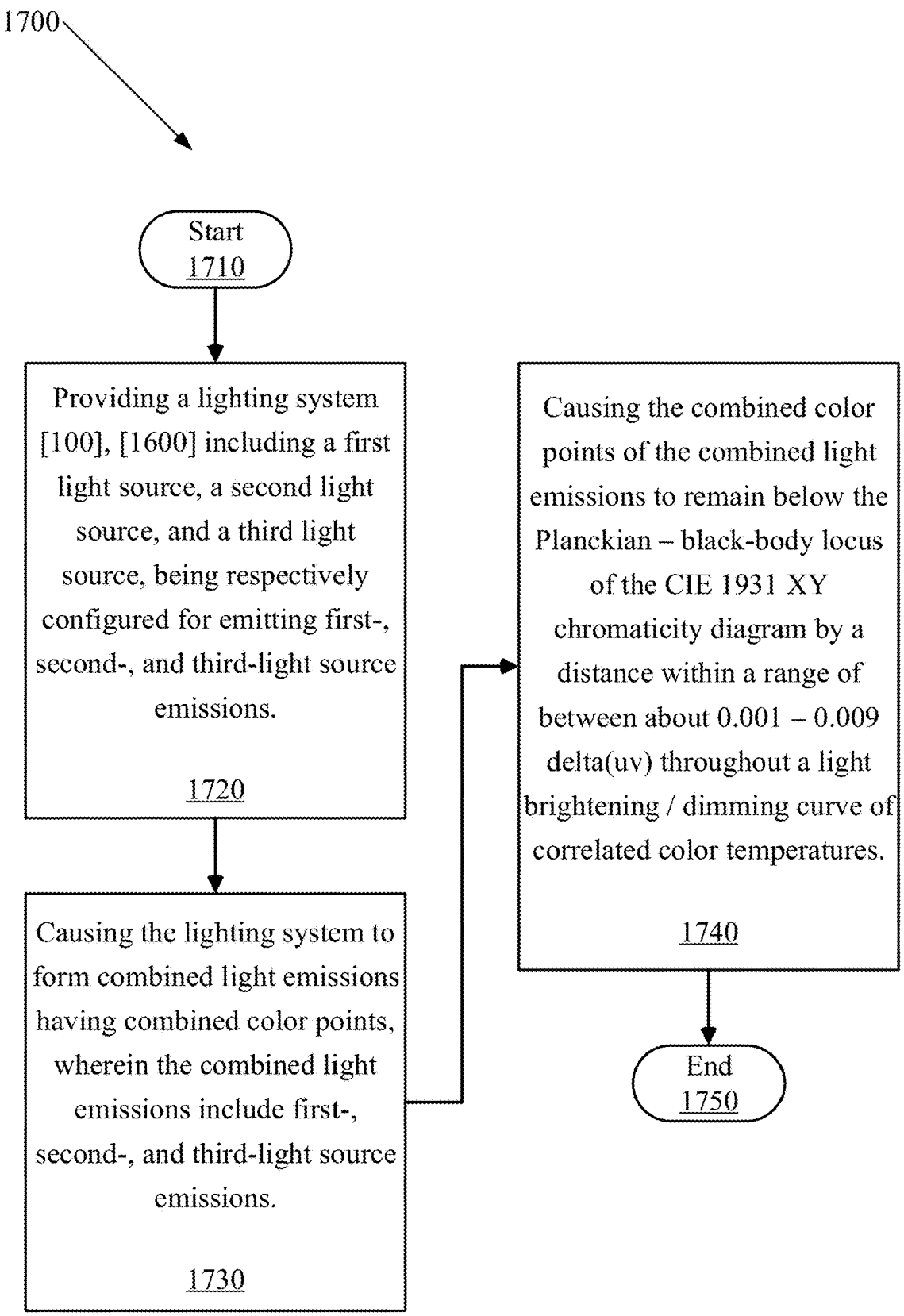
FIG. 17 is a flow chart showing an example of an implementation of a lighting process.

FIG. 17 is a flow chart showing an example [1700] of an implementation of a lighting process. The example [1700] of the process starts at step [1710]. Step [1720] of the lighting process [1700] includes providing a lighting system [100], [1600] including: a first light source [102], [1602]; a second light source [104], [1604]; and a third light source [106], [1606]. Further, step [1720] includes the first-, second-, and third-light sources as being respectively configured for emitting first light-source emissions [118], [1614], second light-source emissions [118], [1618], and third light-source emissions [122], [1622]. Step [1730] of the lighting process [1700] includes causing the lighting system [100], [1600] to form combined light emissions [124], [1624] having combined color points, wherein the combined light emissions [124], [1624] include first light source emissions [114], [1614], and second light source emissions [118], [1618], and third light source emissions [122], [1622]. Step [1740] of the lighting process [1700] includes causing the combined color points of the combined light emissions [124], [1624] to remain below the Planckian—black-body locus [204] of the CIE 1931 XY chromaticity diagram by a distance being within a range of between about 0.001 delta(uv) and about 0.009 delta(uv) throughout a light brightening/dimming curve of correlated color temperatures (CCTs). The process [1700] may then end at step [1750]. It is understood that step

[1720] of the example [1700] of the lighting process may include providing a lighting system having any of the features or combinations of features that are disclosed herein in connection with discussions of the examples [100], [1600] of implementations of the lighting system. Accordingly, FIGS. 1-16 and the entireties of the earlier discussions of the examples [100], [1600] of lighting systems are hereby incorporated into this discussion of the examples [1700] of the lighting process.

In examples, causing the lighting system to form combined light emissions at step [1730] may include causing the combined color points to emulate color points of an incandescent light emitter throughout the light brightening/dimming curve. In further examples, causing the lighting system to form combined light emissions at step [1730] may include causing the combined light emissions to have a substantially constant combined color point throughout the light brightening/dimming curve. In additional examples, causing the lighting system to form combined light emissions at step [1730] may include causing the combined light emissions to perceptually form an unbroken line.

As additional examples, causing the lighting system to form combined light emissions at step [1730] may include causing the combined color points to have a color rendition index (CRI-Ra including $R_{1-15}$) throughout the light brightening/dimming curve being about equal to or greater than 75. Further, for example, causing the lighting system to form combined light emissions at step [1730] may include causing the combined color points to have a color rendition index (CRI-Ra including $R_{1-8}$) throughout the light brightening/dimming curve being about equal to or greater than 75. In other examples, causing the lighting system to form combined light emissions at step [1730] may include causing the combined color points to have a color rendition index (CRI-$R_9$) throughout the light brightening/dimming curve being about equal to or greater than 80.

In examples, causing the lighting system to form combined light emissions at step [1730] may include: causing the first light source to emit the first light source emissions as having a first luminous flux; and causing the second light source to emit the second light source emissions as having a second luminous flux; and causing the third light source to emit the third light source emissions as having a third luminous flux. Further, for example, causing the lighting system to form combined light emissions at step [1730] may include detecting the first luminous flux, the second luminous flux, and the third luminous flux. As additional examples, causing the lighting system to form combined light emissions at step [1730] may include controlling the first luminous flux, and the second luminous flux, and the third luminous flux. Also, for example, causing the lighting system to form combined light emissions at step [1730] may include controlling a combined luminous flux of the combined light emissions. In another example, causing the lighting system to form combined light emissions at step [1730] may include causing the combined luminous flux to progressively increase along the light brightening/dimming curve from a correlated color temperature of, for example, about 3200K to a correlated color temperature of, for example, about 1800K. As an additional example, causing the lighting system to form combined light emissions at step [1730] may include utilizing the detected first luminous flux, second luminous flux, and third luminous flux in controlling a distribution of electrical drive current to the semiconductor light-emitting devices. In another example, causing the lighting system to form combined light emissions at step [1730] may include controlling the distribution of the electrical drive current to the semiconductor light-emitting devices by comparing the detected first luminous flux, the detected second luminous flux, and the detected third luminous flux with separate respective sets of look-up tables of luminous flux values for the light emissions from each of the light sources. As a further example, causing the lighting system to form combined light emissions at step [1730] may include detecting the combined luminous flux of the combined light emissions. In another example, causing the lighting system to form combined light emissions at step [1730] may include utilizing the detected combined luminous flux in controlling the distribution of the electrical drive current to the semiconductor light-emitting devices. In addition, for example, causing the lighting system to form combined light emissions at step [1730] may include controlling the distribution of the electrical drive current to minimize any variances between the look-up tables of luminous flux values and the detected first luminous flux, the detected second luminous flux, and the detected third luminous flux.

In further examples, causing the combined color points to remain below the Planckian—black-body locus at step [1740] may include the light brightening/dimming curve as including a brightened terminus having a CCT being within a range of between about 3400K and about 2700K and including a dimmed terminus having a CCT being within a range of between about 2200K and about 1700K. As another example, causing the combined color points to remain below the Planckian—black-body locus at step [1740] may include the light brightening/dimming curve as including a brightened terminus having a CCT of about 3200K and including a dimmed terminus having a CCT of about 1800K. In examples, causing the combined color points to remain below the Planckian—black-body locus at step [1740] may include causing the distance of the combined color points below the Planckian—black-body locus to have a maximum variance of about equal to or less than 0.002 delta(uv) throughout the light brightening/dimming curve.

The example [1700] of the lighting process may generally be utilized in end-use applications where lighting is needed as progressing through a light brightening/dimming curve of correlated color temperatures (CCTs). The example [1700] of the lighting process may, for example, facilitate causing the combined color points of combined light emissions of a lighting system including multiple light sources to remain below the Planckian—black-body locus by a distance being within a range of between about 0.001 delta(uv) and about 0.009 delta(uv) throughout a light brightening/dimming curve.

Example 1

Figure 18:
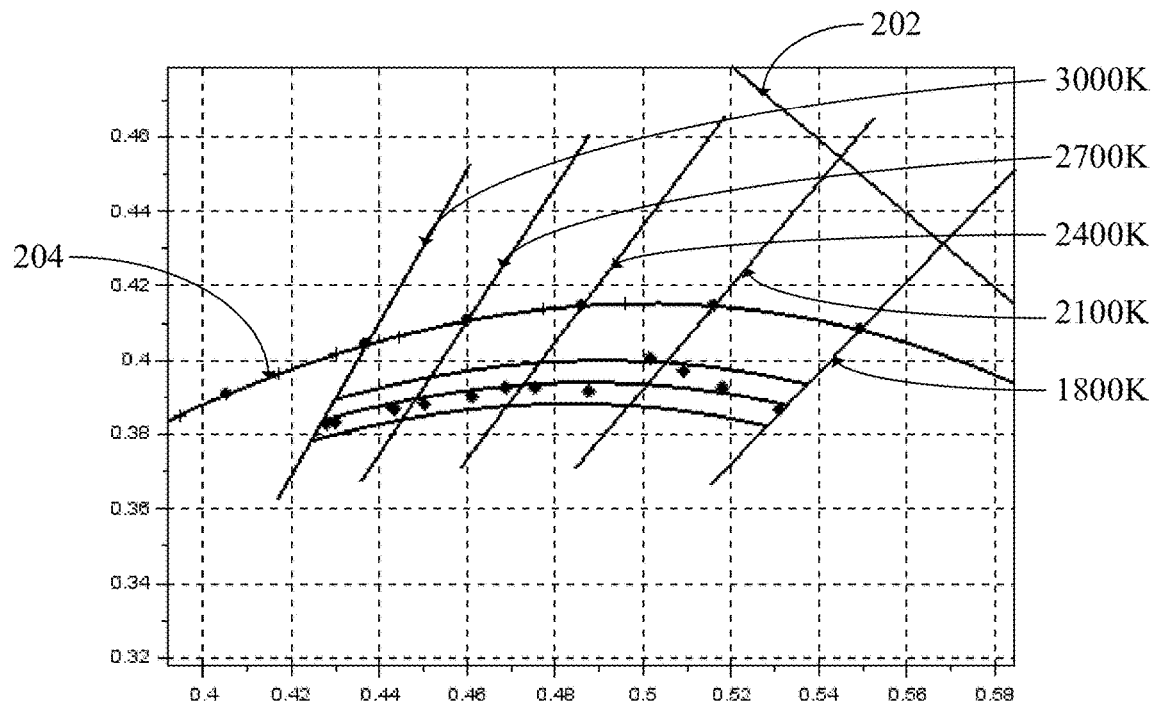
FIG. 18 is a portion of a graph of the CIE 1931 XY chromaticity diagram.

In this example, a computer-simulated lighting system was provided, including electronic emulation of the empirically-known spectral strengths of the light emissions of a first light source, a second light source, and a third light source. The first light source included a first semiconductor light-emitting device configured for emitting first light source emissions (Ch-1) having a CCT of about 3500K and Ra of about 80. The second light source included a second semiconductor light-emitting device configured for emitting second light source emissions (Ch-2) having a CCT of about 2700K and Ra of about 90. The third light source included a third semiconductor light-emitting device configured for emitting third light source emissions (Ch-3) having a red-orange color point. The computer-simulated lighting system was configured for generating combined color points of combined light emissions including the first-, second-, and third-light source emissions. In a computer-simulated trial including electronic emulation of the empirically-known spectral strengths of light emissions of the three light sources, the computer-simulated lighting system was operated to generate combined color points for the combined light emissions through a simulated light brightening/dimming curve from a brightened correlated color temperature of about 3000K to a dimmed correlated color temperature of about 1800K. Table 1 below tabulates the electronically-generated results of the computer-simulated trial. FIG. 18 is a portion of a graph of the CIE 1931 XY chromaticity diagram, plotting the (x,y) coordinate pairs of the color points for the results tabulated in Table 1. FIG. 18 shows isotherms of correlated color temperatures of about: 3000K; 2700K; 2400K; 2100K; and 1800K; and shows a portion of the Planckian—black-body locus [204] of the CIE 1931 XY chromaticity diagram, and a portion the perimeter boundary [202]. The individual spectral strengths as electronically simulated for each of the semiconductor light-emitting devices through the computer-simulated trial are tabulated in Table 1. Throughout the simulated light brightening/dimming curve, the computer-generated combined color points remained below the Planckian—black-body locus by a distance within a range of between about −4.80 delta(uv) and about −7.88 delta(uv). In addition, throughout the progression along the electronically-simulated light brightening/dimming curve, the Ra was within a range of between about 83.00 and about 94.85; and $R_9$ was within a range of between about 70.86 and about 93.69.

including the first-, second-, and third-light source emissions. In a computer-simulated trial including electronic emulation of the empirically-known spectral strengths of light emissions of the three light sources, the computer-simulated lighting system was operated to generate combined color points for the combined light emissions through a simulated light brightening/dimming curve from a brightened correlated color temperature of about 3000K to a dimmed correlated color temperature of about 1800K. Table 2 below tabulates the electronically-generated results of the computer-simulated trial. The individual spectral strengths as electronically simulated for each of the semiconductor light-emitting devices through the computer-simulated trial are tabulated in Table 2. Throughout the simulated light brightening/dimming curve, the computer-generated combined color points remained below the Planckian—black-body locus by a distance within a range of between about −4.59 delta(uv) and about −9.07 delta(uv). In addition, throughout the progression along the electronically-simulated light brightening/dimming curve, the Ra was within a range of between about 80.08 and about 82.12; and $R_9$ was within a range of between about 9.42 and about 14.74.

TABLE 2

| Trial CCT | 3500K-80 Ch-1 | lumiphor-amber Ch-2 | Red-Orange Ch-3 | CCT | duv | Ra | R9 |
|---|---|---|---|---|---|---|---|
| 3000 | 0.66667 | 0.33333 | 0.00000 | 2983.0 | −4.59 | 82.12 | 14.48 |
| 2900 | 0.61714 | 0.34286 | 0.00000 | 2932.3 | −4.77 | 81.65 | 12.75 |

TABLE 1

| trial | 3500K-80 Ch-1 | 2700K-90 Ch-2 | red-orange Ch-3 | CCT | duv | Ra | R9 | x | y |
|---|---|---|---|---|---|---|---|---|---|
| 3000 | 0.47059 | 0.11765 | 0.41176 | 2971.8 | −7.70 | 94.42 | 70.86 | 0.428064 | 0.382374 |
| 2900 | 0.43636 | 0.13091 | 0.39273 | 2942.0 | −7.71 | 94.63 | 72.24 | 0.43002 | 0.38298 |
| 2800 | 0.21500 | 0.16125 | 0.26875 | 2753.5 | −7.59 | 94.85 | 80.15 | 0.443376 | 0.387017 |
| 2700 | 0.16667 | 0.11905 | 0.21429 | 2745.0 | −7.82 | 94.71 | 80.28 | 0.44364 | 0.386508 |
| 2600 | 0.09583 | 0.09583 | 0.15333 | 2658.8 | −7.77 | 94.34 | 83.32 | 0.45019 | 0.388094 |
| 2500 | 0.04842 | 0.07263 | 0.10895 | 2518.1 | −7.88 | 93.29 | 87.25 | 0.461167 | 0.389716 |
| 2400 | 0.02289 | 0.05342 | 0.06868 | 2438.4 | −7.29 | 92.86 | 89.51 | 0.468911 | 0.392261 |
| 2300 | 0.01063 | 0.03188 | 0.04250 | 2357.2 | −7.40 | 91.97 | 90.64 | 0.475799 | 0.392533 |
| 2200 | 0.00455 | 0.01818 | 0.02727 | 2217.2 | −7.88 | 89.98 | 90.99 | 0.487699 | 0.391469 |
| 2100 | 0.00000 | 0.01250 | 0.01250 | 2140.2 | −4.80 | 90.38 | 93.69 | 0.501517 | 0.400277 |
| 2000 | 0.00000 | 0.00656 | 0.00844 | 2046.64 | −5.7 | 88.45 | 91.77 | 0.509093 | 0.396787 |
| 1900 | 0.00000 | 0.00288 | 0.00462 | 1942.22 | −6.58 | 86.16 | 88.56 | 0.51813 | 0.392605 |
| 1800 | 0.00000 | 0.00077 | 0.00173 | 1804.1 | −7.49 | 83.00 | 82.13 | 0.531198 | 0.386592 |

Example 2

In this example, another computer-simulated lighting system was provided, including electronic emulation of the empirically-known spectral strengths of the light emissions of a first light source, a second light source, and a third light source. The first light source included a first semiconductor light-emitting device configured for emitting first light source emissions (Ch-1) having a CCT of about 3500K and Ra of about 80. The second light source included a second semiconductor light-emitting device including a down-converting lumiphor and configured for emitting second light source emissions (Ch-2) having an amber color point. The third light source included a third semiconductor light-emitting device configured for emitting third light source emissions (Ch-3) having a red-orange color point. The computer-simulated lighting system was configured for generating combined color points of combined light emissions TABLE 2-continued

| Trial CCT | 3500K-80 Ch-1 | lumiphor-amber Ch-2 | Red-Orange Ch-3 | CCT | duv | Ra | R9 |
|---|---|---|---|---|---|---|---|
| 2800 | 0.38700 | 0.25800 | 0.00000 | 2841.6 | −5.02 | 80.69 | 9.42 |
| 2700 | 0.26667 | 0.20000 | 0.03333 | 2734.2 | −5.73 | 80.78 | 10.39 |
| 2600 | 0.16429 | 0.13143 | 0.04929 | 2643.1 | −6.48 | 81.35 | 12.99 |
| 2500 | 0.09684 | 0.08474 | 0.04842 | 2543.1 | −7.15 | 81.68 | 14.62 |
| 2400 | 0.05438 | 0.05438 | 0.03625 | 2446.2 | −7.46 | 81.24 | 13.49 |
| 2300 | 0.02732 | 0.03036 | 0.02732 | 2332.5 | −8.04 | 81.49 | 14.74 |
| 2200 | 0.01429 | 0.01905 | 0.01667 | 2244.6 | −7.79 | 80.08 | 10.36 |
| 2100 | 0.00600 | 0.00900 | 0.01000 | 2133.1 | −8.09 | 80.12 | 10.69 |
| 2000 | 0.00300 | 0.00500 | 0.00700 | 2024.6 | −8.32 | 80.27 | 11.23 |
| 1900 | 0.00125 | 0.00208 | 0.00417 | 1917.3 | −9.07 | 81.55 | 15.65 |
| 1800 | 0.00036 | 0.00071 | 0.00143 | 1842.6 | −8.41 | 80.18 | 10.86 |

Example 3

Figure 19:
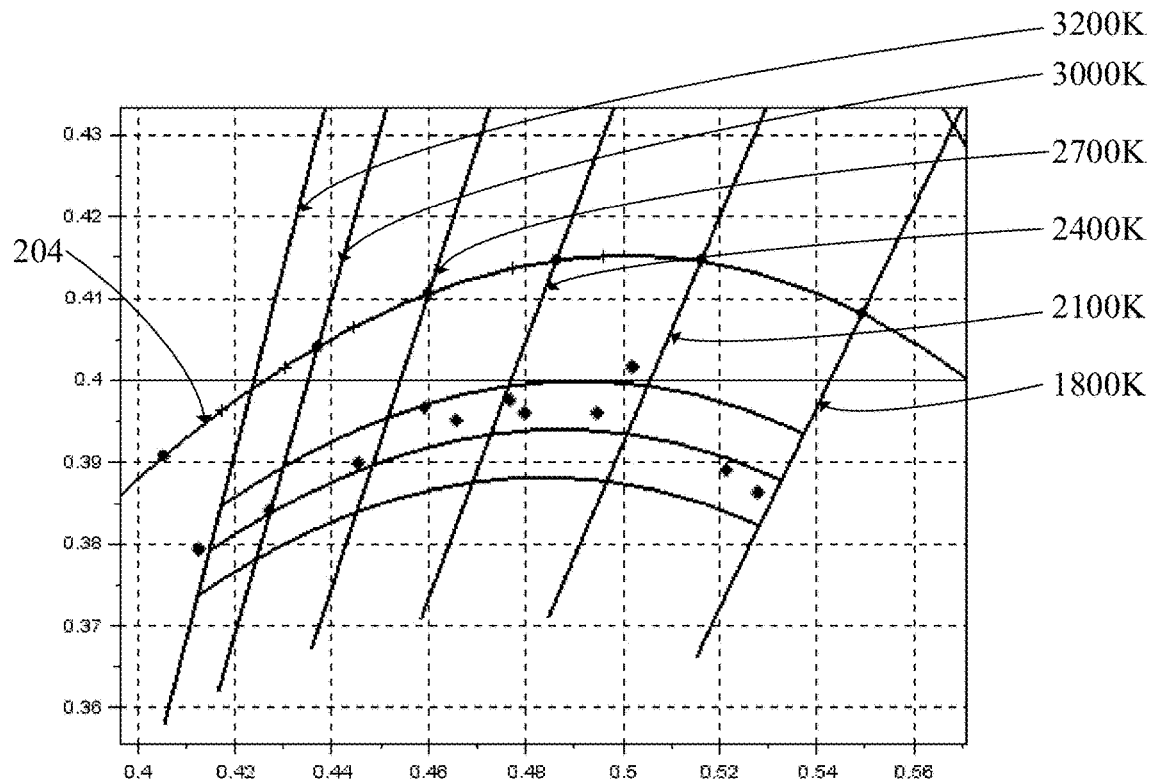
FIG. 19 is another portion of a graph of the CIE 1931 XY chromaticity diagram.

In this example, a further computer-simulated lighting system was provided, including electronic emulation of the empirically-known spectral strengths of the light emissions of a first light source, a second light source, and a third light source. The first light source included: a first semiconductor light-emitting device configured for emitting first light source emissions (Ch-1) having a CCT of about 3000K and Ra of about 85; and another semiconductor light-emitting device configured for emitting further light emissions (Ch-3) having a blue color point. The second light source included a second semiconductor light-emitting device configured for emitting second light source emissions (Ch-2) having a CCT of about 2700K and Ra of about 90. The third light source included a third semiconductor light-emitting device configured for emitting third light source emissions (Ch-4) having a red-orange color point. The computer-simulated lighting system was configured for generating combined color points of combined light emissions including the first-, second-, and third-light source emissions. In a computer-simulated trial including electronic emulation of the empirically-known spectral strengths of light emissions of the three light sources, the computer-simulated lighting system was operated to generate combined color points for the combined light emissions through a simulated light brightening/dimming curve from a brightened correlated color temperature of about 3200K to a dimmed correlated color temperature of about 1800K. Table 3 below tabulates the electronically-generated results of the computer-simulated trial. FIG. 19 is another portion of a graph of the CIE 1931 XY chromaticity diagram, plotting the (x,y) coordinate pairs of the color points for the results tabulated in Table 3. FIG. 19 shows isotherms of correlated color temperatures of about: 3200K; 3000K; 2700K; 2400K; 2100K; and 1800K; and shows a portion of the Planckian—black-body locus [204] of the CIE 1931 XY chromaticity diagram. The individual spectral strengths as electronically simulated for each of the semiconductor light-emitting devices through the computer-simulated trial are tabulated in Table 3. Throughout the simulated light brightening/dimming curve, the computer-generated combined color points remained below the Planckian—black-body locus by a distance within a range of between about −4.36 delta(uv) and about −7.84 delta(uv). In addition, throughout the progression along the electronically-simulated light brightening/dimming curve, the Ra was within a range of between about 82.41 and about 94.96; and $R_9$ was within a range of between about 83.14 and about 98.3.

TABLE 3

| trial | 3000K-85 Ch-1 | 2700K-90 Ch-2 | Royal Blue Ch-3 | Red-Orange Ch-4 | CCT | duv | Ra | R9 | x | y |
|---|---|---|---|---|---|---|---|---|---|---|
| 3200 | 0.71875 | 0.00000 | 0.19531 | 0.08594 | 3241 | −6.56 | 94.96 | 90.8 | 0.412889 | 0.379352 |
| 3000 | 0.61971 | 0.00000 | 0.12250 | 0.23779 | 2999 | −6.95 | 96.69 | 94.52 | 0.427314 | 0.383894 |
| 2700 | 0.00000 | 0.41509 | 0.08491 | 0.00000 | 2745 | −6.67 | 96.8 | 98.3 | 0.445452 | 0.389824 |
| 2600 | 0.17569 | 0.00000 | 0.00000 | 0.16931 | 2599.8 | −5.17 | 92.05 | 95.3 | 0.459226 | 0.396601 |
| 2500 | 0.07109 | 0.05541 | 0.00836 | 0.09514 | 2497.3 | −6.18 | 93.25 | 96.3 | 0.46592 | 0.394932 |
| 2400 | 0.00000 | 0.09063 | 0.00725 | 0.04713 | 2383 | −5.65 | 91.6 | 96.8 | 0.476825 | 0.397537 |
| 2300 | 0.03000 | 0.00500 | 0.00000 | 0.05000 | 2334.33 | −6.28 | 90.48 | 95.02 | 0.479999 | 0.395947 |
| 2200 | 0.00577 | 0.01667 | 0.00000 | 0.02756 | 2177 | −6.32 | 90 | 94.2 | 0.494715 | 0.395945 |
| 2100 | 0.00147 | 0.01029 | 0.00000 | 0.01324 | 2145 | −4.36 | 90 | 93.84 | 0.501968 | 0.40162 |
| 1900 | 0.00075 | 0.00150 | 0.00000 | 0.00525 | 1892.61 | −7.5 | 83.91 | 86.41 | 0.521421 | 0.388924 |
| 1800 | 0.00023 | 0.00045 | 0.00000 | 0.00182 | 1825.64 | −7.84 | 82.41 | 83.14 | 0.528 | 0.386245 |

While the present invention has been disclosed in a presently defined context, it will be recognized that the present teachings may be adapted to a variety of contexts consistent with this disclosure and the claims that follow. For example, the lighting systems and processes shown in the figures and discussed above can be adapted in the spirit of the many optional parameters described.

What is claimed is:

1. A lighting system, comprising:
    a first light source that includes a first semiconductor light-emitting device and includes a first lumiphor configured for converting light emissions of the first semiconductor light-emitting device having a first spectral power distribution into first light source emissions having another spectral power distribution being different than the first spectral power distribution, wherein the first light source is configured for emitting the first light source emissions as having a first color point, wherein the first color point is located between an isotherm of a correlated color temperature of about 4800K and an isotherm of a correlated color temperature of about 2500K, and wherein the first color point is located within a distance of about equal to or less than 0.006 delta(uv) away from a Planckian—blackbody locus of the International Commission on Illumination (CIE) 1931 XY chromaticity diagram;
    a second light source that includes a second semiconductor light-emitting device, wherein the second light source is configured for emitting second light source emissions having a second color point, wherein the second color point is located between an isotherm of a correlated color temperature of about 2900K and an isotherm of a correlated color temperature of about 1700K; and
    a third light source that includes a third semiconductor light-emitting device, wherein the third light source is configured for emitting third light source emissions having a third color point, wherein the third color point is located between a line-of-purples of the CIE 1931 XY chromaticity diagram and an isotherm of a correlated color temperature of about 1500K, and wherein the third color point is located within a distance of about 0.025 delta(uv) below the Planckian—blackbody locus;
    wherein the lighting system forms combined light emissions having a series of combined color points, wherein the combined light emissions include the first light source emissions, and the second light source emissions, and the third light source emissions; and wherein the lighting system causes the series of the combined color points of the combined light emissions to emulate color points of an incandescent light emitter by causing a progression of the series of the combined color points to remain below the Planckian—black-body locus throughout a light brightening/dimming curve of correlated color temperatures (CCTs).

2. The lighting system of claim 1, wherein the lighting system is configured for causing the progression of the series of the combined color points of the combined light emissions to remain below the Planckian—black-body locus by a distance being within a range of between about 0.001 delta(uv) and about 0.009 delta(uv) throughout the light brightening/dimming curve as including a brightened terminus having a CCT being within a range of between about 3400K and about 2700K and as including a dimmed terminus having a CCT being within a range of between about 2200K and about 1700K.

3. The lighting system of claim 1, wherein the lighting system causes the progression of the series of the combined color points to remain below the Planckian—black-body locus by a distance being within a range of between about 0.001 delta(uv) and about 0.009 delta(uv) throughout the light brightening/dimming curve.

4. The lighting system of claim 1, wherein the lighting system is configured for causing the combined color points of the combined light emissions to have a color rendition index (CRI-Ra including $R_{1-15}$) throughout the light brightening/dimming curve being about equal to or greater than 75.

5. The lighting system of claim 1, wherein the lighting system is configured for causing the combined color points of the combined light emissions to have a color rendition index (CRI-Ra including $R_{1-8}$) throughout the light brightening/dimming curve being about equal to or greater than 75.

6. The lighting system of claim 1, wherein the lighting system is configured for causing the combined color points of the combined light emissions to have a color rendition index (CRI-$R_9$) throughout the light brightening/dimming curve being about equal to or greater than 80.

7. The lighting system of claim 1, wherein the lighting system is configured for causing the combined light emissions to perceptually form an unbroken line.

8. The lighting system of claim 1, wherein the first light source is configured for emitting the first light source emissions as having a first luminous flux; and the second light source is configured for emitting the second light source emissions as having a second luminous flux; and the third light source is configured for emitting the third light source emissions as having a third luminous flux; and wherein the lighting system is configured for controlling a combined luminous flux of the combined light emissions; and wherein the lighting system is configured for causing the combined luminous flux to progressively increase along the light brightening/dimming curve from a brightened terminus having a CCT being within a range of between about 3400K and about 2700K to a dimmed terminus having a CCT being within a range of between about 2200K and about 1700K.

9. The lighting system of claim 1, wherein the first light source is configured for emitting light having the first color point as being white.

10. The lighting system of claim 1, wherein the first color point has a correlated color temperature being within a range of between about 4800K and about 2500K.

11. The lighting system of claim 1, wherein the first color point has a correlated color temperature being within a range of between about 3615K and about 3315K; and wherein the first color point is located within a distance of about equal to or less than 0.003 delta(uv) away from the Planckian—black-body locus.

12. The lighting system of claim 1, wherein the first color point is located within a boundary defined by lines connecting together the following series of (x,y) coordinate pairs of color points of the CIE 1931 XY chromaticity diagram: (0.4813, 0.4319); (0.4562, 0.4260); (0.4299, 0.4165); (0.4006, 0.4044); (0.3736, 0.3874); (0.3548, 0.3736); (0.3512, 0.3465); (0.3670, 0.3578); (0.3889, 0.3690); (0.4147, 0.3814); (0.4373, 0.3893); (0.4593, 0.3944); and (0.4813, 0.4319).

13. The lighting system of claim 1, wherein the first color point is located within a boundary defined by lines connecting together the following series of (x,y) coordinate pairs of color points of the CIE 1931 XY chromaticity diagram: (0.402091, 0.395912); (0.396327, 0.379416); (0.412729, 0.387371); (0.419887, 0.404681); and (0.402091, 0.395912).

14. The lighting system of claim 1, wherein the second light source is configured for emitting light having the second color point as being white.

15. The lighting system of claim 1, wherein the second light source is configured for emitting light having the second color point as being: yellow; amber; yellowish-orange; orange; reddish-orange; red; or deep red.

16. The lighting system of claim 1, wherein the second color point has a correlated color temperature being within a range of between about 2900K and about 1700K.

17. The lighting system of claim 1, wherein the second color point has a correlated color temperature being within a range of between about 2845K and about 2645K; and wherein the second color point is located within a distance of about equal to or less than 0.003 delta(uv) away from the Planckian—black-body locus.

18. The lighting system of claim 1, wherein the second light source is configured for emitting light having a dominant- or peak-wavelength being within a range of between about 590 nanometers and about 600 nanometers.

19. The lighting system of claim 1, wherein the second color point is located within a distance of about equal to or less than 0.025 delta(uv) away from the Planckian—black-body locus.

20. The lighting system of claim 1, wherein the second color point is located within a boundary defined by lines connecting together the following series of (x,y) coordinate pairs of color points of the CIE 1931 XY chromaticity diagram: (0.5650, 0.4200); (0.5400, 0.4250); (0.5100, 0.4330); (0.4813, 0.4319); (0.4562, 0.4260); (0.4373, 0.3893); (0.4593, 0.3944); (0.4870, 0.4000); (0.5200, 0.3990); (0.5450, 0.3975); and (0.5650, 0.4200).

21. The lighting system of claim 1, wherein the second color point is located within a boundary defined by lines connecting together the following series of (x,y) coordinate pairs of color points of the CIE 1931 XY chromaticity diagram: (0.456982, 0.418022); (0.447155, 0.399579); (0.458901, 0.402322); (0.469539, 0.420978); and (0.456982, 0.418022).

22. The lighting system of claim 1, wherein the third light source is configured for emitting light having the third color point as being: yellow; amber; yellowish-orange; orange; reddish-orange; red; or deep red.

23. The lighting system of claim 1, wherein the third light source is configured for emitting light having a dominant- or peak-wavelength being within a range of between about 610 nanometers and about 670 nanometers.

24. The lighting system of claim 1, wherein the third color point is located within a boundary defined by lines connecting together the following series of (x,y) coordinate pairs of color points of the CIE 1931 XY chromaticity diagram: (0.562200, 0.437200); (0.734685, 0.265310); (0.550000, 0.179540); (0.550000, 0.300000); and (0.562200, 0.437200).

25. The lighting system of claim 1, wherein the first light source includes a fourth semiconductor light-emitting device configured for emitting light having a fourth color point being greenish-blue, blue, or purplish-blue.

26. The lighting system of claim 1, wherein the first light source includes a fourth semiconductor light-emitting device configured for emitting light having a dominant- or peak-wavelength being within a range of between about 420 nanometers and about 510 nanometers.

27. The lighting system of claim 1, wherein the second semiconductor light-emitting device is configured for emitting light having a color point being greenish-blue, blue, or purplish-blue.

28. The lighting system of claim 1, wherein the second semiconductor light-emitting device is configured for emitting light having a peak-wavelength being within a range of between about 420 nanometers and about 510 nanometers.

29. The lighting system of claim 1, wherein the third semiconductor light-emitting device is configured for emitting light having a color point being greenish-blue, blue, or purplish-blue.

30. The lighting system of claim 1, wherein the third semiconductor light-emitting device is configured for emitting light having a peak-wavelength being within a range of between about 420 nanometers and about 510 nanometers.

31. A lighting process, comprising:
providing a lighting system, including:
a first light source that includes a first semiconductor light-emitting device and includes a first lumiphor configured for converting light emissions of the first semiconductor light-emitting device having a first spectral power distribution into first light source emissions having another spectral power distribution being different than the first spectral power distribution, wherein the first light source is configured for emitting the first light source emissions as having a first color point, wherein the first color point is located between an isotherm of a correlated color temperature of about 4800K and an isotherm of a correlated color temperature of about 2500K, and wherein the first color point is located within a distance of about equal to or less than 0.006 delta(uv) away from a Planckian—black-body locus of the International Commission on Illumination (CIE) 1931 XY chromaticity diagram;
a second light source that includes a second semiconductor light-emitting device, wherein the second light source is configured for emitting second light source emissions having a second color point, wherein the second color point is located between an isotherm of a correlated color temperature of about 2900K and an isotherm of a correlated color temperature of about 1700K; and
a third light source that includes a third semiconductor light-emitting device, wherein the third light source is configured for emitting third light source emissions having a third color point, wherein the third color point is located between a line-of-purples of the CIE 1931 XY chromaticity diagram and an isotherm of a correlated color temperature of about 1500K, and wherein the third color point is located within a distance of about 0.025 delta(uv) below the Planckian—black-body locus;
causing the lighting system to form combined light emissions having a series of combined color points, wherein the combined light emissions include the first light source emissions, and the second light source emissions, and the third light source emissions; and
causing the series of the combined color points of the combined light emissions to emulate color points of an incandescent light emitter by causing a progression of the series of the combned color points to remain below the Planckian—black-body locus throughout a light brightening/dimming curve of correlated color temperatures (CCTs).

32. The lighting process of claim 31, wherein causing the progression of the series of the combined color points to remain below the Planckian—black-body locus includes causing the combined color points to remain below the Planckian—black-body locus with the light brightening/dimming curve as including a brightened terminus having a CCT being within a range of between about 3400K and about 2700K and including a dimmed terminus having a CCT being within a range of between about 2200K and about 1700K.

33. The lighting process of claim 31, wherein causing the lighting system to form combined light emissions includes causing the progression of the series of the combined color points to remain below the Planckian—black-body locus by a distance being within a range of between about 0.001 delta(uv) and about 0.009 delta(uv) throughout the light brightening/dimming curve.

34. The lighting process of claim 31, wherein causing the lighting system to form combined light emissions includes causing the combined color points to have a color rendition index (CRI-Ra including $R_{1-15}$) throughout the light brightening/dimming curve being about equal to or greater than 75.

35. The lighting process of claim 31, wherein causing the lighting system to form combined light emissions includes causing the combined color points to have a color rendition index (CRI-Ra including $R_{1-8}$) throughout the light brightening/dimming curve being about equal to or greater than 75.

36. The lighting process of claim 31, wherein causing the lighting system to form combined light emissions includes causing the combined color points to have a color rendition index (CRI-$R_9$) throughout the light brightening/dimming curve being about equal to or greater than 80.

37. The lighting process of claim 31, wherein causing the lighting system to form combined light emissions includes causing the combined light emissions to perceptually form an unbroken line.

38. The lighting process of claim 31, wherein causing the lighting system to form combined light emissions includes: causing the first light source to emit the first light source emissions as having a first luminous flux; and causing the second light source to emit the second light source emissions as having a second luminous flux; and causing the third light source to emit the third light source emissions as having a third luminous flux; and wherein causing the lighting system to form combined light emissions includes causing the combined luminous flux to progressively increase along the light brightening/dimming curve from a brightened terminus having a CCT being within a range of between about 3400K and about 2700K to a dimmed terminus having a CCT being within a range of between about 2200K and about 1700K.

39. The lighting process of claim 31, wherein providing the lighting system includes providing the first light source as including a fourth semiconductor light-emitting device with a fourth color point being greenish-blue, blue, or purplish-blue.

40. The lighting process of claim 31, wherein providing the lighting system includes providing the first light source as including a fourth semiconductor light-emitting device being configured for emitting light having a dominant- or peak-wavelength being within a range of between about 420 nanometers and about 510 nanometers.

41. The lighting process of claim 31, wherein providing the lighting system includes providing the second light source as including the second semiconductor light-emitting device with the second color point as being greenish-blue, blue, or purplish-blue.

42. The lighting process of claim 31, wherein providing the lighting system includes providing the second light source as including the second semiconductor light-emitting device as being configured for emitting light having a peak-wavelength being within a range of between about 420 nanometers and about 510 nanometers.

43. The lighting process of claim 31, wherein providing the lighting system includes providing the third light source as including the third semiconductor light-emitting device with the third color point as being greenish-blue, blue, or purplish-blue.

44. The lighting process of claim 31, wherein providing the lighting system includes providing the third light source as including the third semiconductor light-emitting device as being configured for emitting light having a peak-wavelength being within a range of between about 420 nanometers and about 510 nanometers.

45. The lighting process of claim 31, wherein providing the lighting system includes providing the second light source as including the second color point as being located within a distance of about 0.025 delta(uv) below the Planckian—black-body locus.

46. A lighting system, comprising:
a first light source that includes a first semiconductor light-emitting device and includes a first lumiphor configured for converting light emissions of the first semiconductor light-emitting device having a first spectral power distribution into first light source emissions having another spectral power distribution being different than the first spectral power distribution, wherein the first light source is configured for emitting the first light source emissions as having a first color point, wherein the first color point is located between an isotherm of a correlated color temperature of about 4800K and an isotherm of a correlated color temperature of about 2500K, and wherein the first color point is located within a distance of about equal to or less than 0.006 delta(uv) away from a Planckian—black-body locus of the International Commission on Illumination (CIE) 1931 XY chromaticity diagram;
a second light source that includes a second semiconductor light-emitting device, wherein the second light source is configured for emitting second light source emissions having a second color point, wherein the second color point is located between an isotherm of a correlated color temperature of about 2900K and an isotherm of a correlated color temperature of about 1700K; and
a third light source that includes a third semiconductor light-emitting device, wherein the third light source is configured for emitting third light source emissions having a third color point, wherein the third color point is located within a boundary defined by lines connecting together the following series of (x,y) coordinate pairs of color points of the CIE 1931 XY chromaticity diagram: (0.562200, 0.437200); (0.734685, 0.265310); (0.550000, 0.179540); (0.550000, 0.300000); and (0.562200, 0.437200);
wherein the lighting system forms combined light emissions having a series of combined color points, wherein the combined light emissions include the first light source emissions, and the second light source emissions, and the third light source emissions; and
wherein the lighting system causes the series of the combined color points of the combined light emissions to emulate color points of an incandescent light emitter by causing a progression of the series of the combined color points to remain below the Planckian—black-body locus throughout a light brightening/dimming curve of correlated color temperatures (CCTs).

47. The lighting system of claim 46, wherein the third color point is located within a distance of about 0.025 delta(uv) below the Planckian—black-body locus.

48. The lighting system of claim 46, wherein the third light source is configured for emitting the third light source emissions as having a dominant- or peak-wavelength being within a range of between about 590 nanometers and about 700 nanometers.

49. The lighting system of claim 46, wherein the lighting system is configured for causing the progression of the series of the combined color points of the combined light emissions to remain below the Planckian—black-body locus by a distance being within a range of between about 0.001 delta(uv) and about 0.009 delta(uv) throughout the light brightening/dimming curve as including a brightened terminus having a CCT being within a range of between about 3400K and about 2700K and as including a dimmed terminus having a CCT being within a range of between about 2200K and about 1700K.

50. The lighting system of claim 46, wherein the lighting system causes the progression of the series of the combined color points to remain below the Planckian—black-body locus by a distance being within a range of between about 0.001 delta(uv) and about 0.009 delta(uv) throughout the light brightening/dimming curve.

51. A lighting process, comprising:
providing a lighting system, including:
a first light source that includes a first semiconductor light-emitting device and includes a first lumiphor configured for converting light emissions of the first semiconductor light-emitting device having a first spectral power distribution into first light source emissions having another spectral power distribution being different than the first spectral power distribution, wherein the first light source is configured for emitting the first light source emissions as having a first color point, wherein the first color point is located between an isotherm of a correlated color temperature of about 4800K and an isotherm of a correlated color temperature of about 2500K, and wherein the first color point is located within a distance of about equal to or less than 0.006 delta(uv) away from a Planckian—black-body locus of the International Commission on Illumination (CIE) 1931 XY chromaticity diagram;
a second light source that includes a second semiconductor light-emitting device, wherein the second light source is configured for emitting second light source emissions having a second color point, wherein the second color point is located between an isotherm of a correlated color temperature of about 2900K and an isotherm of a correlated color temperature of about 1700K; and a third light source that includes a third semiconductor light-emitting device, wherein the third light source is configured for emitting third light source emissions having a third color point, wherein the third color point is located within a boundary defined by lines connecting together the following series of (x,y) coordinate pairs of color points of the CIE 1931 XY chromaticity diagram: (0.562200, 0.437200); (0.734685, 0.265310); (0.550000, 0.179540); (0.550000, 0.300000); and (0.562200, 0.437200);

causing the lighting system to form combined light emissions having a series of combined color points, wherein the combined light emissions include the first light source emissions, and the second light source emissions, and the third light source emissions; and causing the series of the combined color points of the combined light emissions to emulate color points of an incandescent light emitter by causing a progression of the series of the combined color points to remain below the Planckian—black-body locus throughout a light brightening/dimming curve of correlated color temperatures (CCTs).

52. The lighting process of claim 51, wherein the providing the lighting system includes providing the third light source with the third color point as being located within a distance of about 0.025 delta(uv) below the Planckian—black-body locus.

53. The lighting process of claim 51, wherein the providing the lighting system includes providing the third light source as being configured for emitting the third light source emissions as having a dominant- or peak-wavelength being within a range of between about 590 nanometers and about 700 nanometers.

54. The lighting process of claim 51, wherein causing the progression of the series of the combined color points to remain below the Planckian—black-body locus includes causing the combined color points to remain below the Planckian—black-body locus with the light brightening/dimming curve as including a brightened terminus having a CCT being within a range of between about 3400K and about 2700K and including a dimmed terminus having a CCT being within a range of between about 2200K and about 1700K.

55. The lighting process of claim 51, wherein causing the lighting system to form combined light emissions includes causing the progression of the series of the combined color points to remain below the Planckian—black-body locus by a distance being within a range of between about 0.001 delta(uv) and about 0.009 delta(uv) throughout the light brightening/dimming curve.

* * * * *